(12) United States Patent
Najafi et al.

(10) Patent No.: US 12,015,383 B2
(45) Date of Patent: *Jun. 18, 2024

(54) SUPERCONDUCTING SIGNAL AMPLIFIER

(71) Applicant: PSIQUANTUM CORP., Palo Alto, CA (US)

(72) Inventors: Faraz Najafi, Palo Alto, CA (US); Syrus Ziai, Los Altos, CA (US); Qiaodan Jin Stone, Sunnyvale, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 521 days.

This patent is subject to a terminal disclaimer.

(21) Appl. No.: 17/150,889

(22) Filed: Jan. 15, 2021

(65) Prior Publication Data
US 2021/0384878 A1    Dec. 9, 2021

Related U.S. Application Data

(63) Continuation of application No. 16/553,068, filed on Aug. 27, 2019, now Pat. No. 10,897,235, which is a
(Continued)

(51) Int. Cl.
*H03F 19/00* (2006.01)
*H10N 60/30* (2023.01)
(Continued)

(52) U.S. Cl.
CPC ............. *H03F 19/00* (2013.01); *H10N 60/30* (2023.02); *H10N 69/00* (2023.02); *H10N 60/85* (2023.02)

(58) Field of Classification Search
CPC ......... H03F 19/00; H01L 27/18; H10N 60/30; H10N 69/00
See application file for complete search history.

(56) References Cited

U.S. PATENT DOCUMENTS 3,059,196 A   10/1962   Lentz
3,119,076 A   1/1964    Schlig et al.
(Continued)

FOREIGN PATENT DOCUMENTS

CN    106289515 A    1/2017
CN    106549099 A    3/2017
(Continued)

OTHER PUBLICATIONS

Akhlaghi et al., "Gated Mode145:149 Superconducting Nanowire Single Photon Detectors," Optics Express, vol. 20, No. 2, Jan. 16, 2012, 9 pgs.
(Continued)

*Primary Examiner* — Andrea Lindgren Baltzell
*Assistant Examiner* — Alan Wong
(74) *Attorney, Agent, or Firm* — Morgan, Lewis & Bockius LLP

(57) ABSTRACT

A system includes a plurality of superconducting wires connected in parallel with one another. The plurality of superconducting wires includes a first superconducting wire and a second superconducting wire. The plurality of superconducting wires are configured to, while receiving a bias current provided to the parallel combination of the plurality of superconducting wires, operate in a superconducting state in the absence of a trigger current. The first superconducting wire is configured to, while receiving the bias current, transition to a non-superconducting state in response to receiving the trigger current. The second superconducting wire is configured to, while receiving the bias current, transition to a non-superconducting state in response to the first superconducting wire transitioning to the non-superconducting state.

10 Claims, 29 Drawing Sheets

Related U.S. Application Data continuation of application No. 16/028,288, filed on Jul. 5, 2018, now Pat. No. 10,396,733, which is a continuation of application No. PCT/US2018/033042, filed on May 16, 2018.

(60) Provisional application No. 62/572,874, filed on Oct. 16, 2017, provisional application No. 62/520,447, filed on Jun. 15, 2017, provisional application No. 62/507,193, filed on May 16, 2017.

(51) Int. Cl.
*H10N 69/00* (2023.01)
*H10N 60/85* (2023.01)

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,904,869 A | 2/1990 | Schneider | |
| 4,989,051 A | 1/1991 | Whitehead et al. | |
| 5,006,705 A | 4/1991 | Saito et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 6,900,714 B1 | 5/2005 | Huang et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,240,539 B2 | 1/2016 | Nam et al. | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2* | 1/2021 | Najafi | H10N 69/00 |
| 10,911,031 B2 | 2/2021 | Wise et al. | |
| 10,944,403 B2 | 3/2021 | Najafi | |
| 10,984,857 B2 | 4/2021 | Najafi | |
| 11,009,387 B2 | 5/2021 | Chung et al. | |
| 11,313,719 B2 | 4/2022 | Najafi et al. | |
| 11,473,974 B2 | 10/2022 | Thompson et al. | |
| 11,629,995 B2 | 4/2023 | Najafi et al. | |
| 2002/0110328 A1 | 8/2002 | Bischel et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0150247 A1 | 6/2013 | Reeves et al. | |
| 2013/0341594 A1 | 12/2013 | Mohseni et al. | |
| 2014/0103196 A1 | 4/2014 | Soga et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |
| 2019/0148848 A1 | 5/2019 | Najafi et al. | |
| 2019/0227230 A1 | 7/2019 | Novack et al. | |
| 2019/0288132 A1 | 9/2019 | Wang et al. | |
| 2019/0378874 A1 | 12/2019 | Rosenblatt et al. | |
| 2020/0027502 A1 | 1/2020 | Berggren et al. | |
| 2020/0066962 A1 | 2/2020 | Najafi | |
| 2020/0080890 A1 | 3/2020 | Najafi et al. | |
| 2020/0111944 A1 | 4/2020 | Moodera et al. | |
| 2020/0176662 A1 | 6/2020 | Dayton et al. | |
| 2020/0194656 A1 | 6/2020 | Najafi | |
| 2020/0256722 A1 | 8/2020 | Najafi et al. | |

(56) References Cited

U.S. PATENT DOCUMENTS

| | | |
|---|---|---|
| 2021/0119102 A1 | 4/2021 | Zhu et al. |
| 2021/0183767 A1 | 6/2021 | Najafi et al. |
| 2021/0239518 A1 | 8/2021 | Chung et al. |
| 2023/0175887 A1 | 6/2023 | Najafi et al. |
| 2023/0213380 A1 | 7/2023 | Thompson et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO2012052628 A2 | 4/2012 |

OTHER PUBLICATIONS

Atikian, Haig A. et al., "Superconducting Nanowire Single Photon Detector on Diamond," arXiv:1401.4490v1, physics.optics, Jan. 17, 2014, 5 pgs.

Cheng, Risheng et al., "Photon-Number Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AlN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AlN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, pp. 28588-28605, 2019, 18 pgs.

PsiQuantum Corp., International Search Report and Written Opinion, PCT/US2018/033042, dated Aug. 28, 2018, 13 pgs.

PsiQuantum Corp., International Search Report and Written Opinion, PCT/US2018/033041, dated Jul. 27, 2018, 16 pgs.

PsiQuantum Corp., International Search Report and Written Opinion, PCT/US2018/044091, dated Nov. 7, 2018, 12 pgs.

PsiQuantum Corp., Invitation to Pay Additional Fees/Partial Search Report, PCT/US2018/037892, dated Aug. 20, 2018, 12 pgs.

PsiQuantum Corp., Invitation to Pay Additional Fees/Partial Search Report, PCT/US2018/054414, dated Jan. 24, 2019, 21 pgs.

PsiQuantum Corp., International Search Report and Written Opinion, PCT/US2018/054414, dated Mar. 20, 2019, 21 pgs.

Najafi, Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Non-Final Office Action, U.S. Appl. No. 16/136,124, dated Apr. 4, 2019, 9 pgs.

Najafi, Quayle Office Action, U.S. Appl. No. 16/151,180, dated Jan. 31, 2019, 5pgs.

Najafi, Notice of Allowace, U.S. Appl. No. 16/151,180, dated Mar. 14, 2019, 5 pgs.

Najafi, Notice of Allowance U.S. Appl. No. 16/151,190, dated Feb. 6, 2019, 11 pgs.

Najafi, Notice of Allowance U.S. Appl. No. 16/151,190, dated Mar. 28, 2019, 5 pgs.

Najafi, Office Action, U.S. Appl. No. 16/046,815, dated Feb. 4, 2019, 9 pgs.

Najafi, Office Action, U.S. Appl. No. 16/046,807, dated Mar. 18, 2019, 10 pgs.

Najafi, Office Action, U.S. Appl. No. 16/107,143, dated Mar. 19, 2019, 11 pgs.

Psiquantum Corp., International Search Report and Written Opinion, PCT/US2019/017687, dated Apr. 30, 2019, 8 pgs.

Psiquantum Corp., International Search Report, PCT/US2019/017691, dated Apr. 23, 2019, 7 pgs.

Psiquantum Corp., International Search Report and Written Opinion, PCT/US2019/030019, dated Jul. 17, 2019, 8 pgs.

Psiquantum Corp., PCT/US2018/044091, International Preliminary Report on Patentability, dated Jan. 28, 2020, 6 pgs.

Najafi, Non-Final Office Action, U.S. Appl. No. 16/664,716, dated Apr. 1, 2020, 15 pgs.

Psiquantum, International Search Report and Written Opinion, PCT/US2019/051853, dated Jan. 27, 2020, 13 pgs.

Psiquantum, International Preliminary Report on Patentability, PCT/US12018/033041, dated Nov. 26, 2019, 8 pgs.

(56) References Cited

OTHER PUBLICATIONS

Psiquantum, International Preliminary Report on Patentability, PCT/US2018/054414, dated Apr. 8, 2020, 15 pgs.
Psiquantum, International Search Report / Written Opinion, PCT/US2018/037892, dated Oct. 17, 2018, 18 pgs.
Psiquantum, International Preliminary Report on Patentability, PCT/US2018/037892, dated Dec. 17, 2019, 12 pgs.
Najafi, Non-Final Office Action, U.S. Appl. No. 16/553,068, dated Apr. 1, 2020, 11 pgs.
Najafi, Non-Final Office Action, U.S. Appl. No. 16/544,718, dated Aug. 17, 2020, 7 pgs.
Najafi, Non-Final Office Action, U.S. Appl. No. 16/656,506, dated Aug. 13, 2020, 18 pgs.
Najafi, Notice of Allowance, U.S. Appl. No. 16/553,068, dated Sep. 18, 2020, 8 pgs.
Najafi, Notice of Allowance, U.S. Appl. No. 16/473,550, dated Sep. 24, 2020, 9 pgs.
Najafi, Notice of Allowance, U.S. Appl. No. 16/473,550, dated Nov. 3, 2020, 2 pgs.
Najafi, Notice of Allowance, U.S. Appl. No. 16/553,068, dated Nov. 12, 2020, 2 pgs.
Najafi, Notice of Allowance, U.S. Appl. No. 16/656,506, dated Nov. 30, 2020, 12 pgs.
Najafi, Final Office Action, U.S. Appl. No. 16/664,716, dated Oct. 16, 2020, 14 pgs.
Najafi, Notice of Allowance, U.S. Appl. No. 16/473,547, dated Dec. 9, 2020, 8 pgs.
Najafi, Notice of Allowance, U.S. Appl. No. 16/543,256, dated Dec. 9, 2020, 12 pgs.
Chung, Non-Final Office Action, U.S. Appl. No. 16/849,829, dated Aug. 21, 2020, 7 pgs.
Chung, Notice of Allowance, U.S. Appl. No. 16/849,829, dated Dec. 8, 2020, 5 pgs.
Psiquantum Corp., International Search Report and Written Opinion, PCT/US2020/028519, dated Jan. 12, 2021, 9 pgs.
Psiquantum Corp., Notice of Allowance, U.S. Appl. No. 16/849,829, dated Mar. 1, 2021, 8 pgs.
Psiquantum Corp., Notice of Allowance, U.S. Appl. No. 16/544,718, dated Feb. 5, 2021, 6 pgs.
Psiquantum Corp., Notice of Allowance, U.S. Appl. No. 16/664,716, dated Jan. 28, 2021, 8 pgs.
Psiquantum Corp., Notice of Allowance, U.S. Appl. No. 16/473,547, dated Jan. 27, 2021, 2 pgs.
Psiquantum Corp., Notice of Allowance, U.S. Appl. No. 16/543,256, dated Feb. 4, 2021, 2 pgs.
Psiquantum Corp., Notice of Allowance, U.S. Appl. No. 16/544,718, dated Mar. 21, 2021, 2 pgs.
Psiquantum Corp., Notice of Allowance, U.S. Appl. No. 16/544,718, dated Mar. 24, 2021, 2 pgs.
Psiquantum Corp., Notice of Allowance, U.S. Appl. No. 16/849,829, dated Apr. 5, 2021, 2 pgs.
Psiquantum, Notice of Allowance, U.S. Appl. No. 16/840,166, dated Mar. 23, 2021, 8 pgs.
Psiquantum, Notice of Allowance, U.S. Appl. No. 16/544,718, dated Apr. 26, 2021, 2 pgs.
Psiquantum, Notice of Allowance, U.S. Appl. No. 16/664,716, dated Apr. 21, 2021, 8 pgs.
Psiquantum, Notice of Allowance, U.S. Appl. No. 16/664,716, dated May 7, 2021, 2 pgs.
Psiquantum, Notice of Allowance, U.S. Appl. No. 16/543,256, dated Mar. 24, 2021, 2 pgs.
Psiquantum, Notice of Allowance, U.S. Appl. No. 16/575,274, dated Apr. 22, 2021, 11 pgs.
Psiquantum, International Preliminary Report on Patentability, PCT/US2018/033042, dated Nov. 16, 2019, 7 pgs.
Psiquantum, International Preliminary Report on Patentability, PCT/US2019/051853, dated Mar. 23, 2021, 10 pgs.
Psiquantum, International Preliminary Report on Patentability, PCT/US2019/017687, dated Aug. 18, 2020, 6 pgs.
Psiquantum, International Preliminary Report on Patentability, PCT/US2019/030019, dated Nov. 3, 2020, 7 pgs.
Psiquantum, Notice of Allowance, U.S. Appl. No. 16/840,166, dated May 24, 2021, 5 pgs.
Najafi, Notice of Allowance, U.S. Appl. No. 16/840,166, dated Jul. 21, 2021, 2 pgs.
Najafi, Non-Final Office Action, U.S. Appl. No. 17/135,861, dated Sep. 23, 2021, 7 pgs.
Psiquantum, International Preliminary Report on Patentability, PCT/US2019/016885, dated Aug. 11, 2020, 7 pgs.
Psiquantum, International Search Report and Written Opinion, PCT/US2019/016885, dated Apr. 24, 2019, 9 pgs.
Thompson, Non-Final Office Action, U.S. Appl. No. 16/450,911, dated Aug. 2, 2019, 7 pgs.
Thompson, Notice of Allowance, U.S. Appl. No. 16/450,911, dated Dec. 11, 2019, 5 pgs.
Thompson, Non-Final Office Action, U.S. Appl. No. 16/985,137, dated Sep. 30, 2021, 7 pgs.
Thompson, Notice of Allowance, U.S. Appl. No. 16/985,137, dated May 26, 2022, 9 pgs.
Najafi, Notice of Allowance, U.S. Appl. No. 16/046,807, dated Oct. 29, 2019, 8 pgs.
Najafi, Notice of Allowance, U.S. Appl. No. 16/136,124, dated Jun. 27, 2019, 8 pgs.
Najafi, Corrected Notice of Allowance, U.S. Appl. No. 16/136,124, dated Sep. 23, 2019, 2 pgs.
Psiquantum Corp., International Search Report and Written Opinion, PCT/US2018/060802, dated Apr. 8, 2019, 18 pgs.
Psiquantum, International Preliminary Report on Patentability, PCT/US2018/060802, dated May 19, 2020, 13 pgs.
Najafi, Notice of Allowance, U.S. Appl. No. 16/773,921, dated Sep. 22, 2021, 9 pgs.
Najafi, Notice of Allowance, U.S. Appl. No. 17/195,522, dated Nov. 12, 2021, 9 pgs.
Najafi, Notice of Allowance, U.S. Appl. No. 17/195,522, dated Nov. 16, 2021, 2 pgs.
Najafi, Notice of Allowance, U.S. Appl. No. 16/773,921, dated Nov. 15, 2021, 9 pgs.
Najafi, Notice of Allowance, U.S. Appl. No. 17/033,337, dated Dec. 9, 2021, 9 pgs.
Chung, Non-Final Office Action, U.S. Appl. No. 17/232,086, dated Dec. 16, 2021, 14 pgs.
Chung, Notice of Allowance, U.S. Appl. No. 17/232,086, dated May 11, 2022, 6 pgs.
Najafi, Notice of Allowance, U.S. Appl. No. 17/195,522, dated Dec. 9, 2021, 2 pgs.
Najafi, Notice of Allowance, U.S. Appl. No. 16/773,921, dated Dec. 24, 2021, 2 pgs.
Najafi, Notice of Allowance, U.S. Appl. No. 17/195,522, dated Jan. 7, 2022, 2 pgs.
Najafi, Notice of Allowance, U.S. Appl. No. 17/135,861, dated Jan. 28, 2022, 7 pgs.
Thompson, Non-Final Office Action, U.S. Appl. No. 16/985,137, dated Jan. 18, 2022, 8 pgs.
Najafi, Notice of Allowance, U.S. Appl. No. 16/623,503, dated Feb. 22, 2022, 10 pgs.
Najafi, Notice of Allowance, U.S. Appl. No. 17/195,522, dated Feb. 9, 2022, 2 pgs.
Najafi, Non-Final Office Action, U.S. Appl. No. 16/813,628, dated Mar. 7, 2022, 8 pgs.
Najafi, Final Office Action, U.S. Appl. No. 16/813,628, dated Aug. 29, 2022, 9 pgs.
Najafi, Non-Final Office Action, U.S. Appl. No. 16/813,628, dated Dec. 6, 2022, 8 pgs.
Najafi, Notice of Allowance U.S. Appl. No. 18/103,413, dated Jul. 18, 2023, 9 pgs.
D. Sahin et al., "Waveguide photon-number-resolving detectors for quantum photonic integrated circuits", Appl. Phys. Lett., vol. 103, No. 11, p. 111116, Sep. 2013, 16 pgs.
Sergio Pagano et al., "Nano-Strip Three-Terminal Superconducting Device for Cryogenic Detector Readout", IEEE Transactions on Applied Superconductivity, vol. 21, No. 3, Jun. 2011, 4 pgs.

(56) References Cited

OTHER PUBLICATIONS

Najafi, Notice of Allowance, U.S. Appl. No. 16/046,815, Oct. 7, 2019, 9 pgs.
PSIQUANTUM Corp., International Preliminary Report on Patentability, PCT/US2019/017691, Aug. 18, 2020, 5 pgs.
Najafi, Non-Final Office Action, U.S. Appl. No. 18/103,413, Nov. 7, 2023, 7 pgs.
Najafi, Notice of Allowance, U.S. Appl. No. 17/160,283, Nov. 2, 2022, 9 pgs.
Najafi, Non-Final Office Action, U.S. Appl. No. 17/160,283, Jul. 15, 2022, 15 pgs.
Najafi, Non-Final Office Action, U.S. Appl. No. 17/160,283, Mar. 31, 2022, 18 pgs.
Najafi, Non-Final Office Action, U.S. Appl. No. 17/234,701, Feb. 1, 2022, 14 pgs.
Najafi, Notice of Allowance, U.S. Appl. No. 17/234,701, Jun. 6, 2022, 9 pgs.
Najafi, Non-Final Office Action, U.S. Appl. No. 16/840,182, Apr. 29, 2022, 13 pgs.
Najafi, Notice of Allowance, U.S. Appl. No. 16/840,182, Sep. 22, 2022, 10 pgs.
Najafi, Non-Final Office Action, U.S. Appl. No. 17/967,773, Oct. 20, 2023, 10 pgs.
Najafi, Non-Final Office Action, U.S. Appl. No. 17/098,235, 0620OCT2023, 16 pgs.
Najafi, Notice of Allowance, U.S. Appl. No. 18/103,413, Jan. 18, 2024, 8 pgs.
Najafi, Final Office Action, U.S. Appl. No. 17/967,773, Jan. 18, 2024, 12 pgs.
Najafi, Notice of Allowance, U.S. Appl. No. 17/098,235, Jan. 24, 2024, 5 pgs.

\* cited by examiner

SUPERCONDUCTING SIGNAL AMPLIFIER

PRIORITY AND RELATED APPLICATIONS

This application is a continuation of U.S. application Ser. No. 16/553,068, filed Aug. 27, 2019, which is a continuation of U.S. application Ser. No. 16/028,288, filed Jul. 5, 2018, now U.S. Pat. No. 10,396,733, which is a continuation of International (PCT) Application No. PCT/US2018/033042, filed May 16, 2018, entitled "Superconducting Signal Amplifier," which claims priority to U.S. Provisional Application No. 62/572,874, filed Oct. 16, 2017, entitled "Cascaded Superconducting Signal Amplifier;" U.S. Provisional Application No. 62/520,447, filed Jun. 15, 2017, entitled "Niobium-Germanium Superconducting Photon Detector;" and U.S. Provisional Application No. 62/507,193, filed May 16, 2017, entitled "Cascaded Superconducting Signal Amplifier," each of which is incorporated by reference herein in its entirety.

TECHNICAL FIELD

This relates generally to signal amplifiers, including but not limited to, superconducting signal amplifiers.

BACKGROUND

Signal amplifiers are widely used in electronic devices, such as audio signal amplifiers, video signal amplifiers, communication signal amplifiers, power amplifiers, etc. Performance of signal amplifiers based on conventional transistors is limited by the operation characteristics of the conventional transistors, such as leakage current, noise, switching speed, and thermal dissipation.

Superconductors are materials capable of operating in a superconducting state with zero electrical resistance under particular conditions.

SUMMARY

Accordingly, there is a need for systems and/or devices with more efficient and effective signal amplifiers and methods for operating them. Such systems, devices, and methods for making and/or using them optionally complement or replace conventional systems, devices, and methods for making and/or using thereof.

However, in superconductor circuits, leakage current, heating, and current swapping problems can limit the effectiveness of the superconducting circuits. For example, leakage current into superconducting nanowires as well as current-swapping between superconducting nanowires has limited the performance of superconductor amplifier circuits.

As described herein, by controlling the location of an initial perturbation (e.g., small induction) and current redistribution to the closest neighboring channel(s), parallel nanowires are configured to switch sequentially rather than in parallel. This sequential avalanche scheme allows the use of a large number of parallel nanowires in an amplifier circuit and provides increased gain and performance.

Additionally, many superconductors require very low temperatures to operate in a superconducting state. However, operating superconducting circuitry at these low temperatures can be challenging. Achieving temperatures near absolute zero (e.g., via the use of lasers and/or magnetic fields), such as less than 1 Kelvin, 1-2 Kelvin, or 2-3 Kelvin, often requires high performance cooling systems that are large and costly. In particular, the challenges become significant as the desired temperature approaches zero. In addition, it is difficult to maintain the near-zero temperature due to high cooling power needed for reliable operation of many superconducting circuits. Therefore, there is a great need for superconducting circuitry that is capable of operating in a superconducting state at higher temperatures (e.g., 3-4 Kelvin, 4-5 Kelvin, 5-10 Kelvin, etc.). The present disclosure describes various embodiments of such superconducting circuitry.

In one aspect, some embodiments include an electronic system having: (1) a first circuit that includes a plurality of superconducting wires (e.g., two or more superconducting wires, such as two, three, four, or more superconducting wires) connected in parallel with one another, the plurality of superconducting wires including: (a) a first superconducting wire with a corresponding first threshold superconducting current; and (b) a second superconducting wire; and (2) a second circuit (e.g., a readout circuit) connected in parallel to the first circuit; (3) a first current source (e.g., an input current source) connected to the first superconducting wire and configured to selectively supply a first current (e.g., an input current); and (4) a second current source (e.g., an amplification current source) connected to a combination of the first circuit and the second circuit and configured to supply a second current (e.g., an amplification current) so that the plurality of superconducting wires operate in a superconducting state (e.g., in the absence of additional current, such as the first current), whereby supplying the first current to the first superconducting wire with the first current source causes at least the first superconducting wire to cease to operate in the superconducting state and subsequently causes the second superconducting wire to cease to operate in the superconducting state.

In another aspect, some embodiments include a method, comprising: (1) providing an amplification current to a first circuit that includes a plurality of superconducting wires connected in parallel with one another, the amplification current causing the plurality of superconducting wires to operate in a superconducting state; (2) while the plurality of superconducting wires are operating in the superconducting state, supplying an additional current to a first superconducting wire of the plurality of superconducting wires so that current supplied to the first superconducting wire exceeds a first threshold superconducting current of the first superconducting wire; (3) in response to supplying the additional current to the first superconducting wire, transitioning the first superconducting wire from the superconducting state to a non-superconducting state; (4) subsequent the transition of the first superconducting wire from the superconducting state to the non-superconducting state: (a) sequentially transitioning the remainder of the superconducting wires of the plurality of superconducting wires from the superconducting state to the non-superconducting state; and (b) directing the amplification current to a second circuit that is connected in parallel to the first circuit.

In yet another aspect, some embodiments include an electronic device having a plurality of superconducting wires connected in parallel with one another, the plurality of superconducting wires including: (1) a first superconducting wire having a first threshold superconducting current; and (2) a second superconducting wire having a second threshold superconducting current that is greater than the first threshold superconducting current.

In yet another aspect, some embodiments include a method for fabrication of a superconducting circuit. The method including: (1) depositing a thin film of a superconducting material over a substrate; and (2) removing (e.g., etching) one or more (e.g., two or more) portions of the thin film to define a plurality of superconducting wires, the plurality of superconducting wires including: (a) a first superconducting wire with a corresponding first threshold superconducting current; and (b) a second superconducting wire with a corresponding second threshold superconducting current that is greater than the first threshold superconducting current.

In some embodiments, the superconducting circuits and components described herein are composed of niobium-germanium adapted to operate in a superconducting state at temperatures above 3 Kelvin (e.g., 3.1 Kelvin to 6 Kelvin).

Thus, devices and systems are provided with methods for fabricating and operating superconducting circuitry, thereby increasing the effectiveness, efficiency, and user satisfaction with such systems and devices.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Many modifications and variations of this disclosure can be made without departing from its spirit and scope, as will be apparent to those skilled in the art. The specific embodiments described herein are offered by way of example only, and the disclosure is to be limited only by the terms of the appended claims, along with the full scope of equivalents to which such claims are entitled.

Figure 1A:
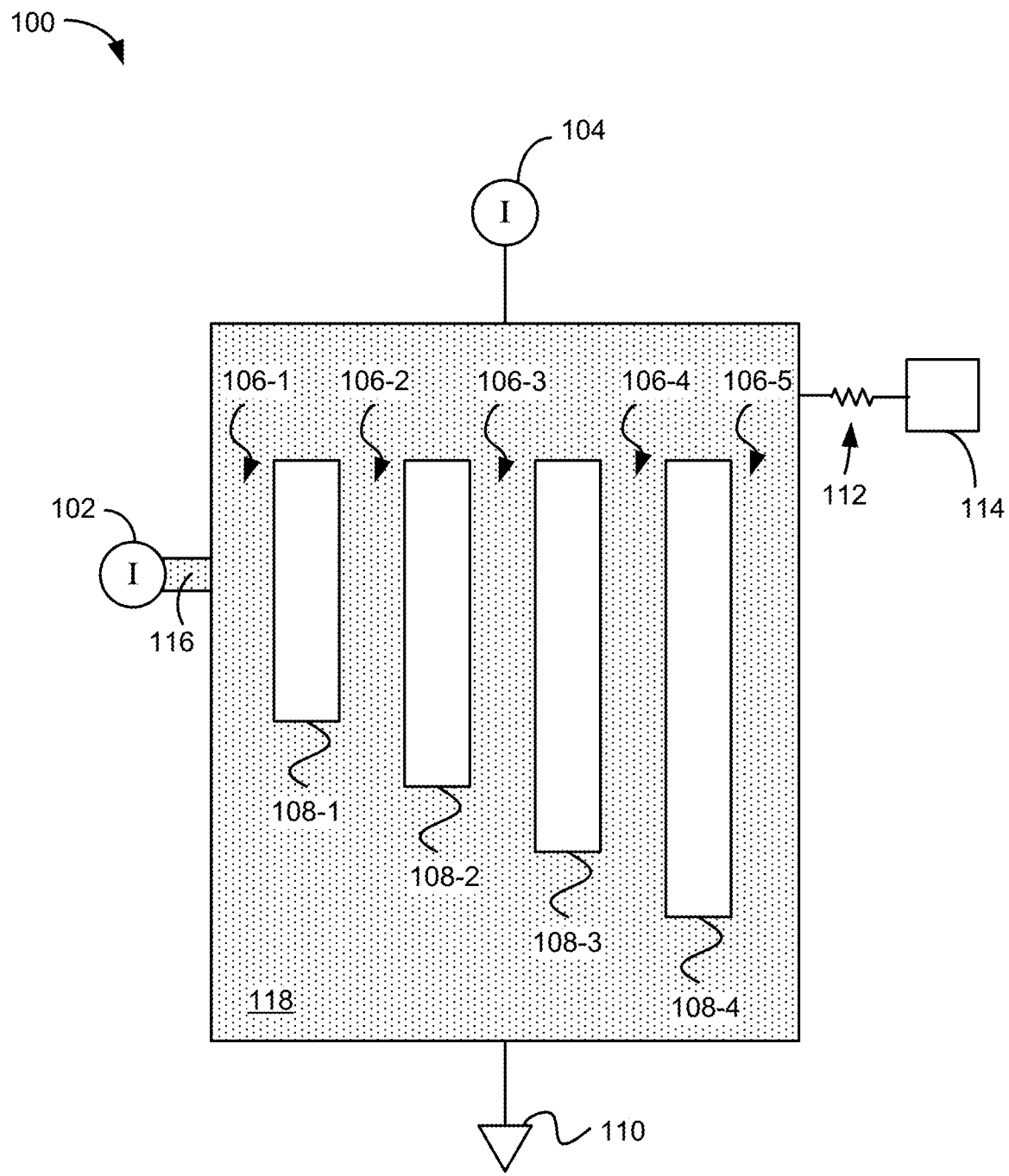
FIGS. 1A-1E are block diagrams illustrating representative superconducting circuits in accordance with some embodiments.

FIGS. 1A-1E are block diagrams illustrating representative superconducting circuits in accordance with some embodiments. FIG. 1A shows a superconducting circuit 100 having a superconducting layer 118 (e.g., a thin film or a sheet of one or more superconducting materials, or a layer that includes one or more superconducting materials, such as niobium or niobium alloys), a first current source 102 connected to the superconducting layer 118 (optionally via a supply wire 116), a second current source 104 connected to the superconducting layer 118, and circuitry 114 coupled to the superconducting layer 118 (optionally via resistor(s) 112). FIG. 1A also shows electrical ground 110 (electrically coupled to the superconducting layer 118). In some embodiments, the first current source 102 is configured to supply a current for a limited time in response a trigger event (e.g., detection of one or more photons). Supply wire 116 may be formed from a superconducting material or from a non-superconducting (e.g., metallic) material. In some embodiments, the superconducting layer 118, the current sources 102 and 104, and the circuitry 114 are coupled to a common ground (e.g., ground 110), while in other embodiments, one or more are coupled to distinct grounds or reference nodes. In accordance with some embodiments, the superconducting layer 118 includes a plurality of wires 106 defined in part by a plurality of gaps 108. For example, wire 106-1 corresponds to the section of the superconducting layer 118 between the left edge of the gap 108-1 and the left edge of the superconducting layer 118. As another example, wire 106-5 corresponds to the section of the superconducting layer 118 between the right edge of the gap 108-4 and the right edge of the superconducting layer 118. As shown in FIG. 1A, in some embodiments, the gaps 108 are aligned on a side nearest to the current source 104. In some embodiments (not shown), the gaps 108 are aligned on a side opposite to the side close to the current source 104. In some embodiments, the gaps 108 are not linearly aligned (e.g., a respective edge of each gap is aligned in accordance with a nonlinear function, such as a parabolic equation).

As used herein, a "superconducting circuit" or "superconductor circuit" is a circuit having one or more superconducting materials. For example, a superconductor amplifier circuit is an amplifier circuit that includes one or more superconducting materials. As used herein, a "superconducting" material is a material that is capable of operating in a superconducting state (under particular conditions). For example, a superconducting material is a material that operates as a superconductor (e.g., operates with zero electrical resistance) when cooled below a particular temperature (e.g., a threshold temperature) and having less than a threshold current flowing through it. A superconducting material is also called herein a superconduction-capable material. In some embodiments, the superconducting materials operate in an "off" state where little or no current is present. In some embodiments, the superconducting materials can operate in a non-superconducting state during which the materials have a non-zero electrical resistance (e.g., a resistance in the range of one thousand to ten thousand ohms). For example, a superconducting material supplied with a current greater than a threshold superconducting current for the superconducting material transitions from a superconducting state having zero electrical resistance to a non-superconducting state having non-zero electrical resistance. As an example, superconducting layer 118 is a layer that is capable of operating in a superconducting state (e.g., under particular operating conditions).

As used herein, a "wire" is a section of material configured for transferring electrical current. In some embodiments, a wire includes a section of material conditionally capable of transferring electrical current. For example, a wire made of a superconducting material that is capable of transferring electrical current while the wire is maintained at a temperature below a threshold temperature. As another example, a wire made of semiconducting material is capable of transferring electrical current while the wire is maintained at a temperature above a freeze-out temperature. A cross-section of a wire (e.g., a cross-section that is perpendicular to a length of the wire) optionally has a regular (e.g., flat or round) shape or an irregular shape. While some of the figures show wires having rectangular shapes, one skilled in the art would recognize that any shape could be used. In some embodiments, a length of a wire is greater than a width or a thickness of the wire (e.g., the length of a wire is at least 5, 6, 7, 8, 9, or 10 times greater than the width and the thickness of the wire). In some cases, a wire is a section of the superconducting layer 118 having a width equal to the distance between an edge of the sheet and a gap in the sheet, or between two gaps in the sheet, e.g., as shown in FIG. 1A.

In some embodiments, the resistor(s) 112 include one or more distinct components. In some embodiments, the resistor(s) 112 include one or more resistances inherent in the circuitry 114 and/or the connection between circuitry 114 and the superconducting layer 118.

In some embodiments, the circuitry 114 includes a read-out circuit. In some embodiments, the circuitry 114 is configured to measure current received from (or via) the superconducting layer 118.

Figure 1B:
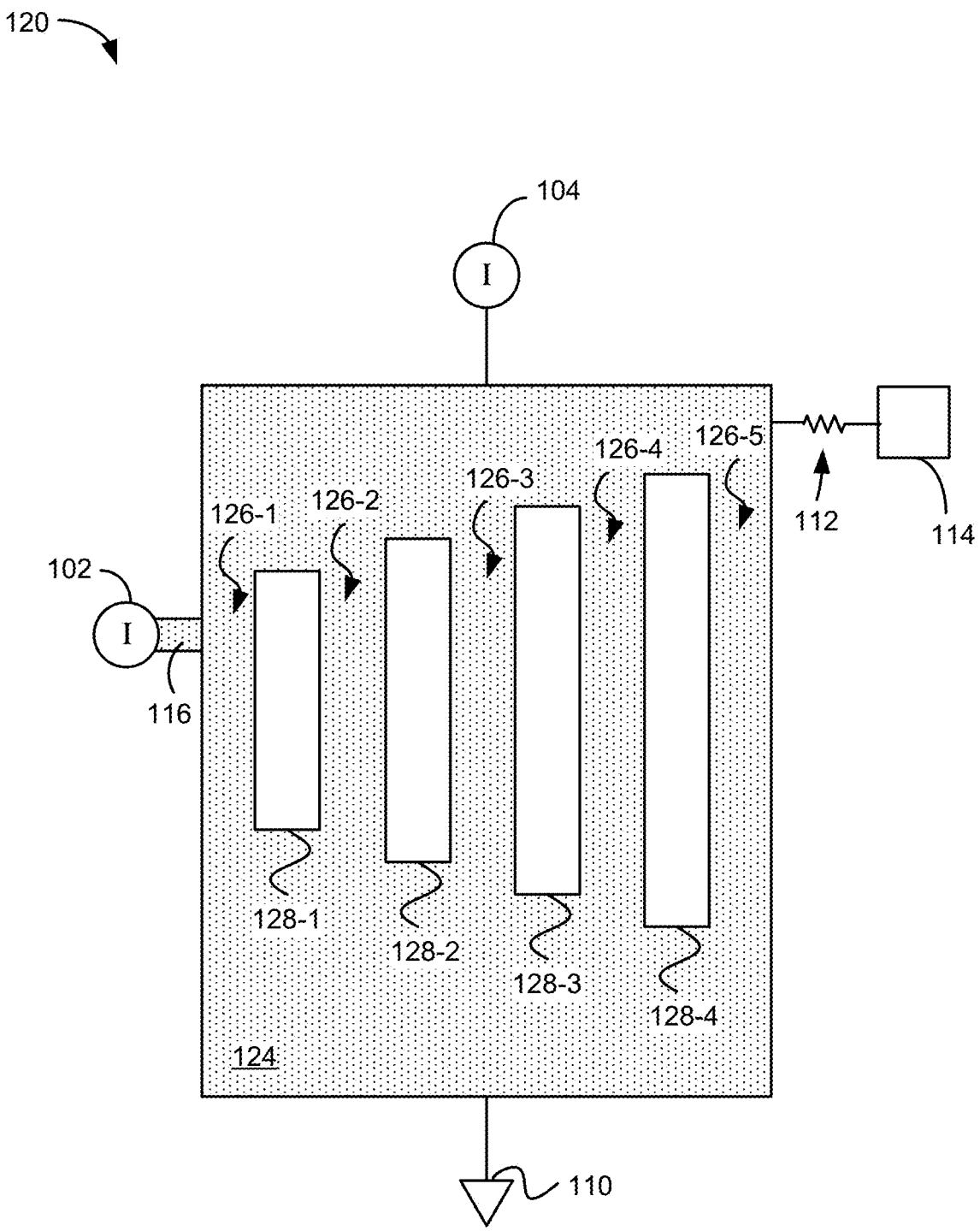

FIG. 1B shows a superconducting circuit 120 similar to the superconducting circuit 100 in FIG. 1A. In FIG. 1B, the superconducting layer 124 includes a plurality of wires 126 defined at least in part by a plurality of gaps 128. In accordance with some embodiments, the gaps 128 in FIG. 1B are aligned at a midpoint.

Figure 1C:
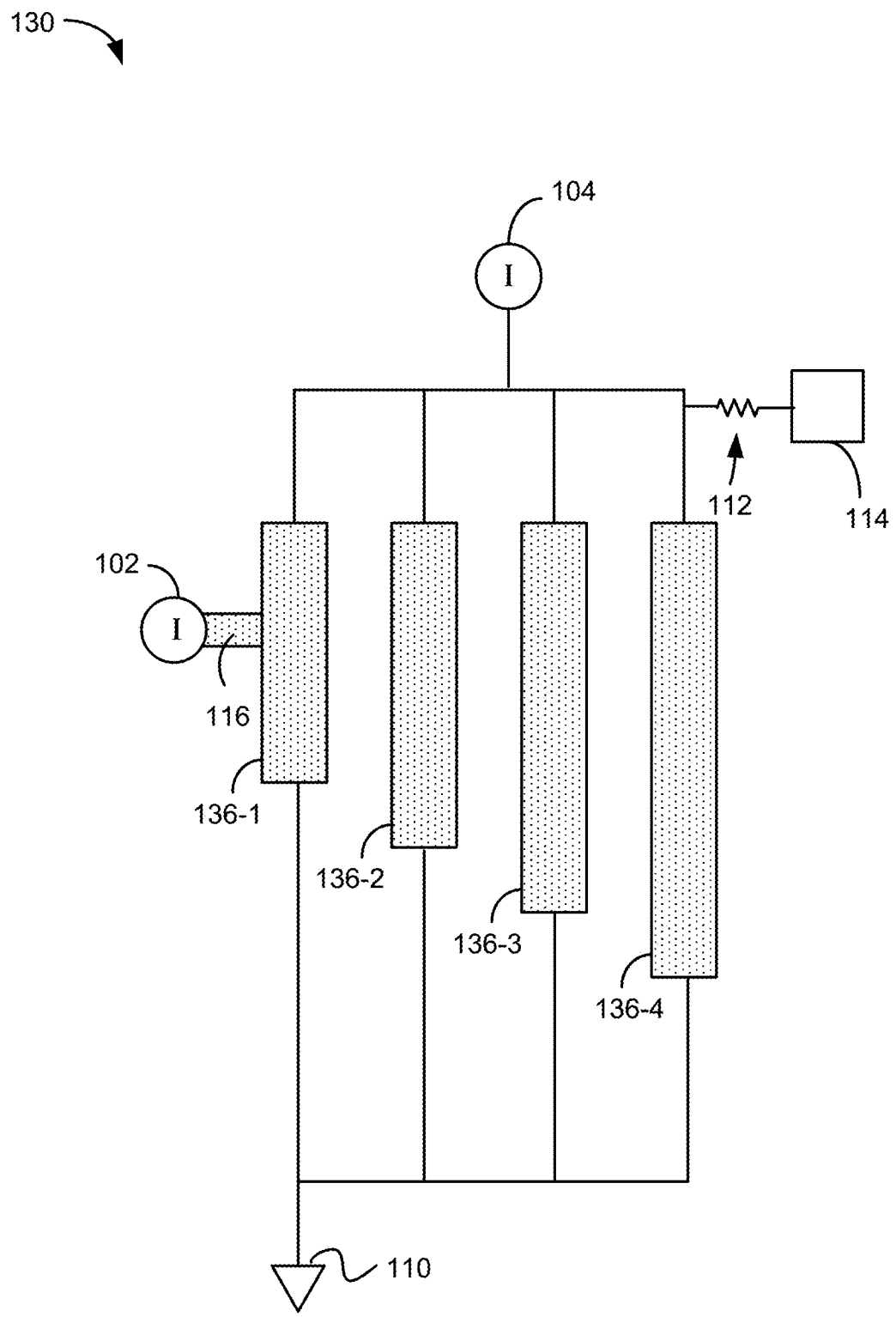

FIG. 1C shows a superconducting circuit 130 that includes a first current source 102 connected to the superconducting wire 136-1 (optionally via a supply wire 116), a plurality of wires 136, a second current source 104, and circuitry 114 coupled to the superconducting layer 118 (optionally via resistor(s) 112). In some embodiments, the plurality of wires 136 are coupled to electrical ground 110. In some embodiments, the wires 136 are all composed of a same superconducting material. In some embodiments, the wires 136 are composed of two or more distinct superconducting materials. For example, the wire 136-1 is composed of a first superconducting material (e.g., niobium) and the wire 136-4 is composed of a second superconducting material that is distinct from the first superconducting material (e.g., cadmium). In some embodiments, the wires 136 each have a same width, while in other embodiments the wires 136 have two or more distinct widths (e.g., the wire 136-1 has a first width and the wire 136-4 has a second width that is distinct from the first width). In some embodiments, the wires 136 each have a geometric shape (e.g., rectangular or oval cross-section), while in other embodiments, one or more of the wires 136 have a non-geometric shape (e.g., irregular cross-section). In some embodiments, the wires 136 each have a rectangular or oval shape (when viewed from top down as shown in a plan view), while in other embodiments, one or more of the wires 136 have any other shape. In some embodiments, the wires 136 each have a same thickness, while in other embodiments, one or more of the wires 136 have a thickness different from others of the wires 136.

Figure 1D:
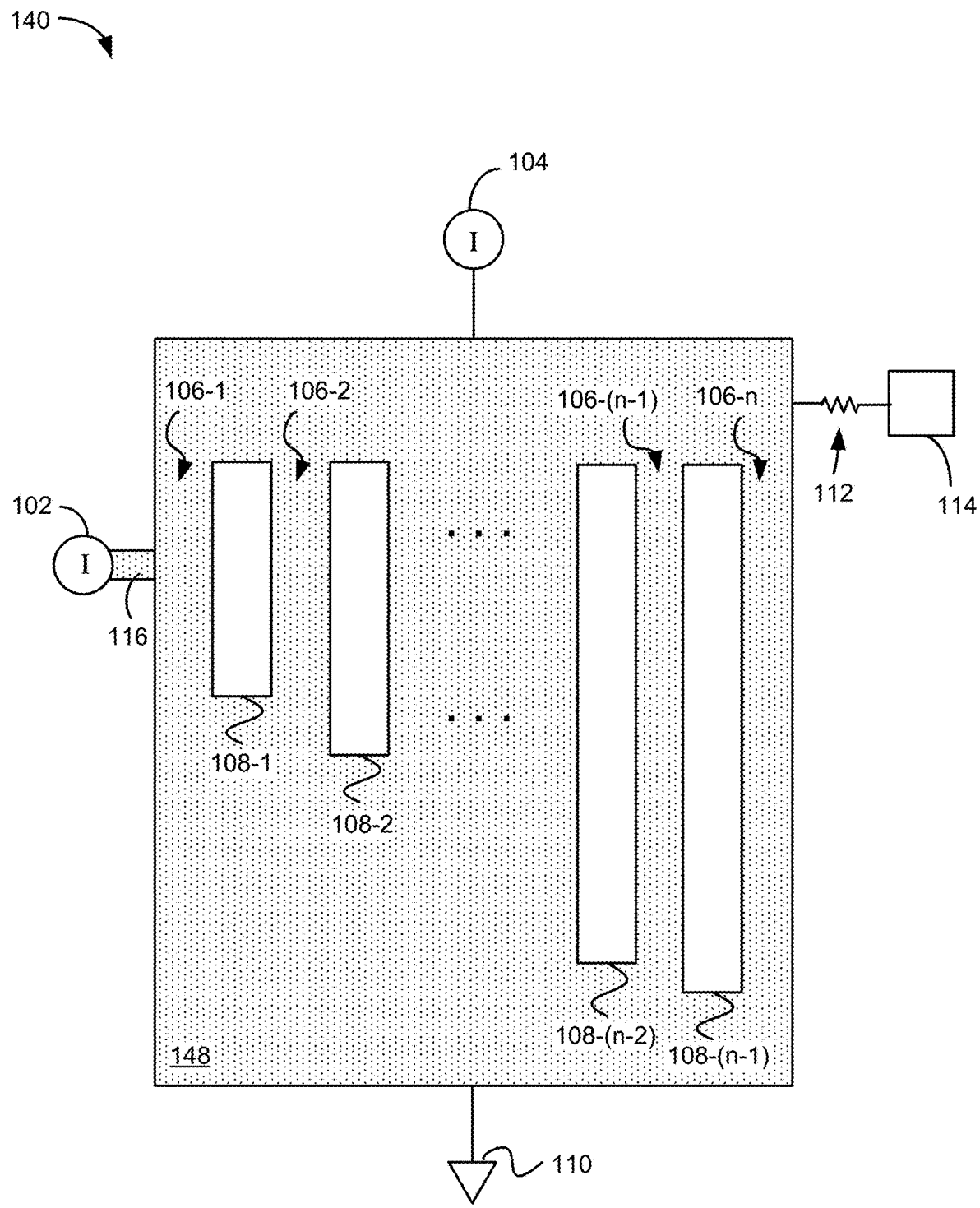

FIG. 1D shows a superconducting circuit 140 having a superconducting layer 148, a first current source 102 connected to the superconducting layer 148 (optionally via wire 116), a second current source 104 connected to the superconducting layer 148, and circuitry 114 coupled to the superconducting layer 148 (optionally via resistor(s) 112). In some embodiments, the superconducting layer 148 is electrically coupled with electrical ground 110. In accordance with some embodiments, the superconducting layer 148 includes 'n' wires 106 defined in part by 'n–1' gaps 108.

Figure 1E:
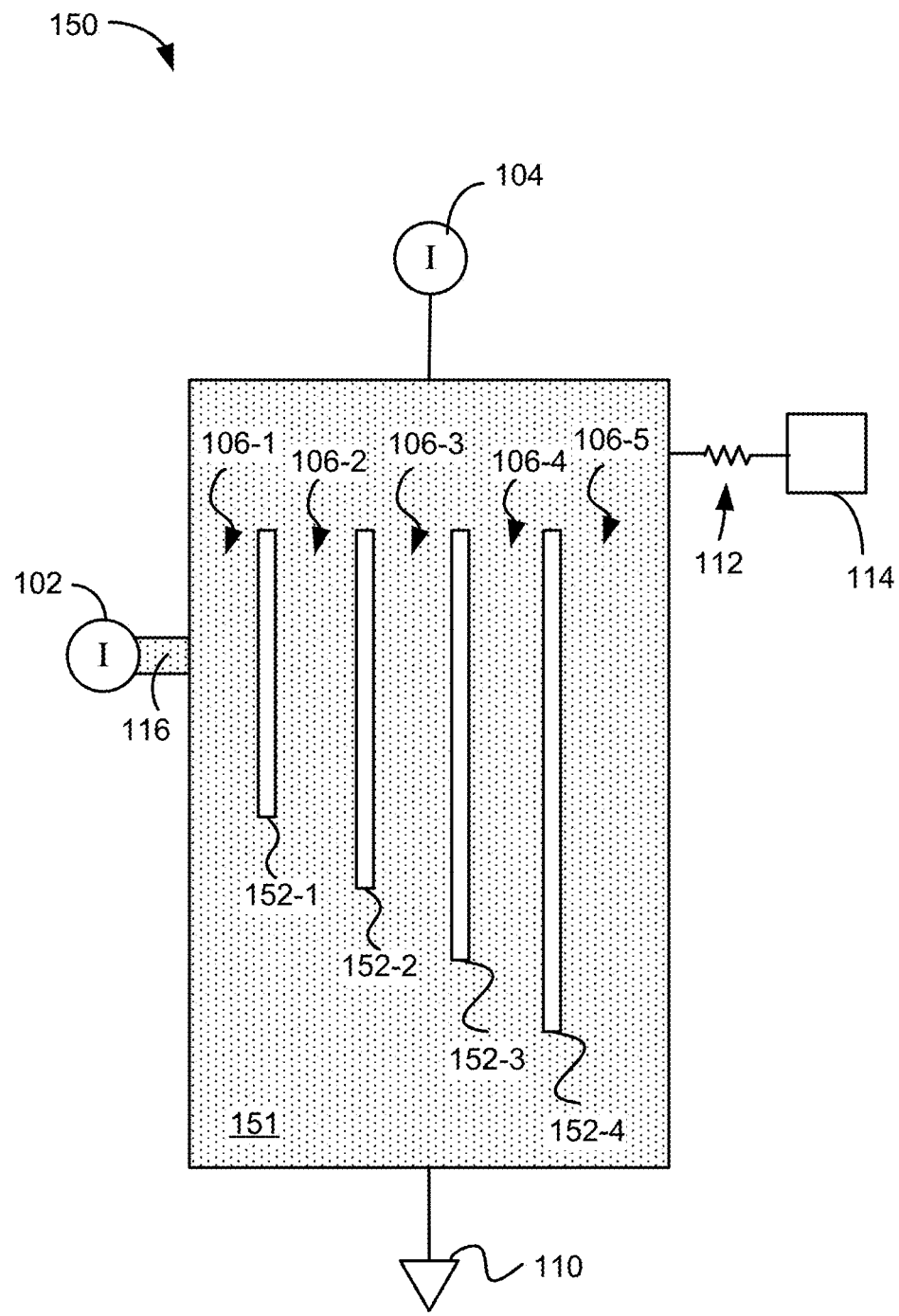

FIG. 1E shows a superconducting circuit 150 having a superconducting layer 151, a first current source 102 connected to the superconducting layer 151 (optionally via wire 116), a second current source 104 connected to the superconducting layer 151, and circuitry 114 coupled to the superconducting layer 151 (optionally via resistor(s) 112). In some embodiments, the superconducting layer 151 is electrically coupled with an electrical ground 110. In accordance with some embodiments, the superconducting layer 151 includes wires 106 defined in part by gaps 152.

In some embodiments, one example of which is shown in FIG. 1E, the gaps 152 are configured so as to enable thermal energy to pass between adjacent wires 106. In some embodiments, the gaps 152 are configured so as to enable capacitive coupling between adjacent wires 106. In some embodiments, each gap 152 has a width in the range of 5 nm to 20 nms. In some embodiments, the gaps 152 are composed of a thermally-conductive material such as diamond or aluminum nitride (e.g., the gap 152 is filled with a thermally-conductive material). In some embodiments, the thermally-conductive material in the gap 152 is an electrical insulator (e.g., the thermally-conductive material in the gap 152 is electrically non-conductive). In some embodiments, the thermally-conductive material in the gap 152 has a resistance higher than the resistance of adjacent wires 106 in a superconducting state (e.g., the thermally-conductive material is a conductor with non-zero resistance, such as 50 Ohms or higher).

In some embodiments, one or more of the gaps 152 have a regular shape such as a rectangle or oval. In some embodiments, one or more of the gaps 152 have an irregular shape. In some embodiments, the gaps 152 have increasing lengths such that gap 152-1 is shorter than gap 152-2 and gap 152-2 is shorter than gap 152-3. In some embodiments, the gaps 152 have the same, or substantially the same, length (e.g., within 5%, 10%, or 15% of one another). In some embodiments, the wires 106 the same, or substantially the same, width (e.g., within 5%, 10%, or 15% of one another). In some embodiments, the wires 106 have differing widths. For example, the wires 106 have increasing widths such that wire 106-2 is wider than wire 106-1 and wire 106-3 is wider than wire 106-2.

Figure 2A:
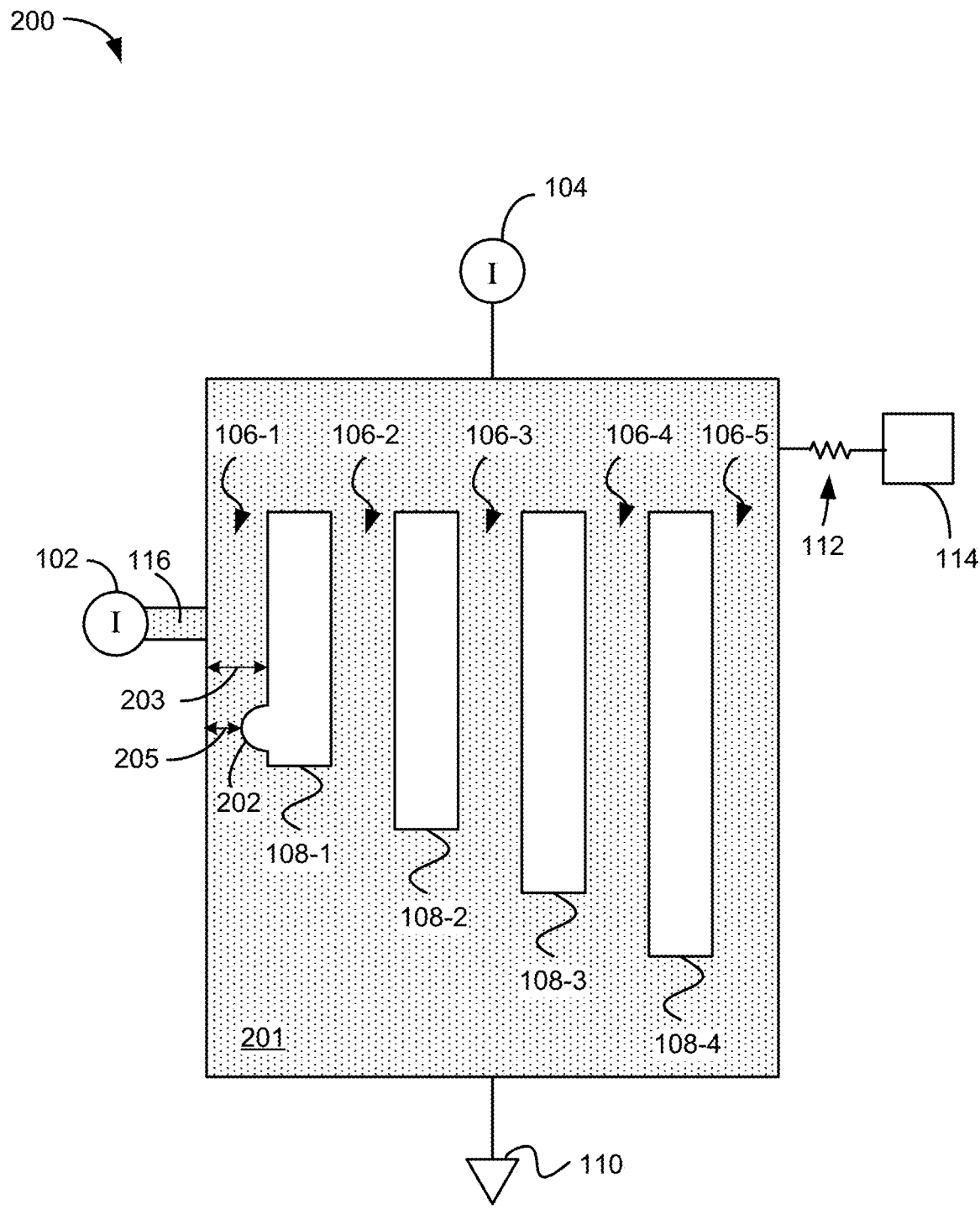
FIGS. 2A-2B are block diagrams illustrating representative superconducting circuits having a constriction point in accordance with some embodiments.
Figure 2B:
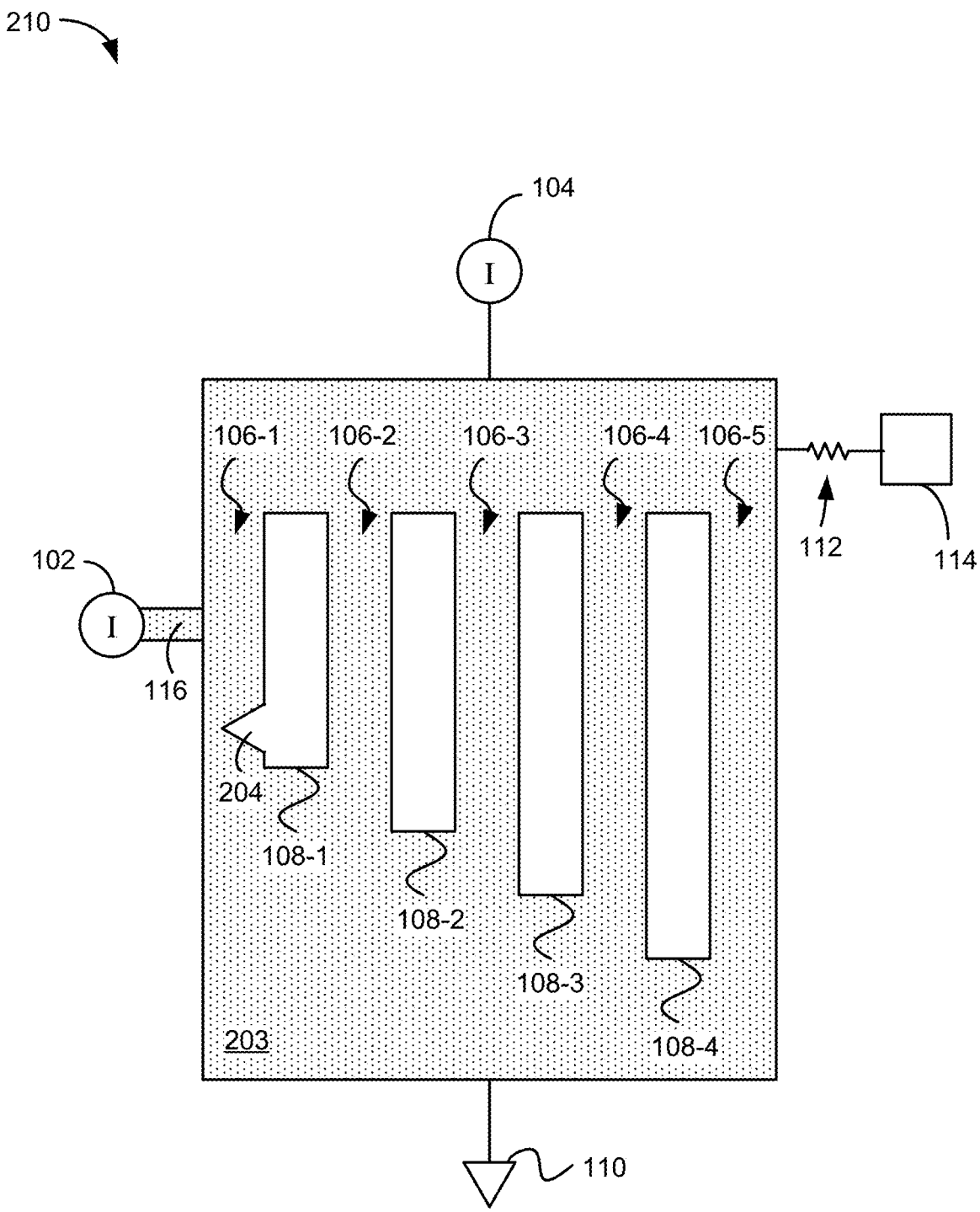

FIGS. 2A-2B are block diagrams illustrating representative superconducting circuits having a constriction point in accordance with some embodiments. FIG. 2A shows a superconducting circuit 200 similar to the superconducting circuit 100 in FIG. 1A. However, the superconducting layer 201 in FIG. 2A includes a constriction 202 defined on the wire 106-1. FIG. 2A also shows the wire 106-1 having a width of 203 remote from the constriction 202 and a width 205 at the point of the constriction 202. In some embodiments, the constriction 202 is defined by a widening of the gap 108-1 at a point along the length of the wire 106-1. In some embodiments, the constriction 202 is a non-superconducting material whose presence narrows the width of the wire 106-1.

FIG. 2B shows a superconducting circuit 210 similar to the superconducting circuit 200 in FIG. 2A. However, the constriction 204 along the wire 106-1 in FIG. 2B has a triangular shape, rather than the semi-circular shape of the constriction 202 in FIG. 2A. In some embodiments (not shown), the constriction has another regular shape (e.g., a triangle with one or more rounded corners, a rectangle with or without one or more rounded corners), while in other embodiments, the constriction has an irregular shape.

Figure 3A:
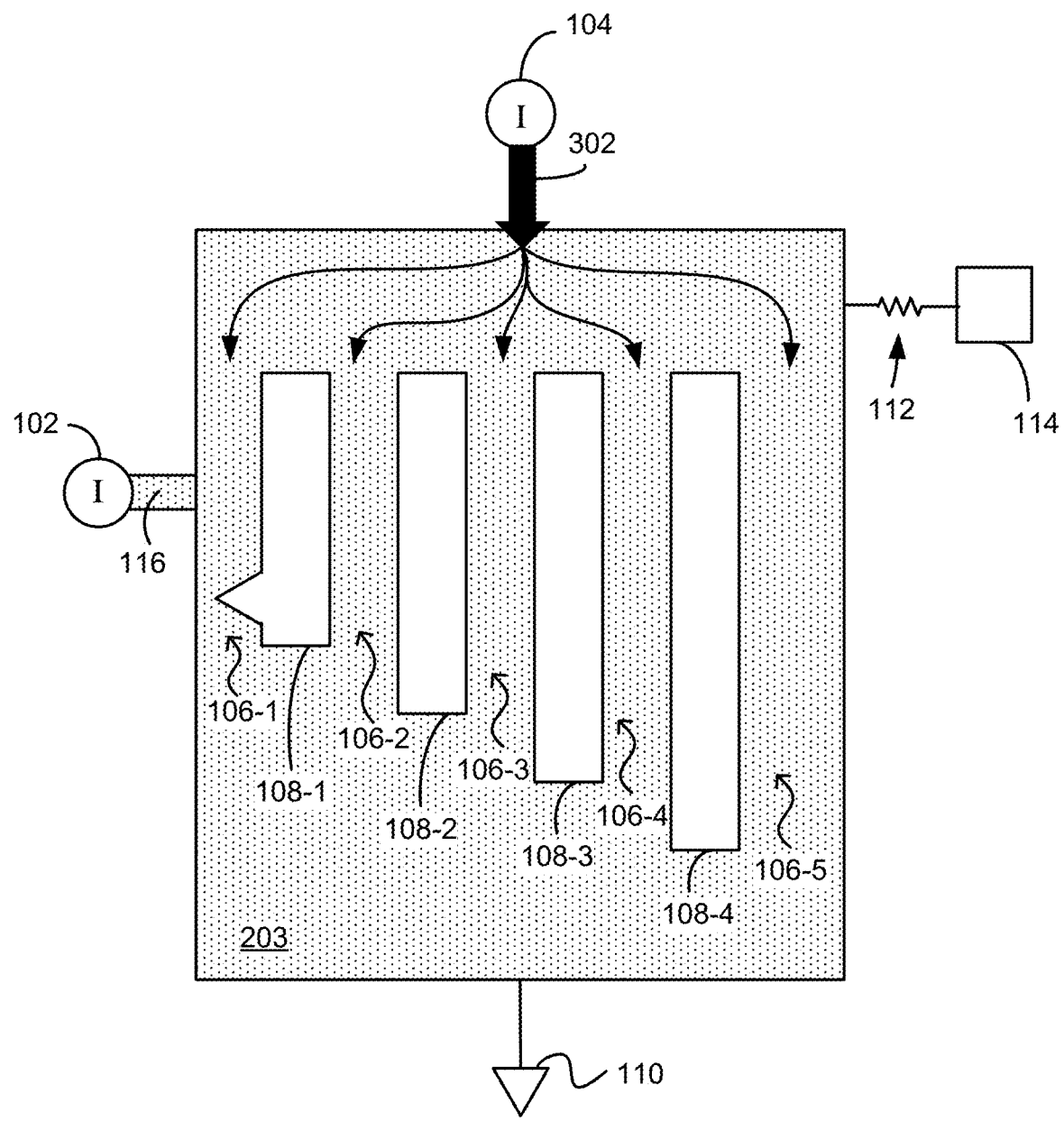
FIGS. 3A-3G are prophetic diagrams illustrating a representative operating sequence of the superconducting circuit of FIG. 2B in accordance with some embodiments.

FIGS. 3A-3G provide a prophetic example illustrating a representative operating sequence of the superconducting circuit 210 of FIG. 2B in accordance with some embodiments. FIG. 3A shows the superconducting circuit 210 at a first time. As shown in FIG. 3A, at the first time, the current source 104 is supplying an amplification current 302 to the superconducting layer 203 and at least a portion of the amplification current 302 is flowing through each of the wires 106.

Figure 3B:
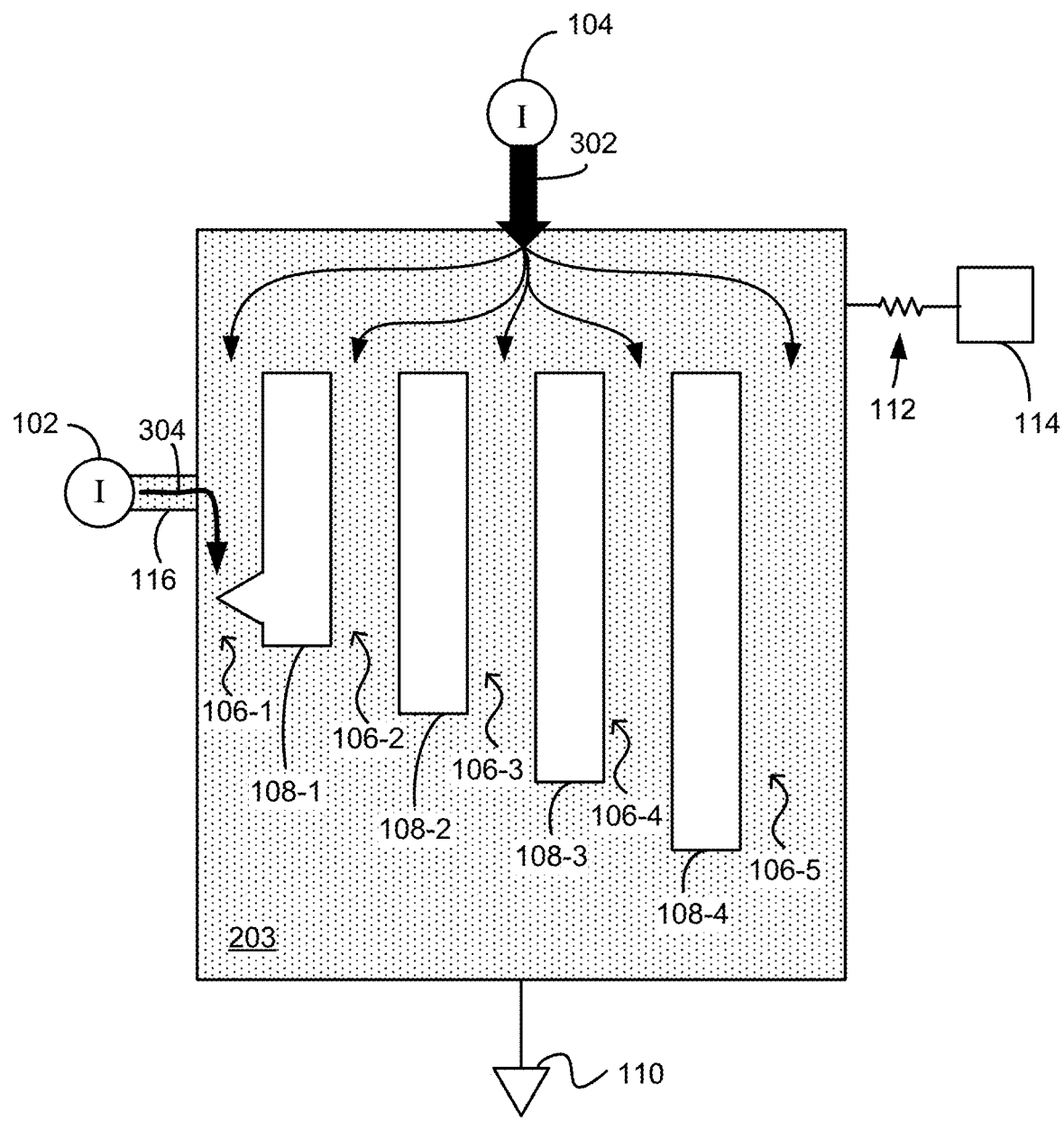

FIG. 3B shows the superconducting circuit 210 at a second time (that is subsequent to the first time). As shown in FIG. 3B, at the second time, the current source 104 is still supplying the current 302 and the current source 102 is supplying an additional current 304 (optionally via wire 116).

Figure 3C:
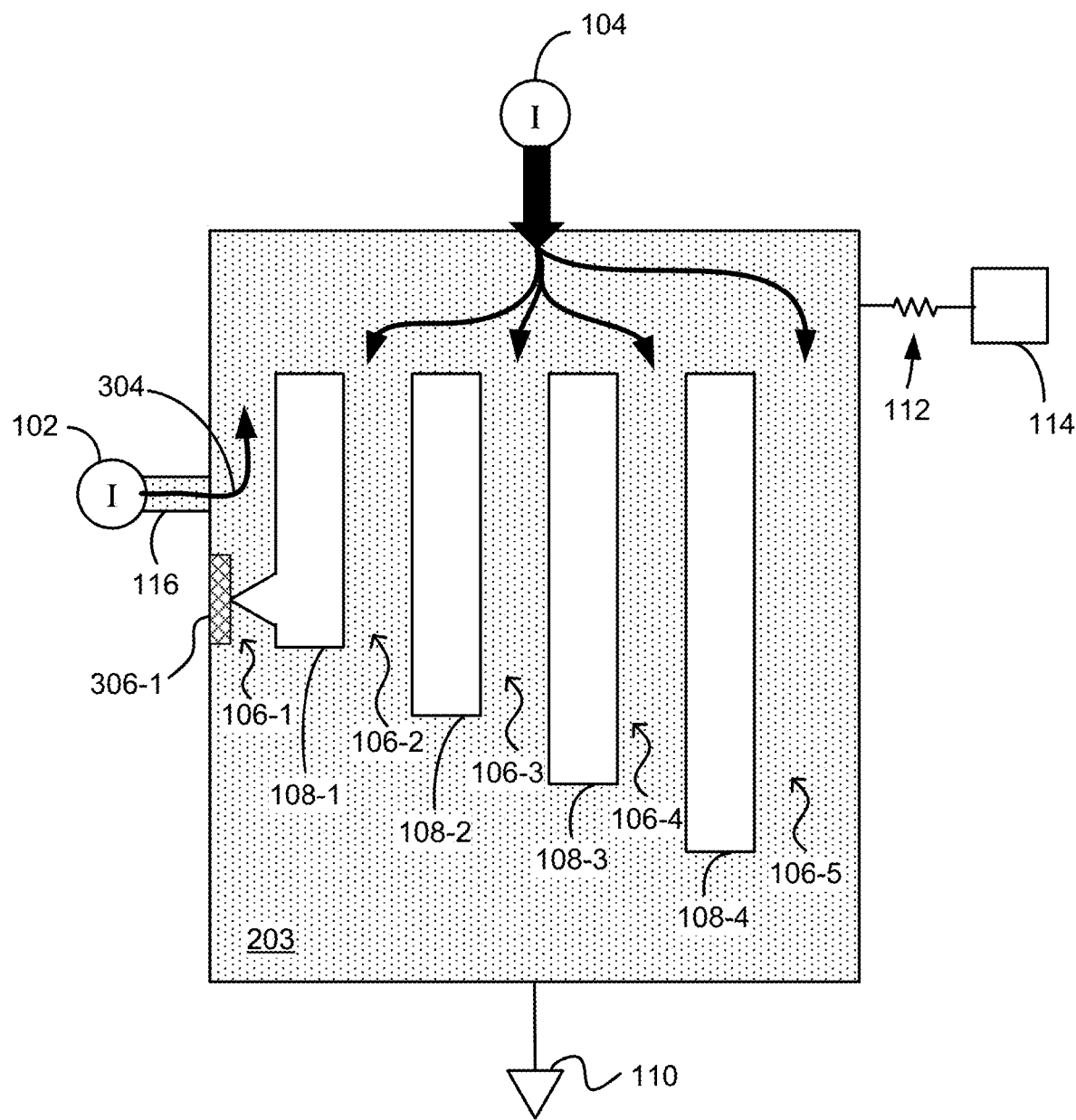

FIG. 3C shows the superconducting circuit 210 at a third time (that is subsequent to the second time). As shown in FIG. 3C, at the third time, at least a portion of the wire 106-1 has transitioned from a superconducting state to a non-superconducting state as denoted by the region 306-1. The transition of the wire 106-1 is in response to the current supplied to the wire 106-1 (e.g., a sum of the current 304 and a portion of the current 302 previously flowing through the wire 106-1) exceeding a threshold superconducting current for the wire 106-1 (e.g., current between 0.5 µA and 10 µA). In some embodiments, the current 304 from the current source 102 is adapted (e.g., selected) such that the total current supplied to the wire 106-1 (e.g., current 304 plus a portion of current 302) exceeds the threshold superconducting current for the wire 106-1.

In the non-superconducting state, the wire 106-1 has a non-zero electrical resistance and thus the current substantially ceases to flow through the wire 106-1 (e.g., less than 10%, 5%, or 1% of the current continues to flow through the wire 106-1) while at least one of the other wires 106 continues to have zero electrical resistance. The current that has previously flown through the wire 106-1 (e.g., the current 304 and/or a portion of the current 302) is redirected through the other wires 106. In some embodiments, the current source 102 continues to supply the current 304 after the wire 106-1 has transitioned to the non-superconducting state, while in other embodiments, the current source 102 ceases to supply the current 304 after the wire 106-1 has transitioned to the non-superconducting state.

Figure 3D:
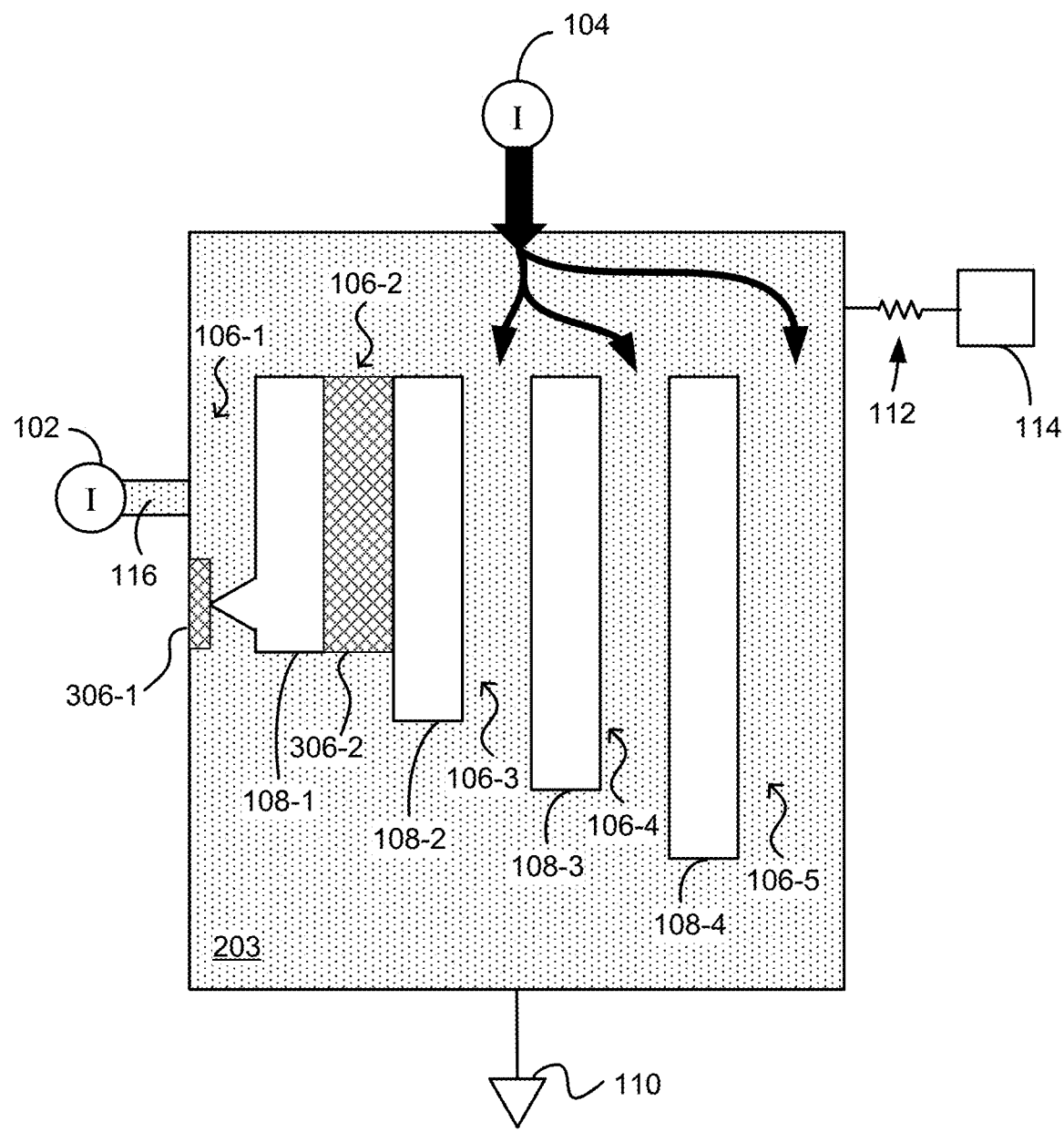

FIG. 3D shows the superconducting circuit 210 at a fourth time (that is subsequent to the third time). As shown in FIG. 3D, at the fourth time, the wire 106-2 has transitioned from a superconducting state to a non-superconducting state as denoted by the region 306-2. The transition of the wire 106-2 is in response to the current supplied to the wire 106-2 exceeding a threshold superconducting current for the wire 106-2 (e.g., due to the additional current redirected from wire 106-1).

Figure 3E:
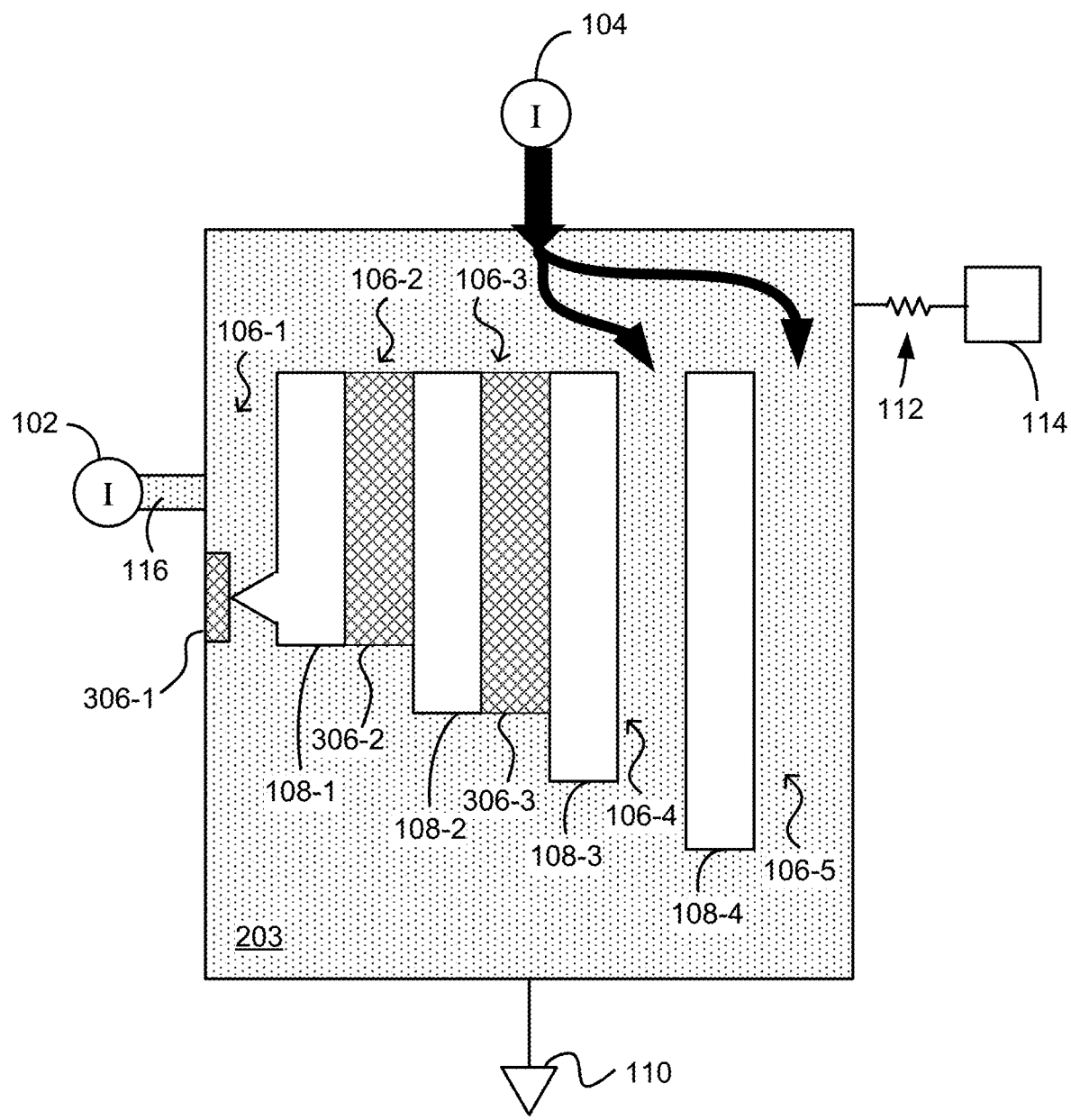

FIG. 3E shows the superconducting circuit 210 at a fifth time (that is subsequent to the fourth time). As shown in FIG. 3E, at the fifth time, the wire 106-3 has transitioned from a superconducting state to a non-superconducting state as denoted by the region 306-3 in response to additional current redirected from the wires 106-1 and 106-2. The transition of wire 106-3 is in response to the current supplied to the wire 106-3 exceeding a threshold superconducting current for the wire 106-3.

Figure 3F:
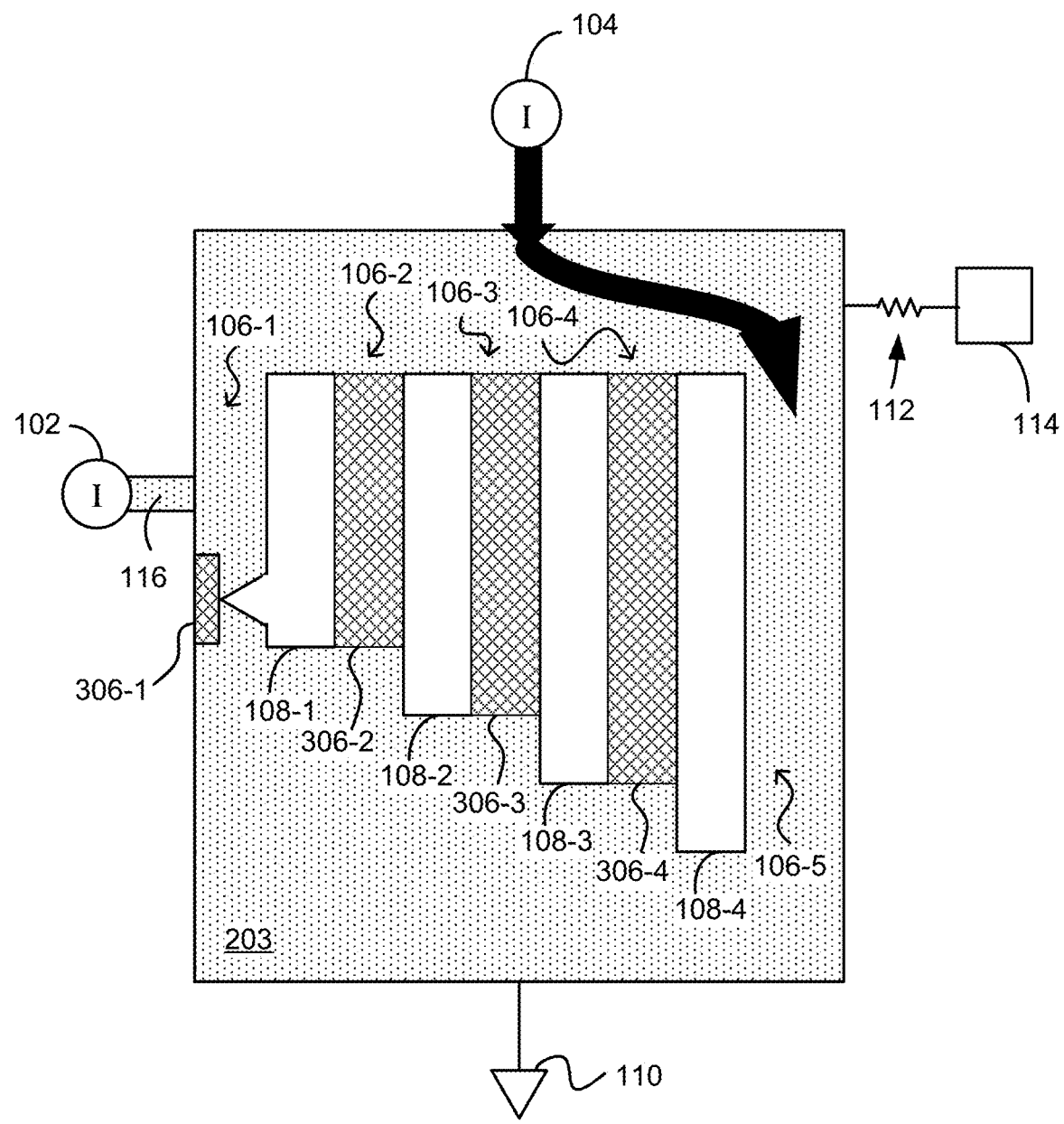

FIG. 3F shows the superconducting circuit 210 at a sixth time (that is subsequent to the fifth time). As shown in FIG. 3F, at the sixth time, the wire 106-4 has transitioned from a superconducting state to a non-superconducting state as denoted by the region 306-4 in response to additional current redirected from the wires 106-1, 106-2, and 106-3. The transition of wire 106-4 is in response to the current supplied to the wire 106-4 exceeding a threshold superconducting current for the wire 106-4.

Figure 3G:
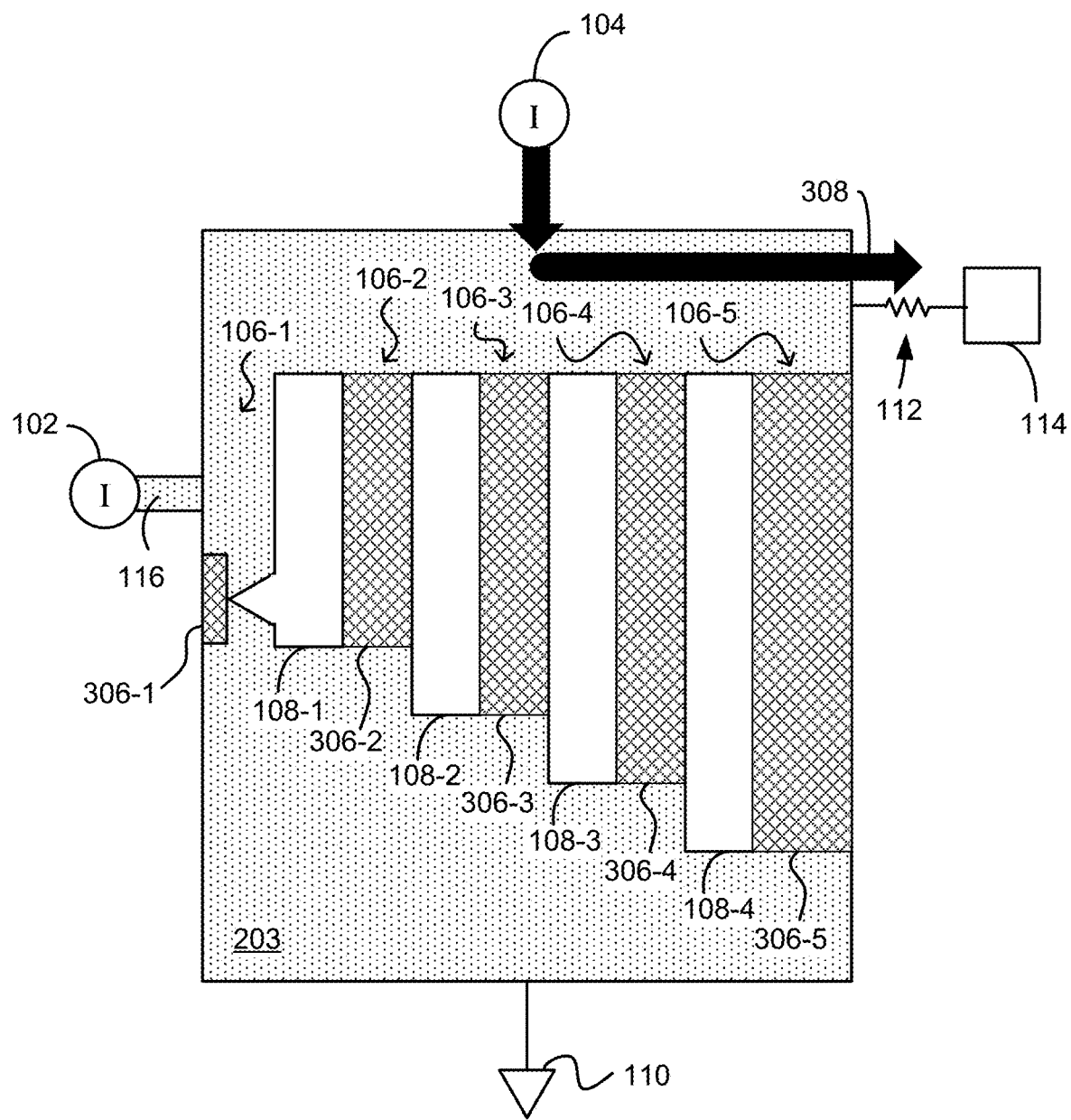

FIG. 3G shows the superconducting circuit 210 at a seventh time (that is subsequent to the sixth time). As shown in FIG. 3G, at the seventh time, the wire 106-5 has transitioned from a superconducting state to a non-superconducting state as denoted by the region 306-5 in response to additional current redirected from the other wires 106. The transition of wire 106-5 is in response to the current supplied to the wire 106-5 exceeding a threshold superconducting current for the wire 106-5.

In response to all of the wires 106 transitioning to the non-superconducting state, current 308 (e.g., some or all of current 302) from the current source 104 is directed (optionally through the resistor(s) 112) to the circuitry 114. In some embodiments, the resistance of the resistor(s) 112 is less than a combined resistance of the wires 106 when the wires are in the non-superconducting state, which facilitates a large portion of the current 308 to flow to the circuitry 114.

As described above with respect to FIGS. 3A-3G, providing the input current to the first wire 106-1 causes a sequential (or near sequential) cascade effect through the superconducting circuit (e.g., a sequential transition of wires 106-1 through 106-5 from superconducting states to non-superconducting states) which in turn redirects current from the second current source 104 to the circuitry 114. Typically, the current provided by the second current source 104 is greater than the current provided by the first current source 102 (e.g., the current provided by the second current source 104 is at least 4, 5, 6, 7, 8, 9, or 10 times greater than the current provided by the first current source 102). Thus, the electronic systems illustrated in FIGS. 3A-3G operate as an amplifier (e.g., a current amplifier) for the first current source in that the current 308 in FIG. 3G is larger than the current 304 in FIG. 3B.

Figure 4:
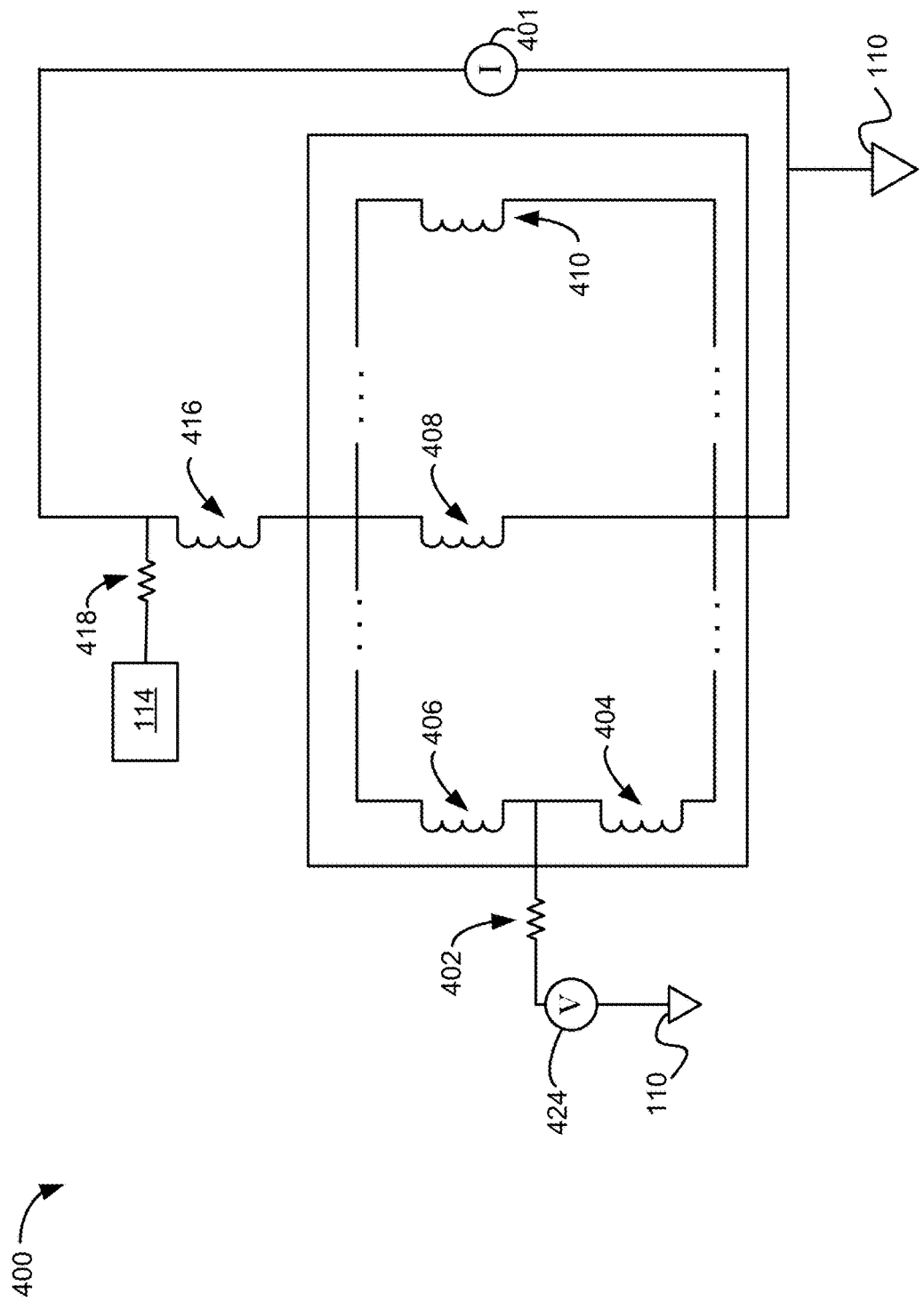
FIG. 4 is a circuit diagram illustrating a representative superconducting circuit in accordance with some embodiments.

FIG. 4 is a circuit diagram illustrating a representative superconducting circuit in accordance with some embodiments. FIG. 4 shows a circuit 400 equivalent to the block diagrams of FIGS. 1A-1D. In FIG. 4, the circuit 400 includes a voltage source 424 with input resistance 402 (e.g., equivalent to current source 102 in FIG. 1A), current source 401 (e.g., equivalent to current source 104 in FIGS. 1A, 3A, etc.), an optional resistor 418 (e.g., corresponding to resistor 112), and the circuitry 114. FIG. 4 also shows inductors 404, 406, 408, and 410 representing inductances of the superconducting wires in FIGS. 1A-1D, 2A-2B, and 3A-3G. For example, inductors 404 and 406 correspond to wire 106-1 in FIG. 1D and inductor 410 corresponds to wire 106-n in FIG.

1D, whereas inductor 408 corresponds to a wire between 106-1 and 106-n, such as wire 106-2.

Figure 5A:
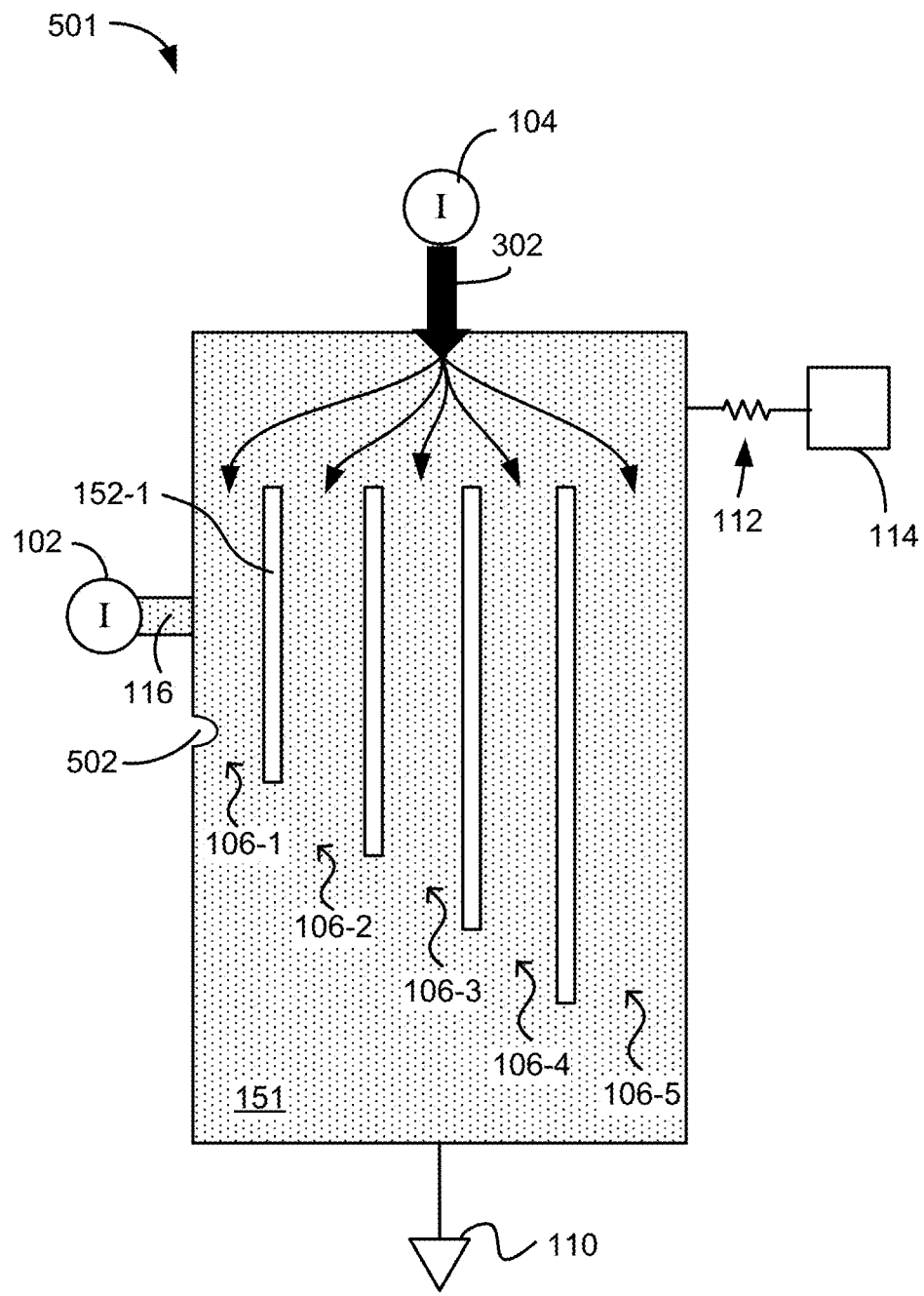
FIGS. 5A-5G are prophetic diagrams illustrating a representative operating sequence of the superconducting circuit of FIG. 2B in accordance with some embodiments.

FIGS. 5A-5G are prophetic diagrams illustrating a representative operating sequence of a superconducting circuit 501 in accordance with some embodiments. The superconducting circuit 501 comprises the superconducting circuit 150 of FIG. 1E with a constriction 502 along the length of the wire 106-1. In some embodiments, the constriction 502 is located along an edge of the superconducting layer 151 as shown in FIG. 5A, while in other embodiments, the constriction 502 is located along the gap 152-1. In some embodiments, the superconducting circuit 501 does not include the constriction 502.

FIG. 5A shows the superconducting circuit 501 at a first time, similar to the circuit shown in FIG. 3A. At the first time, the current source 104 is supplying a current 302 to the superconducting layer 151 and at least a portion of the current 302 is flowing through each of the wires 106 (e.g., 106-1, 106-2, 106-3, 106-4, and 106-5).

Figure 5B:
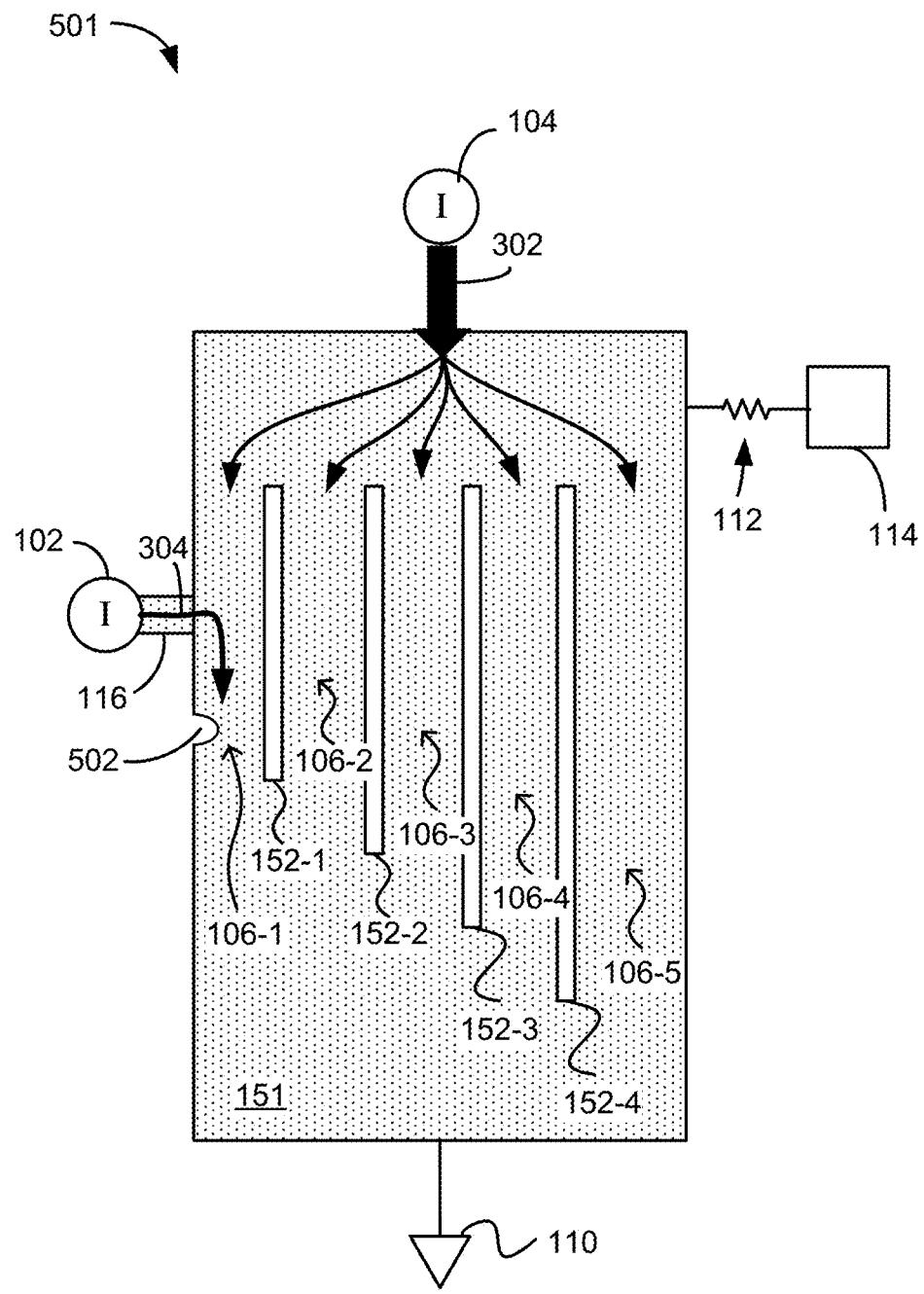

FIG. 5B shows the superconducting circuit 501 at a second time (that is subsequent to the first time). As shown in FIG. 5B, at the second time, the current source 104 is still supplying the current 302 and the current source 102 is supplying an additional current 304 (optionally via wire 116).

Figure 5C:
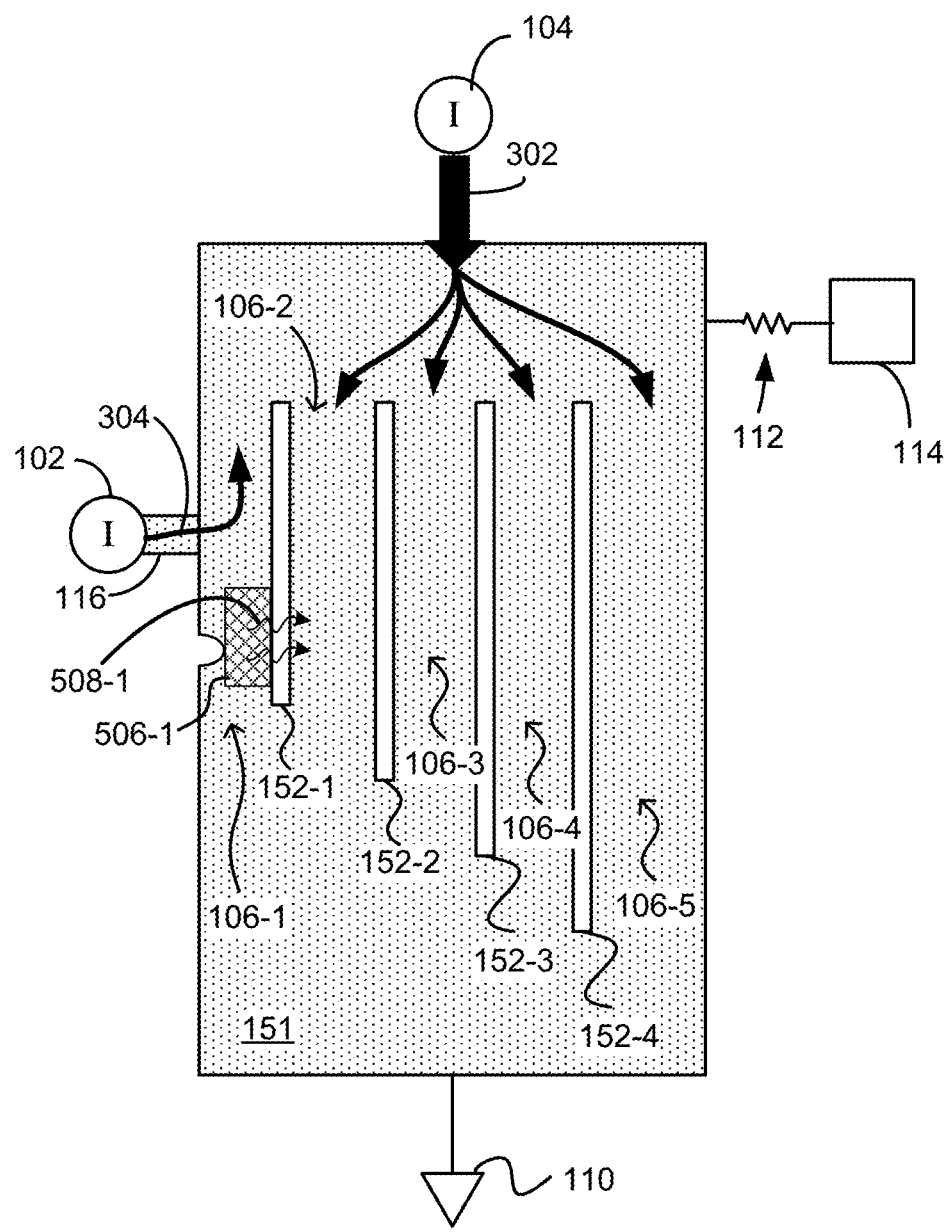

FIG. 5C shows the superconducting circuit 501 at a third time (that is subsequent to the second time). As shown in FIG. 5C, at the third time, at least a portion of the wire 106-1 has transitioned from a superconducting state to a non-superconducting state as denoted by the region 506-1. The transition of the wire 106-1 is in response to the current supplied to the wire 106-1 (e.g., a sum of the current 304 and a portion of the current 302 previously flowing through the wire 106-1) exceeding a threshold superconducting current for the wire 106-1 (e.g., current between 0.5 μA and 10 μA). In some embodiments, the current 304 from the current source 102 is adapted (e.g., selected) such that the total current supplied to the wire 106-1 (e.g., current 304 plus a portion of current 302) exceeds the threshold superconducting current for the wire 106-1.

In the non-superconducting state, the wire 106-1 has a non-zero electrical resistance and thus the current ceases to flow through the wire 106-1. Current that previously flowed through the wire 106-1 (e.g., the current 304 from current source 102 and a portion of the current 302 from current source 104) is redirected through the other wires 106 (e.g., wires 106-2, 106-3, 106-4, and 106-5). In some embodiments, the current source 102 continues to supply the current 304 after the wire 106-1 has transitioned to the non-superconducting state, while in other embodiments, the current source 102 ceases to supply the current 304 after the wire 106-1 has transitioned to the non-superconducting state.

In the non-superconducting state (and/or during the transition from the superconducting state to the non-superconducting state), the non-zero electrical resistance of the wire 106-1 causes heat to be produced at wire 106-1. In accordance with some embodiments, the heat from the wire 106-1 transfers to the wire 106-2 (e.g., the gap 152-1 is filled with a thermally conductive material and/or the wire 106-1 and the wire 106-2 are thermally coupled through a thermally conductive material located above or below the wire 106-1 and the wire 106-2). In some embodiments, the heat from the wire 106-1 transfers to the wire 106-2 via the gap 152-1. In accordance with some embodiments, the wire 106-1 and the wire 106-2 are capacitively coupled via the gap 152-1 (e.g., in addition to, or instead of, the thermal coupling between the wire 106-1 and the wire 106-2 based, for example, on the presence of the thermally conductive material in the gap 152-1). Therefore, energy transfers (e.g., current flows) from the wire 106-1 to the wire 106-2 via capacitive charging once the wire 106-1 transitions to the non-superconducting state. FIG. 5C shows heat and/or energy 508-1 transfer from the wire 106-1 to the wire 106-2 (e.g., heat transfer through thermal coupling and/or energy transfer through capacitive coupling).

Figure 5D:
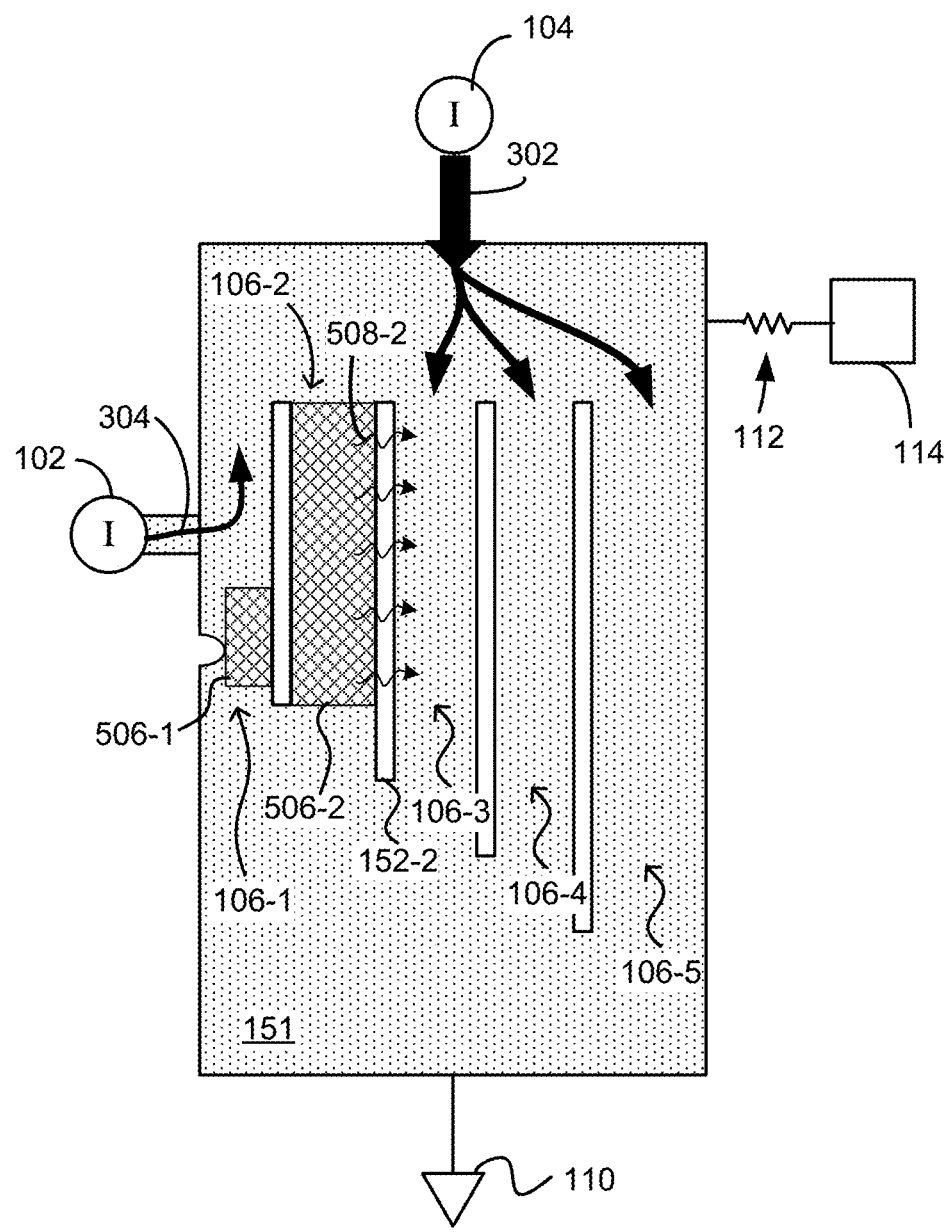

FIG. 5D shows the superconducting circuit 501 at a fourth time (that is subsequent to the third time). As shown in FIG. 5D, at the fourth time, the wire 106-2 has transitioned from a superconducting state to a non-superconducting state as denoted by the region 506-2.

In some embodiments, the transition of the wire 106-2 is in response to the current supplied to the wire 106-2 exceeding a threshold superconducting current for the wire 106-2 (e.g., due to the additional current redirected from the wire 106-1). In some embodiments, the transition of the wire 106-2 is in response to the heat and/or energy transfer 508-1 from the wire 106-1 (shown in FIG. 5C). In accordance with some embodiments, the heat transfer from the wire 106-1 increases a temperature of the wire 106-2 above a threshold superconducting temperature. In some embodiments, the energy transferred from the wire 106-1 induces additional current for the wire 106-2 such that the portion of the current 302 flowing through the wire 106-2 (e.g., prior to, or in the absence of, any additional current redirected from the wire 106-1) exceeds a threshold superconducting current for the wire 106-2, causing the wire 106-2 to transition to a non-superconducting state.

In some instances, the threshold superconducting current for the wire 106-2 is based on an operating temperature of the wire 106-2. For example, in some embodiments, when the operating temperature of the wire 106-2 increases, the threshold superconducting current decreases such that the threshold superconducting current is exceeded with less current flowing through the wire 106-2. Therefore, in accordance with some embodiments, the heat transfer 508-1 increases a temperature of the wire 106-2 such that the portion of the current 302 flowing through the wire 106-2 (e.g., prior to, or in the absence of, any additional current redirected from the wire 106-1) exceeds a threshold superconducting current (which has been reduced due to the increased temperature of the wire 106-2) for the wire 106-2, causing the wire 106-2 to transition to a non-superconducting state. In some embodiments, the wire 106-2 transitions from the superconducting state to the non-superconducting state based on a combination of the current supplied to the wire 106-2 (e.g., additional current due to the redirection of the current previously supplied to the wire 106-1 and/or the energy transferred from the wire 106-1 to the wire 106-2 via capacitive coupling) and the heat transferred from the wire 106-1 to the wire 106-2.

In the non-superconducting state (and/or during the transition from the superconducting state to the non-superconducting state), the non-zero electrical resistance of the wire 106-2 causes heat to be produced at wire 106-2. In accordance with some embodiments, the heat from the wire 106-2 transfers to the wire 106-3. In accordance with some embodiments, the heat from the wire 106-2 transfers to the wire 106-3 via a thermally conductive material (e.g., the gap 152-2 is filled with a thermally conductive material and/or the wire 106-4 and the wire 106-5 are thermally coupled through a thermally conductive material located above or below the wire 106-4 and the wire 106-5). In accordance with some embodiments, the wire 106-2 and the wire 106-3 are capacitively coupled via the gap 152-2 (e.g., in addition to, or instead of, the thermal coupling between the wire 106-2 and the wire 106-3 based, for example, in the presence of the thermally conductive material in the gap 152-2). Therefore, energy transfers from the wire 106-2 to the wire 106-3 via capacitive coupling. FIG. 5D shows heat and/or energy 508-2 transfer from the wire 106-2 to the wire 106-3 (e.g., heat transfer through thermal coupling and/or energy transfer through capacitive coupling).

Figure 5E:
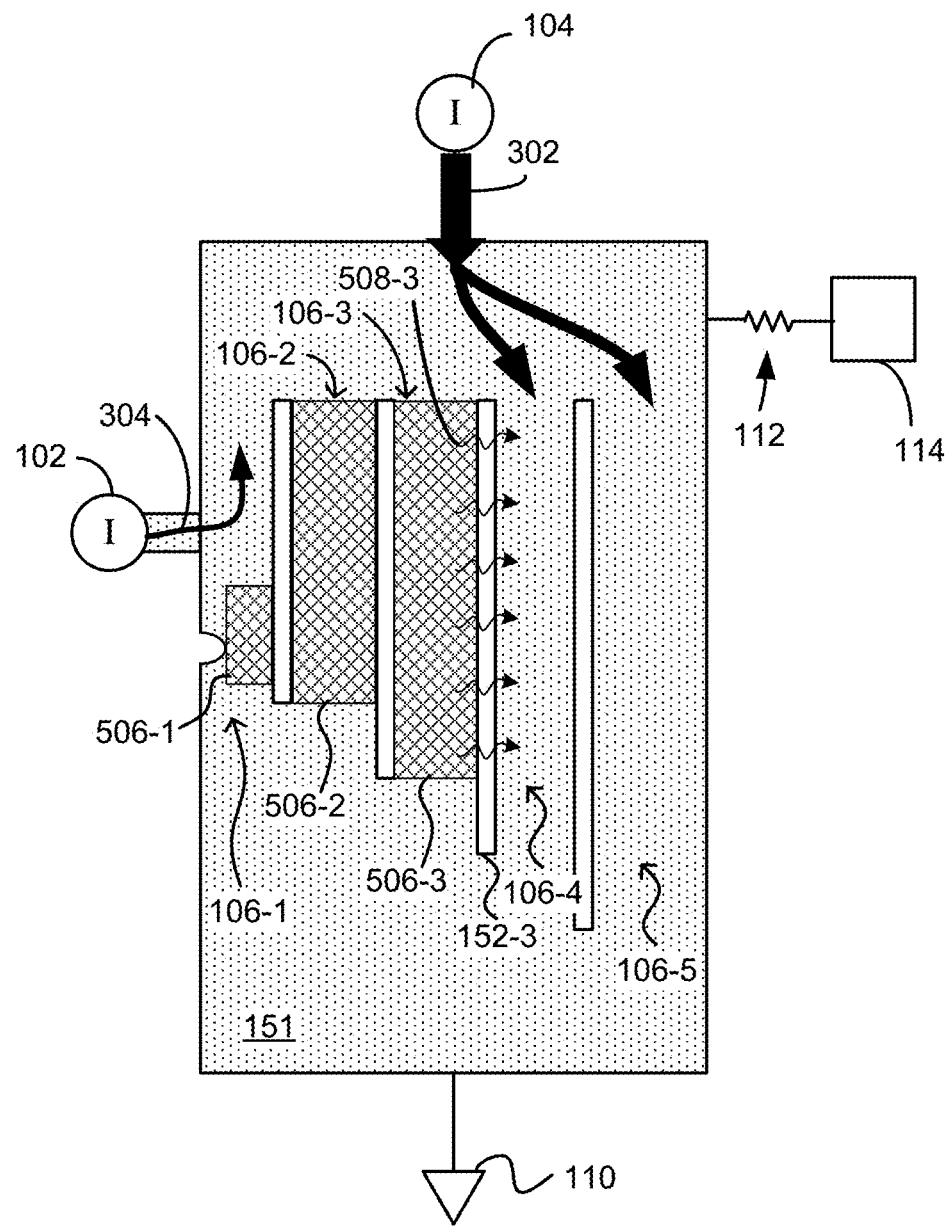

FIG. 5E shows the superconducting circuit 501 at a fifth time (that is subsequent to the fourth time). As shown in FIG. 5E, at the fifth time, the wire 106-3 has transitioned from a superconducting state to a non-superconducting state as denoted by the region 506-3.

In some embodiments, the transition of the wire 106-3 is in response to the current supplied to the wire 106-3 exceeding a threshold superconducting current for the wire 106-3 (e.g., due to the additional current redirected from the wire 106-2). In some embodiments, the transition of the wire 106-3 is in response to the heat and/or energy transfer 508-2 from the wire 106-2 (shown in FIG. 5D). In accordance with some embodiments, the heat transfer 508-2 from the wire 106-2 increases a temperature of the wire 106-3 above a threshold superconducting temperature. In some embodiments, the energy transferred from the wire 106-2 induces additional current for the wire 106-3 such that the portion of the current 302 flowing through the wire 106-3 (e.g., prior to, or in the absence of, any additional current redirected from the wire 106-2) exceeds a threshold superconducting current for the wire 106-3, causing the wire 106-3 to transition to a non-superconducting state.

In some instances, the threshold superconducting current for the wire 106-3 is based on an operating temperature of the wire 106-3. For example, in some embodiments, when the operating temperature of the wire 106-3 increases, the threshold superconducting current decreases such that the threshold superconducting current is exceeded with less current flowing through the wire 106-3. Therefore, in accordance with some embodiments, the heat transfer 508-2 increases a temperature of the wire 106-3 such that the portion of the current 302 flowing through the wire 106-3 (e.g., prior to, or in the absence of, any additional current redirected from the wire 106-2) exceeds a threshold superconducting current (which has been reduced due to the increased temperature of the wire 106-3) for the wire 106-3, causing the wire 106-3 to transition to a non-superconducting state. In some embodiments, the wire 106-3 transitions from the superconducting state to the non-superconducting state based on a combination of the current supplied to the wire 106-3 (e.g., due to the redirection of the current previously supplied to the wire 106-2 and/or the energy transferred from the wire 106-2 to the wire 106-3 via capacitive coupling) and the heat transferred from the wire 106-2 to the wire 106-3.

In the non-superconducting state (and/or during the transition from the superconducting state to the non-superconducting state), the non-zero electrical resistance of the wire 106-3 causes heat to be produced at wire 106-3. In accordance with some embodiments, the heat from the wire 106-3 transfers to the wire 106-4 (e.g., the gap 152-3 is filled with a thermally conductive material and/or the wire 106-4 and the wire 106-5 are thermally coupled through a thermally conductive material located above or below the wire 106-4 and the wire 106-5). In some embodiments, the heat from the wire 106-3 transfers to the wire 106-4 via the gap 152-3. In accordance with some embodiments, the wire 106-3 and the wire 106-4 are capacitively coupled via the gap 152-3 (e.g., in addition to, or instead of, the thermal coupling between the wire 106-3 and the wire 106-4 based, for example, on the presence of the thermally conductive material in the gap 152-3). Therefore, energy transfers from the wire 106-3 to the wire 106-4 via capacitive coupling. FIG. 5E shows heat and/or energy 508-2 transfer from the wire 106-3 to the wire 106-4 (e.g., heat transfer through thermal coupling and/or energy transfer through capacitive coupling).

Figure 5F:
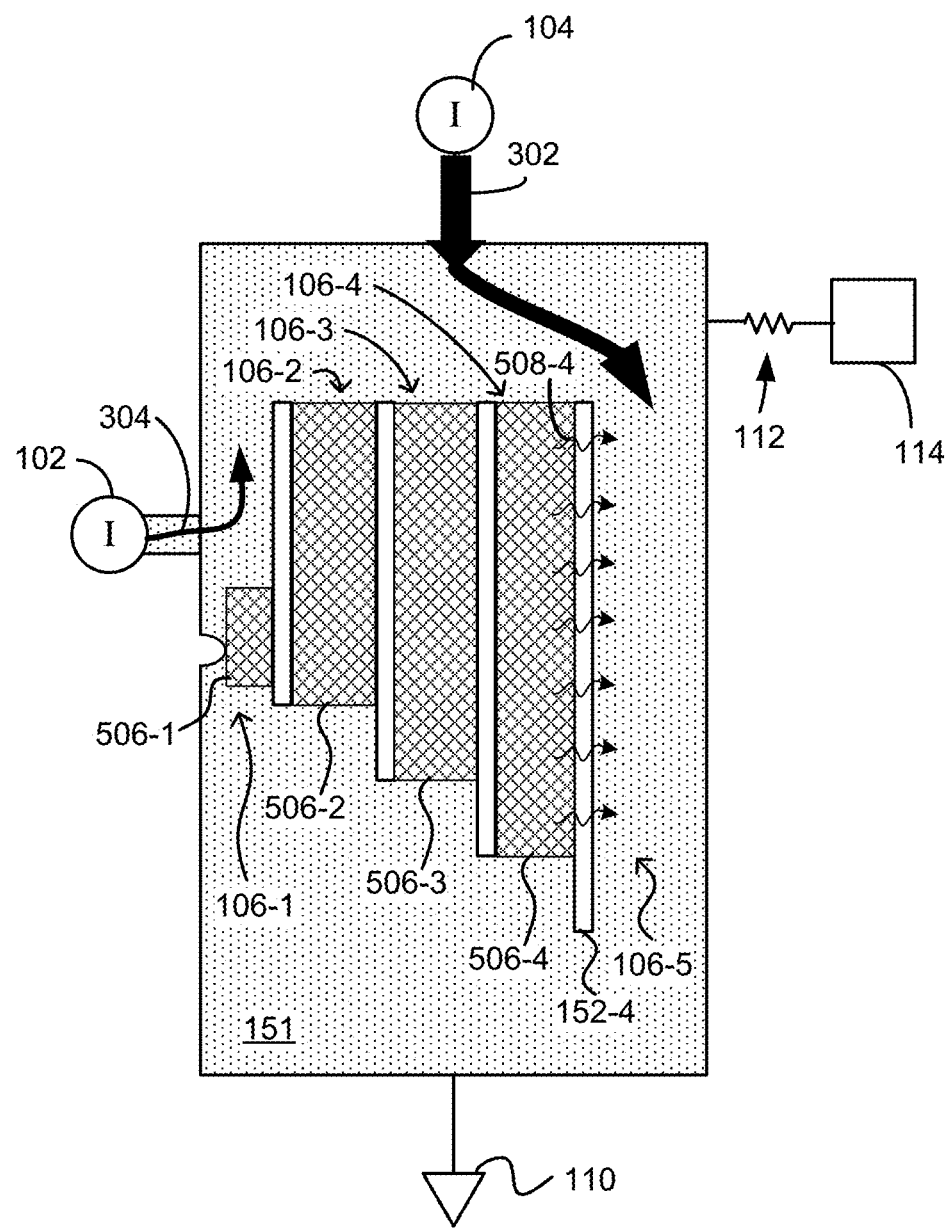

FIG. 5F shows the superconducting circuit 501 at a sixth time (that is subsequent to the fifth time). As shown in FIG. 5F, at the sixth time, the wire 106-4 has transitioned from a superconducting state to a non-superconducting state as denoted by the region 506-4.

In some embodiments, the transition of the wire 106-4 is in response to the current supplied to the wire 106-4 exceeding a threshold superconducting current for the wire 106-4 (e.g., due to the additional current redirected from the wire 106-3). In some embodiments, the transition of the wire 106-4 is in response to the heat and/or energy transfer 508-2 from the wire 106-3 (shown in FIG. 5E). In accordance with some embodiments, the heat transfer from the wire 106-3 increases a temperature of the wire 106-4 above a threshold superconducting temperature. In some embodiments, the energy transferred from the wire 106-3 induces additional current for the wire 106-4 such that the portion of the current 302 flowing through the wire 106-4 (e.g., prior to, or in the absence of, any additional current redirected from the wire 106-3) exceeds a threshold superconducting current for the wire 106-4, causing the wire 106-4 to transition to a non-superconducting state.

In some instances, the threshold superconducting current for the wire 106-4 is based on an operating temperature of the wire 106-4. For example, in some embodiments, when the operating temperature of the wire 106-4 increases, the threshold superconducting current decreases such that the threshold superconducting current is exceeded with less current flowing through the wire 106-4. Therefore, in accordance with some embodiments, the heat transfer 508-3 increases a temperature of the wire 106-4 such that the portion of the current 302 flowing through the wire 106-4 (e.g., prior to, or in the absence of, any additional current redirected from the wire 106-3) exceeds a threshold superconducting current (which has been reduced due to the increased temperature of the wire 106-4) for the wire 106-4, causing the wire 106-4 to transition to a non-superconducting state. In some embodiments, the wire 106-4 transitions from the superconducting state to the non-superconducting state based on a combination of the current supplied to the wire 106-4 (e.g., due to the redirection of the current previously supplied to the wire 106-3 and/or the energy transferred from the wire 106-3 to the wire 106-4 via capacitive coupling) and the heat transferred from the wire 106-3 to the wire 106-4.

In the non-superconducting state (and/or during the transition from the superconducting state to the non-superconducting state), the non-zero electrical resistance of the wire 106-4 causes heat to be produced at wire 106-4. In accordance with some embodiments, the heat from the wire 106-4 transfers to the wire 106-5 (e.g., the gap 152-4 is filled with a thermally conductive material and/or the wire 106-4 and the wire 106-5 are thermally coupled through a thermally conductive material located above or below the wire 106-4 and the wire 106-5). In some embodiments, the heat from the wire 106-4 transfers to the wire 106-5 via the gap 152-4. In accordance with some embodiments, the wire 106-4 and the wire 106-5 are capacitively coupled via the gap 152-2 (e.g., in addition to, or instead of, the thermal coupling between the wire 106-4 and the wire 106-5 based, for example, on the presence of the thermally conductive material in the gap 152-2). Therefore, energy transfers from the wire 106-4 to the wire 106-5 via capacitive coupling. FIG. 5F shows heat and/or energy 508-4 transfer from the wire 106-4 to the wire 106-5 (e.g., heat transfer through thermal coupling and/or energy transfer through capacitive coupling).

Figure 5G:
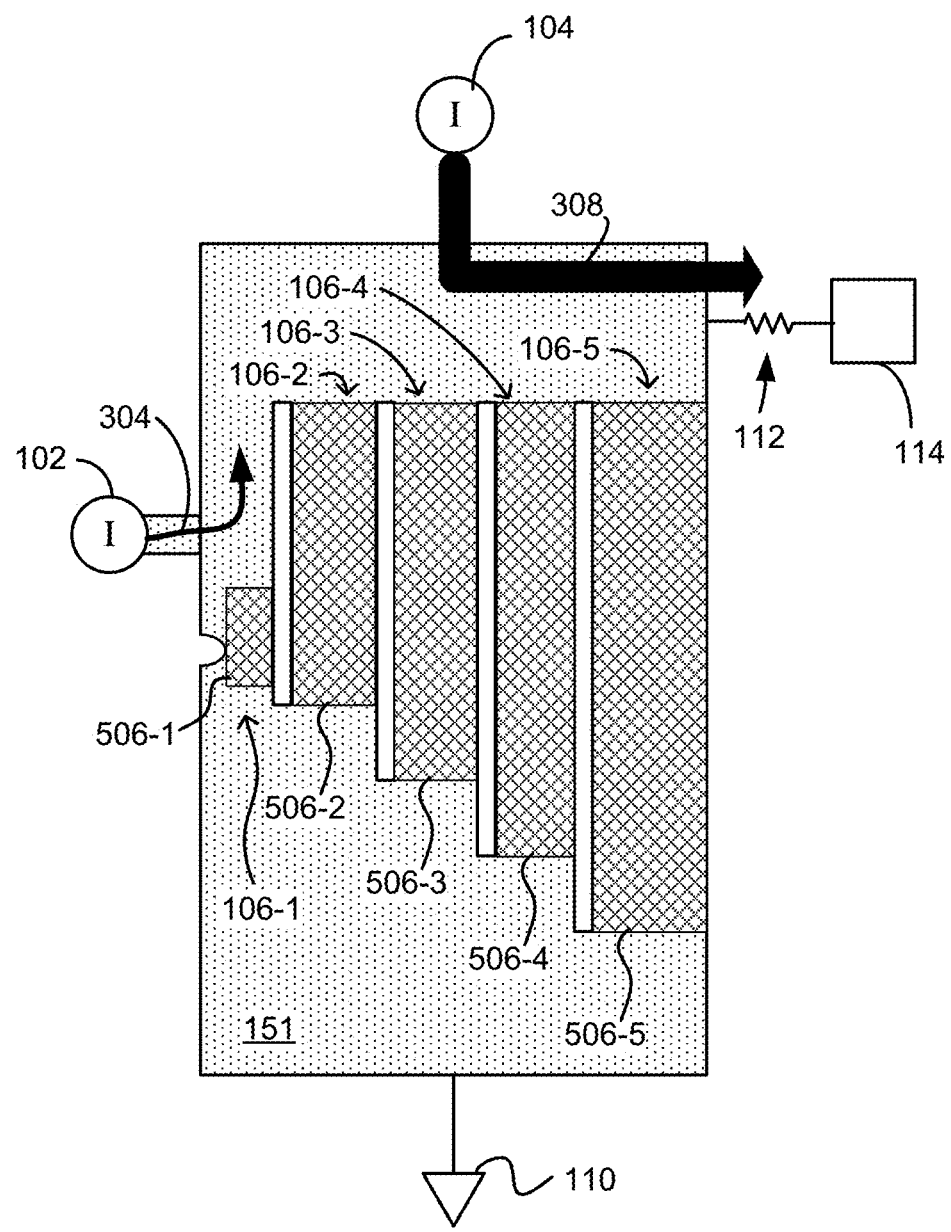

FIG. 5G shows the superconducting circuit 501 at a seventh time (that is subsequent to the sixth time). As shown in FIG. 5G, at the seventh time, the wire 106-5 has transitioned from a superconducting state to a non-superconducting state as denoted by the region 506-5.

In some embodiments, the transition of the wire 106-5 is in response to the current supplied to the wire 106-5 exceeding a threshold superconducting current for the wire 106-5 (e.g., due to the additional current redirected from the wire 106-4). In some embodiments, the transition of the wire 106-5 is in response to the heat and/or energy transfer 508-3 from the wire 106-4 (shown in FIG. 5E). In accordance with some embodiments, the heat transfer from the wire 106-4 increases a temperature of the wire 106-5 above a threshold superconducting temperature. In some embodiments, the energy transferred from the wire 106-4 induces additional current for the wire 106-5 such that the portion of the current 302 flowing through the wire 106-5 (e.g., prior to any additional current redirected from the wire 106-4) exceeds a threshold superconducting current for the wire 106-5, causing the wire 106-5 to transition to a non-superconducting state.

In some instances, the threshold superconducting current for the wire 106-5 is based on an operating temperature of the wire 106-5. For example, in some embodiments, when the operating temperature of the wire 106-5 increases, the threshold superconducting current decreases such that the threshold superconducting current is exceeded with less current flowing through the wire 106-5. Therefore, in accordance with some embodiments, the heat transfer 508-4 increases a temperature of the wire 106-5 such that the portion of the current 302 flowing through the wire 106-5 (e.g., prior to any additional current redirected from the wire 106-4) exceeds a threshold superconducting current (which has been reduced due to the increased temperature of the wire 106-5) for the wire 106-5, causing the wire 106-5 to transition to a non-superconducting state. In some embodiments, the wire 106-5 transitions from the superconducting state to the non-superconducting state based on a combination of the current supplied to the wire 106-5 (e.g., due to the redirection of the current previously supplied to the wire 106-4 and/or the energy transferred from the wire 106-4 to the wire 106-5 via capacitive coupling) and the heat transferred from the wire 106-4 to the wire 106-5.

In response to all of the wires 106 transitioning to the non-superconducting state, current 308 (e.g., some or all of current 302) from the current source 104 is directed (optionally through the resistor(s) 112) to the circuitry 114. In some embodiments, the resistance of the resistor(s) 112 is less than a combined resistance of the wires 106 when the wires are in the non-superconducting state, which facilitates a large portion of the current 308 to flow to the circuitry 114.

As described above with respect to FIGS. 5A-5G, providing the input current to the first wire 106-1 causes a sequential transition of wires 106-1 through 106-5 from superconducting states to non-superconducting states, which in turn redirects current from the second current source 104 to the circuitry 114. Typically, the current provided by the second current source 104 is greater than the current provided by the first current source 102 (e.g., the current provided by the second current source 104 is at least 5, 10, 50, or 100 times greater than the current provided by the first current source 102). Thus, the electronic systems illustrated in FIGS. 1A-1D, 2A-2B, 3A-3G, 4, and 5A-5G operate as an amplifier (e.g., a current amplifier).

In some embodiments, as illustrated in FIGS. 3A-3G, the current source 102 need not provide the input current continuously to initiate the current amplification. Rather, in some embodiments, the input current is a current pulse (e.g., a pulse having a top-hat waveform) with duration sufficient to cause the sequential (or near sequential) cascade of transitions of the wires 106. In some cases, the duration is less than a time required for the cascade transition to complete (e.g., the first current source ceases to provide the input current before one of the wires 106, such as wire 106-5, transitions into the non-superconducting state). In some other embodiments, as illustrated in FIGS. 5A-5G, the current source 102 provides an input current for the entire duration required for the cascade transition to complete (e.g., the first current source continues to provide the input current until after all of the wires 106 transition into the non-superconducting state).

Figure 6A:
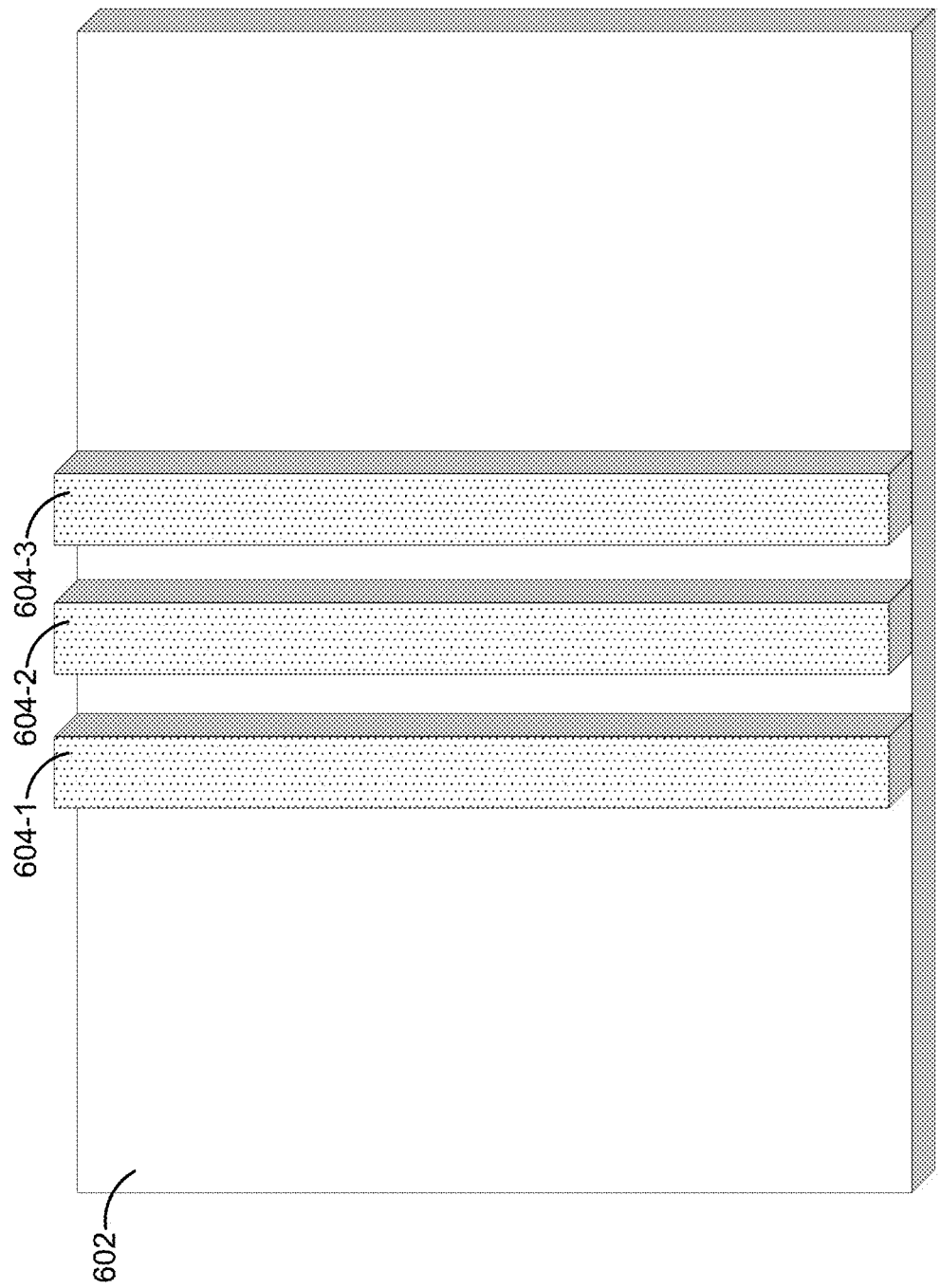
FIGS. 6A-6B are block diagrams illustrating representative components of a superconducting circuit in accordance with some embodiments.
Figure 6B:
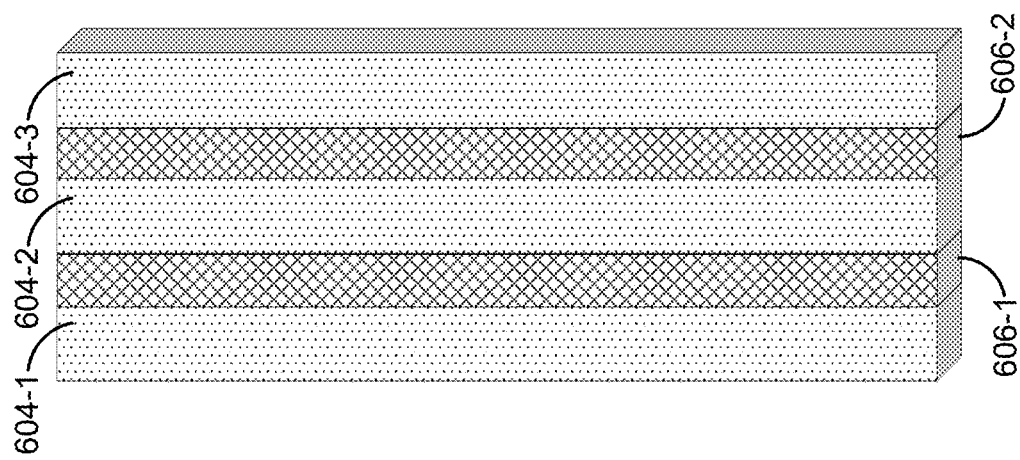

FIGS. 6A-6B are block diagrams illustrating representative components of a superconductor circuit in accordance with some embodiments. FIG. 6A shows superconducting wires 604 (e.g., wires 106 in FIG. 1A or wires 136 in FIG. 1C) adjacent to a thermally-conductive layer 602. In some embodiments, the thermally-conductive layer 602 is deposited on top of the wires 604. In some embodiments, the wires 604-1 are formed from a superconducting layer deposited on top of the thermally-conductive layer 602. In some embodiments, the thermally-conductive layer 602 is composed of a thermally-conductive, electrically-insulating material, such as diamond or aluminum nitride. In some embodiments, the thermally-conductive layer 602 is configured to facilitate heat transfer between the wires 604-1 (e.g., in a manner described previously with respect to FIGS. 5A-5G). In accordance with some embodiments, the wires 604-1 in FIG. 6A are separated from one another by air gaps.

FIG. 6B shows the superconducting wires 604 separated from one another by a thermally-conductive material 606. In some embodiments, the thermally-conductive material 606 is composed of a thermally-conductive, electrically-insulating material, such as diamond or aluminum nitride. In some embodiments the superconducting wires 604 are separated from one another by the thermally-conductive material 606 shown in FIG. 6B (e.g., thermally-conductive material portions 606-1 and 606-2) and are also adjacent to the thermally-conductive layer 602 shown in FIG. 6A.

In some embodiments, the superconducting wires 604 are formed by removing sections of a superconducting film (e.g., removing the gaps 152 from the superconducting layer 151 shown in FIG. 1E). In some embodiments, after the sections are removed a thermally-conductive material is deposited on the superconducting film. In accordance with some embodiments, depositing the superconducting film generates the thermally-conductive 606 and the thermally-conductive layer 602. In some embodiments, the thermally-conductive material, after being deposited, is etched back using any of a number of well-known processes to form a set of wires separated by thermally-conductive material.

Figure 7A:
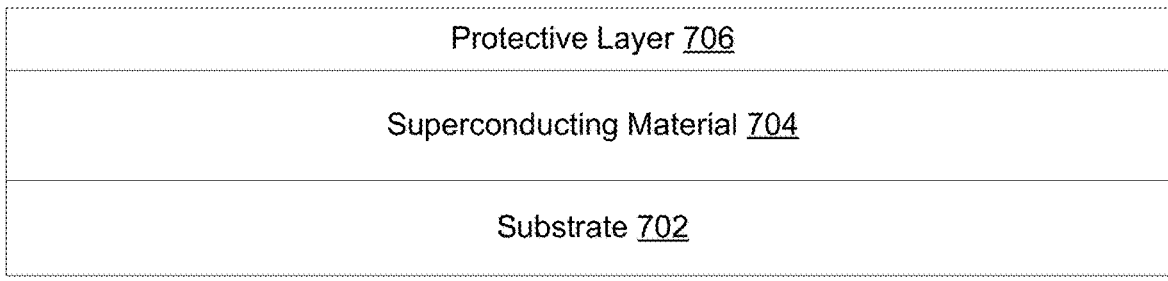
FIGS. 7A-7C are cross-sectional diagrams illustrating a representative fabrication sequence for a superconducting wire in accordance with some embodiments.
Figure 7B:
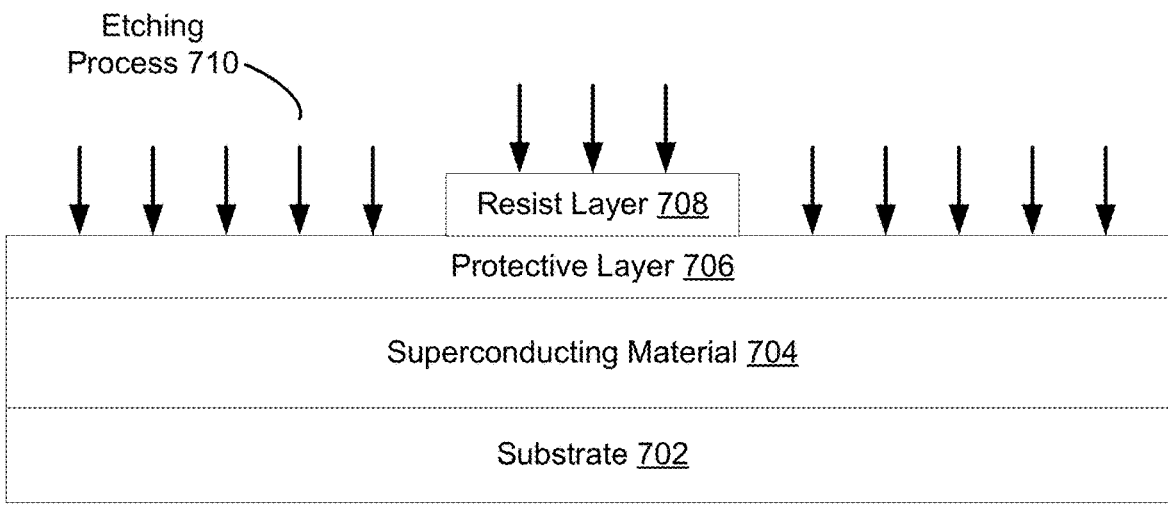
Figure 7C:
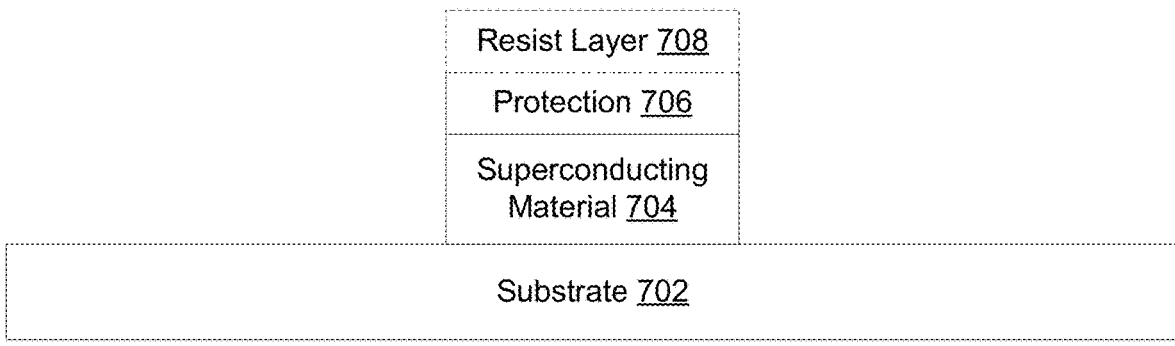

FIGS. 7A-7C are cross-sectional diagrams illustrating a representative fabrication sequence for a superconducting wire in accordance with some embodiments. FIG. 7A shows application of a superconducting material 704 on a substrate 702, and application of a protective layer 706 on the superconducting material 704. In some embodiments, the substrate is a silicon-based substrate, such as a silicon nitride (SiN) substrate. In some embodiments, the substrate does not include an oxide layer, so as to reduce or prevent oxidation of the superconducting material 704. In some embodiments, the superconducting material 704 is a niobium-based superconducting material, such as niobium-germanium. In some embodiments, the superconducting material 704 comprises a thin-film of niobium-germanium (e.g., a film having a thickness less than 100 nm, 50 nm, or 20 nm). In some embodiments, the protective layer 706 includes a passivation layer, such as a passivation layer composed of aluminum nitride (AlN). In some embodiments, the protective layer 706 consists essentially of a dielectric material. In some embodiments, the protective layer 706 comprises an oxide layer. In some embodiments, the protective layer 706 does not include an oxide layer, so as to reduce, inhibit, or prevent oxidation of the superconducting material 704. In some embodiments, the protective layer 706 is a thin film (e.g., a thin having a thickness of less than 20 nm, 10 nm, 2 nm, or 1 nm).

FIG. 7B shows the addition of a resist layer 708 on the surface of the protective layer 706. In some embodiments, the resist layer 708 is composed of a polymer. In some embodiments, the resist layer 708 comprises a photo-resist layer and/or an electro-resist layer. In some embodiments, the resist layer 708 is deposited and then patterned, with FIG. 7B showing the result after the patterning process is complete. For example, as shown in FIG. 7B, the resist layer 708 covers only a portion of the protective layer 706. In some embodiments, the resist layer 708 is applied to only select portion(s) of the protective layer 706 (e.g., via the use of masks and the like). In some embodiments, the resist layer 708 is applied to the protective layer 706 and then portions of the resist layer 708 are removed (e.g., by the application of photons and/or electrons to cause cross-linking in portions of the resist layer followed by subsequent removal of photo resists that have not been cross-linked).

As also shown in FIG. 7B, the layers 708, 706, and 704 are exposed to an etching process 710 (e.g., dry etching or wet etching) in accordance with some embodiments. The resist layer 708 is adapted to resist the etching process 710, while the protective layer 706 and the superconducting material 704 are not adapted to resist the etching process, in accordance with some embodiments. In some embodiments, the substrate 702 is adapted to resist the etching process 710. Stated another way, in some embodiments the etching process 710 is designed to selectively etch and thus remove the materials used to form the protective layer 706 and the superconducting material 704, but not the resist layer 708 and substrate 702.

FIG. 7C shows the layers 708, 706, and 704 after application of the etching process 710. As shown in FIG. 7C, application of the etching process 710 removes portions of the protection layer 706 and the superconducting material 704 that are not covered by the resist layer 708. In some embodiments, the resist layer 708 is subsequently removed (e.g., via the application of a stripper, such as acetone, 1-methyl-2-pyrrolidon, etc.). In some embodiments, the superconducting material 704 shown in FIG. 7C comprises a superconducting wire (e.g., a superconducting nanowire).

Figure 8:
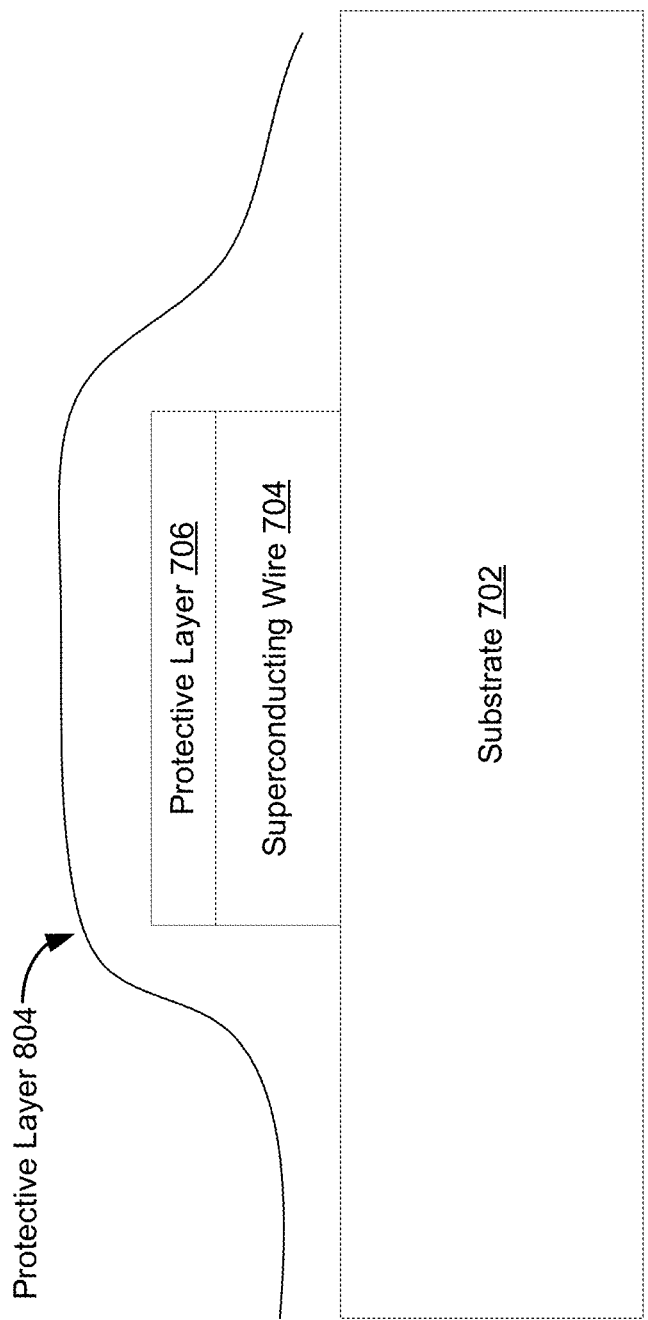
FIG. 8 is a cross-sectional diagram illustrating a representative layering for a superconducting wire in accordance with some embodiments.

FIG. 8 is a cross-sectional diagram illustrating a representative layering for a superconducting wire in accordance with some embodiments. FIG. 8 shows the superconducting wire 704 on the substrate 702 with the protective layer 706 on top of the superconducting wire 704. FIG. 8 also shows application of a second protective layer 804 over the superconducting wire 704 (e.g., to the sides of the superconducting wire 704 and on top of the protective layer 706). In some embodiments, the second protective layer 804 comprises a dielectric layer. In some embodiments, the second protective layer 804 consists essentially of a dielectric material. In some embodiments, the second protective layer 804 comprises an oxide layer. In some embodiments, the second protective layer 804 does not include an oxide layer, so as to inhibit oxidation of the superconducting material 704. In some embodiments, the second protective layer 804 is composed of aluminum nitride. In some embodiments, the second protective layer 804 is composed of a same material as the protective layer 706 (e.g., aluminum nitride). In some embodiments, the second protective layer 804 is a carbon-based dielectric material.

In some embodiments, the second protective layer 804 is applied on top of a resist layer (e.g., resist layer 708) that covers the protective layer 706. In some embodiments, the protective layer 706 is removed prior to application of the protective layer 804, such that the protective layer 804 is applied to a top surface of the superconducting wire 704. In some embodiments, the second protective layer 804 is applied via a sputtering process (e.g., at temperatures greater than 300 degrees Celsius, such as 400 degrees to 800 degrees Celsius). In some embodiments, the second protective layer 804 is a thin film (e.g., a thin having a thickness of less than 20 nm, 10 nm, or 5 nm).

Figure 9A:
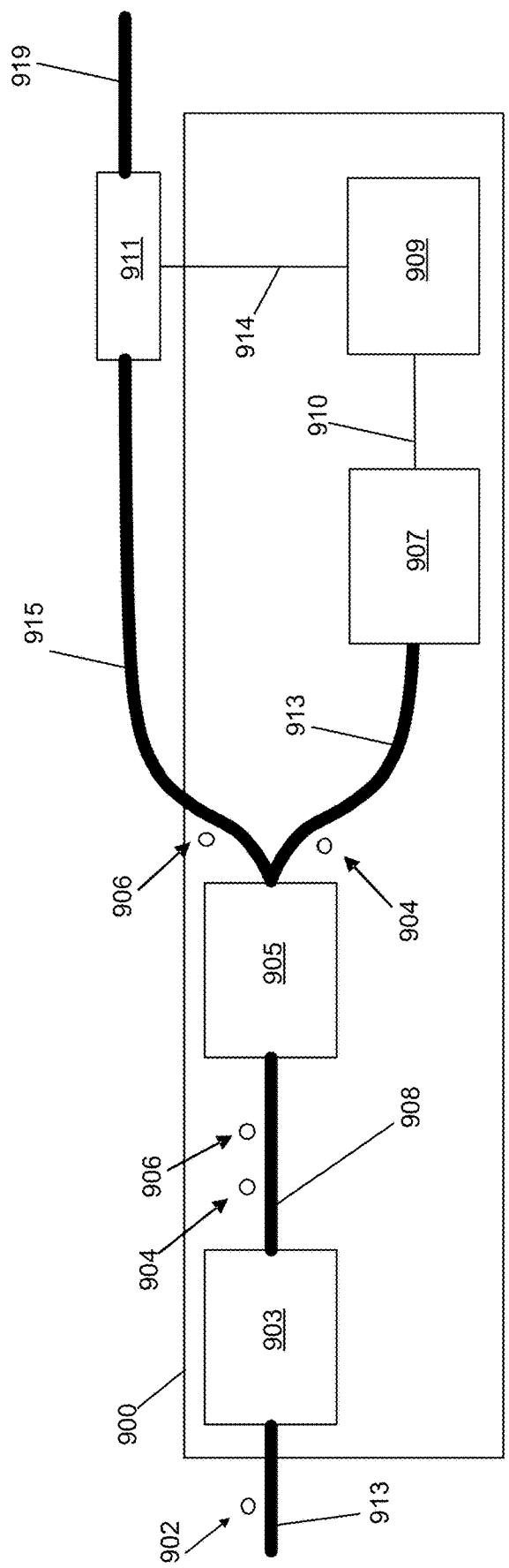
FIGS. 9A-9B are block diagrams illustrating a photonic circuit that employs a superconducting wire in accordance with some embodiments.
Figure 9B:
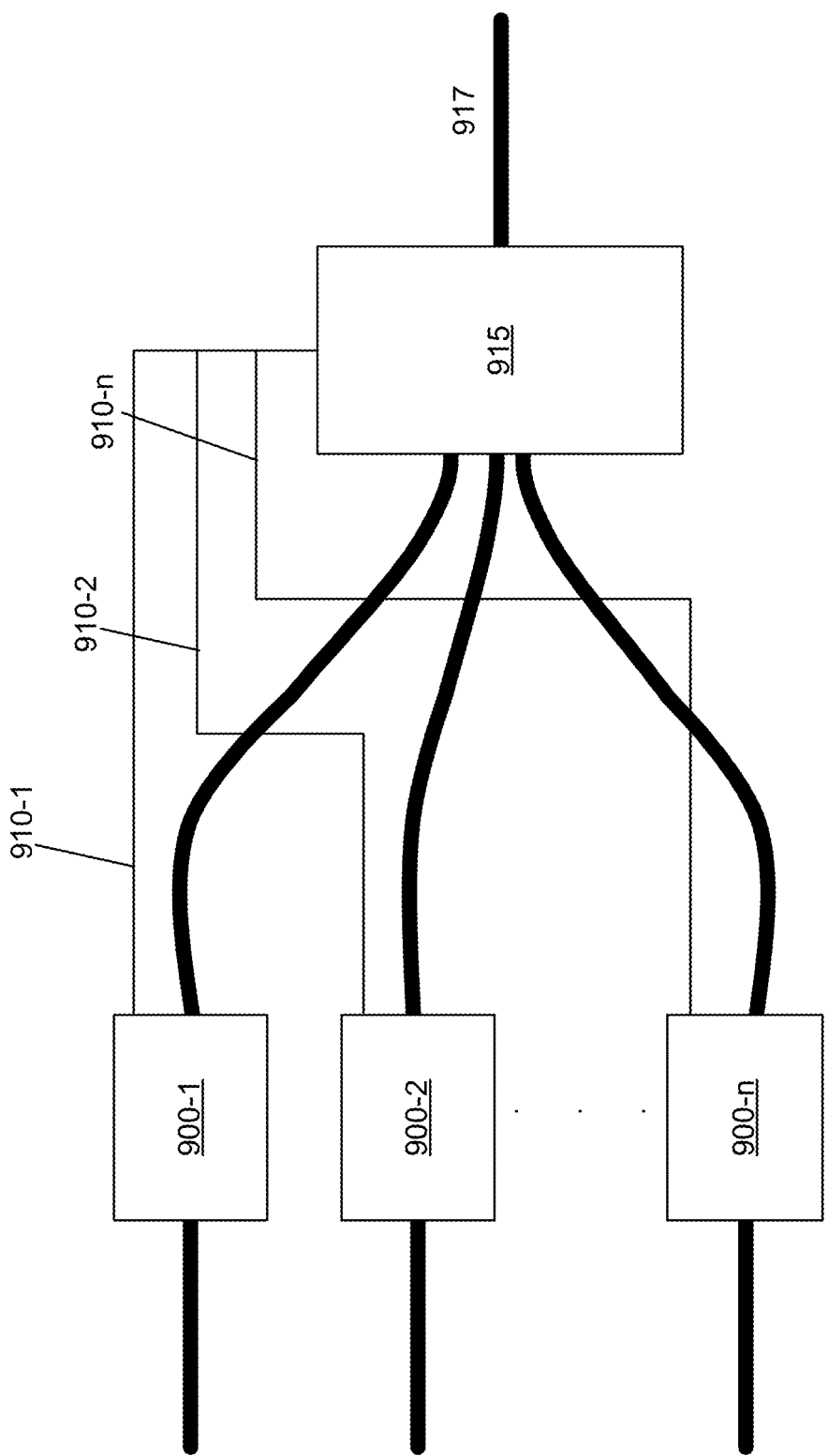

FIGS. 9A-9B show examples of a photonic system that can employ one or more superconducting amplifiers in accordance with one or more embodiments. In the embodiments shown in FIGS. 9A-9B, a superconducting circuit, e.g., any of the superconducting circuits 100, 120, 130, 140, 150, 200, 210 and or any of the arrangements shown in FIGS. 3A-5G described above can be employed as one or more amplifiers. More specifically, the FIGS. 9A-9B illustrate a heralded single photon source in accordance with one or more embodiments. Such a source can be used within any system for which a source of single photons is useful, e.g., within a quantum communications system and/or a quantum computer that employs entangled photons as the physical qubits.

Turning to FIG. 9A, a heralded single photon source 900 is illustrated in accordance with one or more embodiments. Thick black lines in the figure represent optical waveguides and thin black lines represent electrical interconnects (e.g. wires that may be formed from superconducting or non-superconducting materials). The system is a hybrid photonic/electrical circuit that includes a pumped photon pair generator 903, a wavelength division multiplexer (WDM) 905 (which is a 1×2 WDM in this example), a superconducting photon detector 907, a superconducting amplifier circuit 909, and an optical switch 909. One or more components of the system can be housed in a cryogenic environment, such as a cryostat, held at a temperature that is lower than the threshold temperature for superconductivity, as described above.

An input optical waveguide 913 optically couples a pump photon source (not shown) to photon pair generator 903. A pump photon 902 enters the pumped photon pair source 903 via input optical waveguide 913. For the sake of illustration, any photons illustrated here are depicted outside of the waveguides, but one of ordinary skill will appreciate that in a physical device, these photons will propagate within one or more guided modes of the waveguide. In some embodiments, the pumped photon pair source 903 can include a nonlinear optical material that generates two output photons, referred to as idler photon 904 and signal photon 906 from one or more input pump photons 902. For example, the pumped photon pair generator 903 can generate a pair of output photons using a process known as spontaneous four wave mixing. The pair of output photons, signal photon 904 and idler photon 906, are typically generated having different wavelengths/frequencies, e.g., with the sum of the energies of the signal and idler equal to the energy of the pump photon. After generation, signal photon 904 and idler photon 906 are optically coupled to the input of WDM 905 via waveguide 908. Because they are different wavelengths/ frequencies, WDM 905 redirects each photon along a different output waveguide, e.g., signal photon 904 is directed along the heralding waveguide path 913 and idler photon 906 is redirected along the switched output waveguide path 915. Which photon is directed to which path is not critical and the path of the idler photon and signal photon can be exchanged without departing from the scope of the present disclosure.

In this example, a superconducting photon detector 907, e.g., a superconducting nanowire single photon detector, is optically coupled to the heralding waveguide path 913 and can produce an electrical signal (e.g. a current pulse, also referred to as a photon heralding signal) in response to the detection of the signal photon 904. Because the signal photon 904 and idler photon 906 were generated nearly simultaneously as a pair, the electrical signal generated by the photon detector 907 signals (i.e., "heralds") the presence of the idler photon 906 in the switched waveguide path. The heralding signal is often a small amplitude current signal, e.g., microamps or less, and can be provided to the superconducting amplifier circuit 909 where it is amplified to a larger output signal that can be used to more effectively drive any downstream electronic and/or photonic circuits. Referring momentarily to the various FIGS. 1-5 described above, the small heralding signal corresponds to current source 102 that provides a small additional current to a superconducting circuit, e.g., superconducting circuit 100, 120, 130, 140, 150, 200, 210 and or any of the arrangements shown in FIGS. 3A-5G, to drive the superconducting wires of the circuit into the non-superconducting state, e.g., via the sequential (or near sequential) cascade effect described in more detail above. The amplified signal is then provided to the optical switch 911 via output electrical signal line 914. Again, referring momentarily to the various FIGS. 1-5 described above, the optical switch 911 shown in FIG. 9A corresponds to the circuitry 114 of the superconducting circuit described above. Accordingly, the use of the superconducting amplifier circuit 909 provides for a system that can drive higher current loads than would be the case with photon detector 907 operating on its own. After being switched, the idler photon 915 is provided via output waveguide 919, e.g., for use in constructing a highly entangled resource state for use in a downstream optical quantum computing system (not shown).

FIG. 9B illustrates how several single photon sources similar to photon source 900 can be multiplexed to increase the reliability of the photon generation process. Such a system is beneficial because of the non-deterministic nature of the conversion between the pump photon and the photon pair in the photon pair generator 903. More specifically, because the photon pair generation process is a quantum mechanical process, it is inherently probabilistic, and thus it is not guaranteed that every pump photon that enters a photon pair generator 903 will result in the generation of a photon pair at the output. In fact, in some instances, the photon pair creation can fail entirely. Thus, to improve the reliability of the photon generation process, several single photon generators 900-1, 900-2, ..., 900-n, each receiving its own pump photon per generation cycle, can be arranged in parallel and optically (and electrically) coupled to a N×1 switch 915, as shown. As with the heralded single photon source 900, each single photon generator 900-1, 900-2, ..., 900-n possesses, or has an output coupled to, a corresponding dedicated heralding electrical signal line 910-1, 910-2, ..., 910-n, which can provide a heralding signal that informs a downstream circuit element of the successful generation of a photon by that particular photon source. In some embodiments, the heralding electrical signal lines 910-1, 910-2, ..., 910-n are electrically coupled to the N×1 switch 915. N×1 switch 915 includes digital logic that interprets the heralding electrical signals and switches the input port of the N×1 switch 915 accordingly so as to provide the generated idler photon to the output port 917. Thus, in this case, each photon source 900 includes a superconducting amplifier circuit whose internal arrangement of current sources and parallel superconducting wires provides for enough amplification to drive the logic stage of the N×1 switch. In other examples, a small signal logic circuit can be employed before the amplifier and N×1 switch. One of ordinary skill will appreciate that other arrangements are possible without departing from the scope of the present disclosure.

Figure 10A:
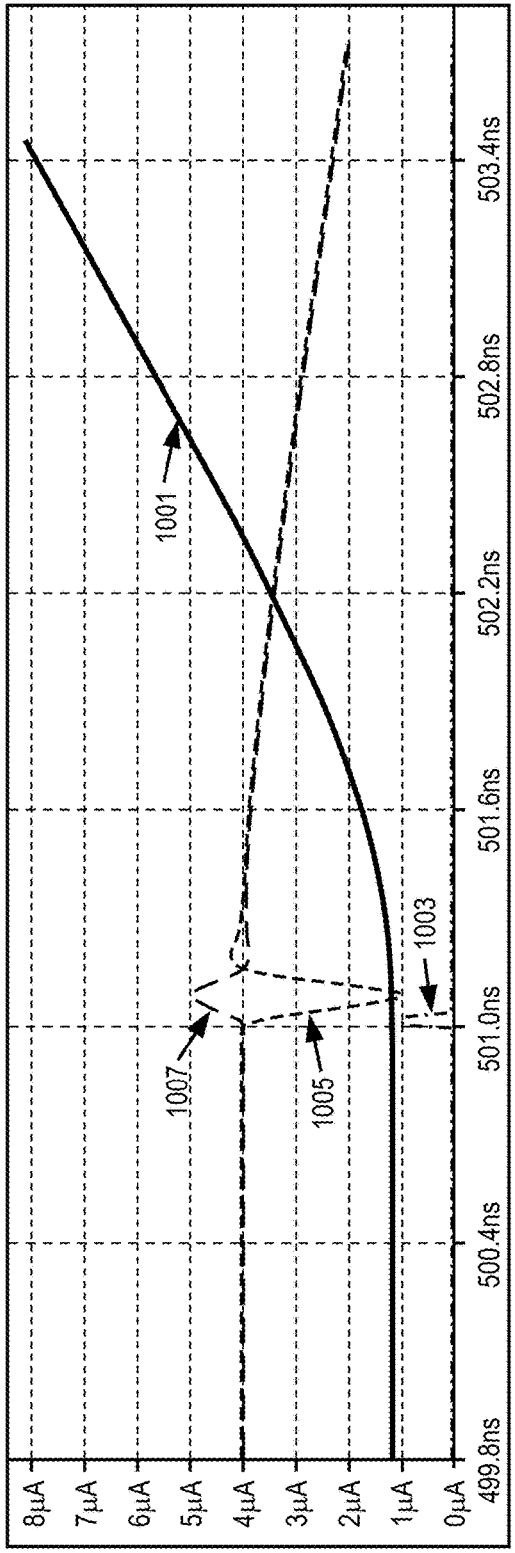
FIGS. 10A-10B show the results of a numerical simulation of a superconducting circuit in accordance with some embodiments.
Figure 10B:
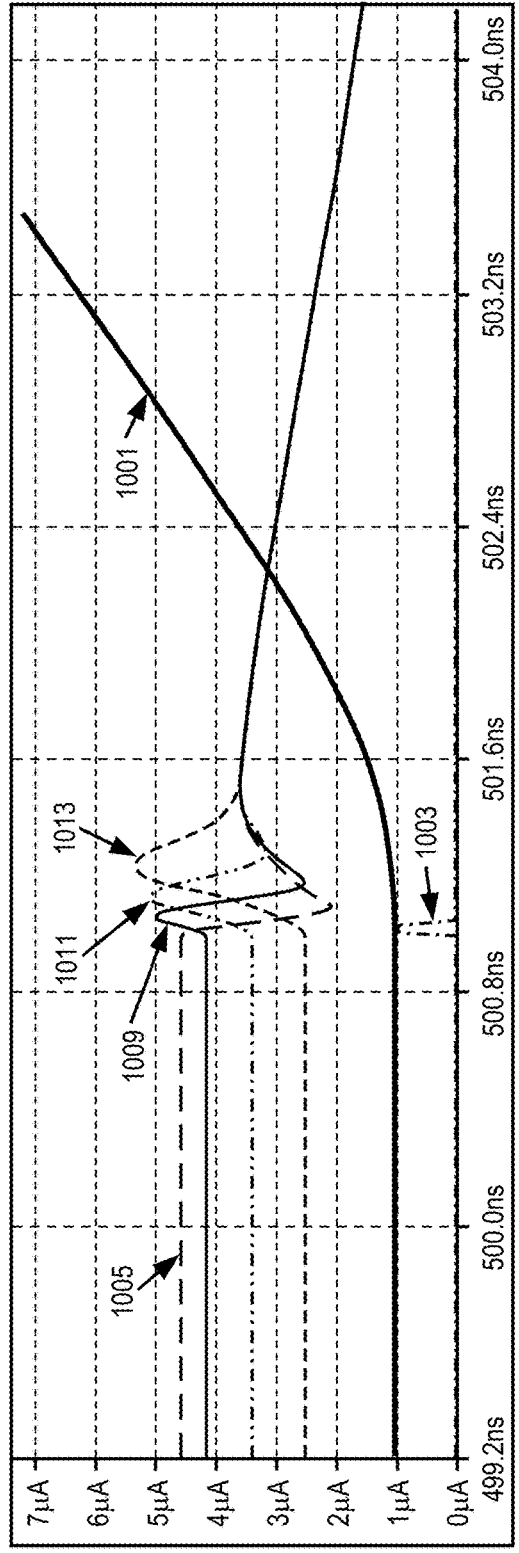

FIGS. 10A-10B show the results of a numerical simulation of a superconducting circuit in accordance with some embodiments. More specifically, the plots show the transient current response of each superconducting wire as well as the current response 1001 at a 50 ohm load that represents the input impedance of the circuitry 114 (e.g., as shown in FIG. 1A). The simulation includes a system having a parallel arrangement of 4 superconducting wires with an initial 1 microamp current pulse provided at the input, e.g., from current source 102 shown FIGS. 1A-1E, 2A-2B and 3A-3G. The numerical model includes both thermal and electrical dynamical models and was done using the Simulation Program with Integrated Circuit Emphasis (SPICE) software package.

To establish a baseline comparison, FIG. 10A shows the transient electrical response of a system having equal inductance wires, such as would be the case for a parallel arrangement of four wires 106 each having the same length. After the 1 microamp current pulse from current source 102, shown here as line 1003, the current in the first wire (e.g., wire 106-1 in FIG. 1A), shown here as line 1005, begins to drop as this wire transitions to the non-superconducting state. At the same time, the current in the remaining wires increases as the initial current pulse is simultaneously redistributed to the remaining three wires. The current response of these three wires is completely overlapped on this chart, and appears as a single curve 1007.

FIG. 10B shows the same simulation but this time using a series of four superconducting wires (e.g., corresponding to wires 106-1 to 106-4, FIG. 1A) that each have respectively increasing impedances (e.g., which could be achieved by increasing their respective lengths, as discussed above in reference to FIGS. 1A-1E). In this example, the impedance doubles from wire to wire such that the last wire has 8 times the impedance of the first wire. FIG. 10B shows that each wire experiences a current pulse in a cascaded sequence. In this case, the initial current pulse 1003 first causes a normal transition in the first wire (e.g., 106-1) subsequently driving the current 1005 in the first wire (e.g., wire 106-1) to redistribute to the second wire (e.g., wire 106-2, with current in the second wire shown as curve 1009), then to the third wire (e.g., wire 106-3, with current in the third wire shown as curve 1011), and then to the fourth wire (e.g., wire 106-4, with current in the fourth wire shown as curve 1013). As already discussed above, and described in further detail below, this sequential cascade effect is beneficial because a large fraction of the input pulse current is transferred to each wire sequentially (rather than shared equally amongst the wires), thereby providing for a more efficient way to drive each wire to the non-superconducting state.

In light of these principles and embodiments, we now turn to certain additional embodiments.

In accordance with some embodiments, an electrical system (e.g., superconducting circuit 100) includes: (1) a first circuit having a plurality of superconducting wires (e.g., wires 106-1 through 106-5 in FIG. 1A) connected in parallel with one another, the superconducting wires including: (a) a first superconducting wire (e.g., wire 106-1, FIG. 1A) with a corresponding first threshold superconducting current; and (b) a second superconducting wire (e.g., wire 106-2, FIG. 1A); (2) a second circuit (e.g., circuitry 114, FIG. 1A) connected in parallel to the first circuit; (3) a first current source (e.g., the current source 102, FIG. 1A) connected to the first superconducting wire and configured to selectively supply a first current (e.g., current 304, FIG. 3B); (4) a second current source (e.g., current source 104, FIG. 1A) connected to a combination of the first circuit and the second circuit and configured to supply a second current (e.g., current 302, FIG. 3A) so that the plurality of superconducting wires operate in a superconducting state (e.g., in the absence of additional current, such as the first current). Supplying the first current to the first superconducting wire with the first current source causes at least the first superconducting wire to cease to operate in the superconducting state (e.g., the first superconducting wire transitions in the non-superconducting state) and subsequently (e.g., after the first superconducting wire ceases to operate in the superconducting state) causes the second superconducting wire to cease to operate in the superconducting state (e.g., the second superconducting wire transitions in the non-superconducting state).

In some embodiments, at least a portion of the superconducting circuit consists of the niobium-germanium. In some embodiments, the superconducting circuit consists essentially of a niobium-germanium alloy. In some embodiments, the niobium-germanium includes niobium and germanium in a ratio from 3:1 to 3.5:1 (e.g., $Nb_3Ge$).

In some embodiments, the first circuit includes one or more additional components, such as resistors, capacitors, and inductors. In some embodiments, such additional components are connected in series or parallel to the plurality of superconducting wires. In some embodiments, one or more additional components are connected in series or parallel to a respective superconducting wire. In some embodiments, the second current source is connected directly or indirectly to the combination of the first circuit and the second circuit. For example, one or more additional components (e.g., a resistor) may be located between the second current source and the combination of the first circuit and the second circuit.

In some embodiments, supplying the first current to the first superconducting wire causes two or more of the superconducting wires (e.g., wires 106, FIG. 1A), other than the first superconducting wire, to sequentially cease to operate in a superconducting state subsequent to the first superconducting wire ceasing to operate in the superconducting state, thereby redirecting current to the second circuit. For example, FIGS. 3B-3G show that the wires 106-2 through 106-5 sequentially transition from the superconducting state to the non-superconducting state and the current from the second current source is redirected to the second circuit.

In some embodiments, a first portion of the second current, less than the first threshold superconducting current, is configured to flow through the first superconducting wire while the first current source forgoes supplying the first current (e.g., as shown in FIG. 3A, when no current is provided by current source 102, a portion of current 302 flows through wire 106-1). A combination of the first current and the first portion of the second current is greater than the first threshold superconducting current (e.g., when current source 102 provides current 304 as shown in FIG. 3B, a combination of the current 304 and the first portion of the second current exceeds the first threshold superconducting current).

In some embodiments, the second superconducting wire has a second threshold superconducting current. In some embodiments, the second threshold superconducting current is greater than the first threshold superconducting current. In some embodiments, a second portion of the second current, less than the second threshold superconducting current, is configured to flow through the second superconducting wire while the first current source forgoes supplying the first current. In some embodiments, subsequent to the first superconducting wire ceasing to operate in the superconducting state, a current flowing through the second superconducting wire increases from the second portion of the second current to above the second threshold superconducting current. This causes the second superconducting wire to cease to operate in the superconducting state. For example, FIG. 3D shows the wire 106-2 has transitioned to the non-superconducting state in response to additional current redirected from the wire 106-1.

In some embodiments, supplying the first current to the first superconducting wire (in addition to a portion of the second current flowing through the first superconducting wire) causes all superconducting wires of the plurality of superconducting wires to cease to operate in the superconducting state such that at least the second current is supplied to the second circuit. For example, as shown in FIGS. 3B-3G, providing current 304 causes all of the wires 106 to transition into the non-superconducting state and the current 308 to flow toward the circuitry 114.

In some embodiments, in response to the first current, the plurality of superconducting wires transition from the superconducting state to a non-superconducting state over a period of time between 10 ps and 100 ps. In some embodiments, supplying the first current (e.g., to the first superconducting wire) causes the plurality of superconducting wires to cease to operate in the superconducting state for a period of time between 10 ns to 100 ns (e.g., after 10 ns to 100 ns, the plurality of superconducting wires returns to the superconducting state). In some embodiments, the first current is between 1 µA and 20 µA (e.g., current between 5 µA and 10 µA). In some embodiments, the second current is between 5 µA and 100 µA (e.g., current between 10 µA and 50 µA).

In some embodiments, the plurality of superconducting wires is positioned such that, in response to the first current supplied to the first superconducting wire, the plurality of superconducting wires sequentially transitions from the superconducting state to a non-superconducting state. For example, the wires in FIGS. 1A-1D are positioned such that the wires will sequentially transition from the superconducting state to the non-superconducting state in response to current supplied by the current source 102.

In some embodiments, (1) the first superconducting wire has a first length; and (2) a constriction is defined on the first superconducting wire so that the constriction narrows a width of the first superconducting wire for a portion of the first length (e.g., constriction 202, FIG. 2A). In some embodiments, the first threshold superconducting current for the first superconducting wire is determined based at least in part on a representative size (e.g., a width) of the constriction.

In some embodiments, the constriction reduces a threshold superconducting current for the first superconducting wire by reducing the width of at least a portion of the first superconducting wire.

In some embodiments, the constriction is sized such that a ratio of a width of the first superconducting wire and the width of the first superconducting wire minus a width of the constriction is equal to, or greater than, a ratio of the first threshold superconducting current for the first superconducting wire and the first current (e.g., a ratio of (i-a) a difference between a width of the first superconducting wire and a width of the constriction and (i-b) a width of the first superconducting wire is equal to, or less than, a ratio of (ii-a) the first current and (ii-b) the first threshold superconducting current for the first superconducting wire). For example, the constriction is sized based on the Equation 1 below:

$$\frac{width_{wire1}}{width_{wire1} - width_{constriction}} \geq \frac{I_{wire1}}{I_{in}} \quad \text{(Equation 1)}$$

where $I_{wire1}$ is the threshold superconducting current for the first wire (e.g., wire 106-1) without a constriction, the $width_{wire1}$ is the smallest width of the first wire without a constriction (e.g., width 203, FIG. 2A), and $width_{constriction}$ is the smallest width of the first wire with the constriction (e.g., width 205, FIG. 2A). An example $I_{wire1}$ is between 0.5 µA and 10 µA. In some embodiments, the constriction has a width at least as great as a coherence length of the first superconducting wire (e.g., 5 nm-10 nm).

In some embodiments, the constriction has a geometric shape, such as a rectangle, a triangle, or a semicircle. For example, the constriction 202 in FIG. 2A has a semicircle shape. In some embodiments, the constriction has a non-geometric shape.

In some embodiments, the first current source is configured to selectively supply the first current at a location on the first superconducting wire adjacent to the constriction. For example, the current source 102 in FIG. 3B is positioned to supply the current 304 at a location corresponding to the wire 106-1. In some embodiments, the first current is supplied at a location such that the first current flows toward the constriction when the first superconducting wire operates in the superconducting state. In some embodiments, the location on the first superconducting wire is deemed to be adjacent to the constriction when a distance between the location on the first superconducting wire and the constriction is 1 µm or less (e.g., 100 nm or less).

In some embodiments, each superconducting wire of the plurality of superconducting wires comprises a respective portion of a thin film sheet (e.g., a deposition layer, such as superconducting layer 118, FIG. 1A), the thin film sheet defining a respective gap separating each superconducting wire of the plurality of superconducting wires. For example, FIG. 1A shows the gap 108-1 separating the wire 106-1 and the wire 106-2. In some embodiments, the gaps comprise air gaps. In some embodiments, the gaps comprise one or more insulating materials. In some embodiments, the thin film has a width between 300 nm and 5 microns. In some embodiments, the thin film has a length of 10 microns or greater. In some embodiments, the thin film has a thickness between 2 nm and 10 nm. In some embodiments, the thin film sheet is composed of a superconducting material, such as niobium or a niobium alloy.

In some embodiments, each respective gap comprises a rectangular, or substantially rectangular, cut-out portion of the thin film sheet. In some embodiments, the gaps have widths between 20 nm and 100 nm. In some embodiments, a respective gap is deemed to have a substantially rectangular cut-out when the width and length of the respective gap vary by less than 2 nm, 5 nm, or 10 nm.

In some embodiments, the electronic system also includes a substrate (e.g., a silicon substrate) positioned to support the thin film. In some embodiments, the substrate comprises an insulating material, such as silicon dioxide. In some embodiments, the thin film is deposited on the substrate.

In some embodiments, (1) the first superconducting wire is positioned adjacent to a first edge (e.g., the left edge of the superconducting layer 118, FIG. 1A) of the thin film sheet; and (2) the plurality of superconducting wires is parallel, or substantially parallel, to the first edge of the thin film sheet. In some embodiments, the plurality of superconducting wires is deemed to be substantially parallel to the first edge when an angle between the first edge and the length of each respective wire varies by less than 2 degrees, 5 degrees, or 10 degrees.

In some embodiments, the first current source (e.g., the input current source) is positioned adjacent to the first edge of the thin film sheet for selectively supplying the first current to the first superconducting wire, and the second current source (e.g., the amplification current source) is positioned adjacent to a second edge (e.g., the top edge of the superconducting layer 118, FIG. 1A) of the thin film sheet for supplying at least a portion of the second current (e.g., the amplification current) to the plurality of superconducting wires.

In some embodiments, the first current source is connected to the first superconducting wire via a supply wire (e.g., wire 116, FIG. 1A) connected to the thin film at a location on the first edge of the thin film. In some embodiments, the supply wire has a width between 10 nm and 200 nm.

In some embodiments, the first superconducting wire has a first characteristic length and the second superconducting wire has a second characteristic length. In some embodiments, the second characteristic length is greater than the first characteristic length. In some embodiments, the second characteristic length is the same as the first characteristic length. In some embodiments, a characteristic length of a superconducting wire corresponds to a physical length of the superconducting wire. In some embodiments, when the superconducting wire has an asymmetric shape having a first length and a second length (e.g., one side is shorter than the opposite side as shown by wire 106-2 in FIG. 1A), the characteristic length is the shorter length, the longer length, or an average of the first length and the second length.

In some embodiments, the plurality of superconducting wires further includes a third superconducting wire (e.g., the wire 106-3, FIG. 1A) having a third characteristic length greater than the first characteristic length and the second characteristic length, wherein the second superconducting wire is located between the first superconducting wire and the third superconducting wire. In some embodiments, the characteristic length of the superconducting wires increases linearly. In some embodiments, the characteristic length of the superconducting wires increases nonlinearly (e.g., exponentially). In some embodiments, the third superconducting wire corresponds to a third threshold superconducting current that is greater than the second threshold superconducting current.

In some embodiments, the plurality of superconducting wires includes superconducting wires having increasing lengths. For example, the wires 106 in FIG. 1A having increasing lengths from wire 106-1 to wire 106-5. In some embodiments and instances, having wires of increasing lengths facilitates a cascade effect across the wires by increasing a distance redirected current must travel to reach the non-adjacent wire (e.g., as illustrated in FIG. 1B). In some embodiments, the lengths are between 200 nm and 5 microns. In some embodiments, the plurality of superconducting wires includes 5 or more superconducting wires. In some embodiments, the plurality of superconducting wires includes 10 or more superconducting wires. In some embodiments, the plurality of superconducting wires includes 20 or more superconducting wires. In some embodiments, the plurality of superconducting wires includes 50 or more superconducting wires. In some embodiments, the plurality of superconducting wires includes up to 5 superconducting wires. In some embodiments, the plurality of superconducting wires includes up to 10 superconducting wires. In some embodiments, the plurality of superconducting wires includes up to 20 superconducting wires. In some embodiments, the plurality of superconducting wires includes up to 50 superconducting wires, but any number of wires may be employed without departing from the present disclosure.

Advantageously, employing superconducting wires having sequentially increasing lengths (as a function of distance from the first current source) can facilitate a sequential (or near sequential) transitioning to the normal state of each of the wires of the device and thus reduces the overall amount of additional current that needs to be provided to transition every wire of the plurality of wires to the non-superconducting state. In some embodiments, this advantageous effect can be caused by the fact that a superconducting wire's inductance is proportional to its length. For example, turning to FIG. 4, the inductance of the series combination of inductors 406 and 404 (representing the first wire) is less than the inductance of inductor 408 (representing the second wire) which is less than the inductance of inductor 410 (representing the nth wire) and so on. Accordingly, because the inductance of the first wire is the lowest, in response to a current pulse from the first current source (e.g., current source 102 shown in FIG. 1A), current will preferentially pass through the first wire only (or first few wires) due to their relatively low transient impedance, where the AC impedance of a single superconducting wire is dominated by its inductance, with the inductance Z being generally proportional to $\omega L(I)$, where L is or corresponds to the inductance of the superconducting wire (which is generally current dependent, where I represents the current) and $\omega$ is or corresponds to a frequency (e.g., primary frequency component) of the time varying current pulse.

Thus, after the first wire makes the transition to the non-superconducting state, a majority of the additional current provided by the first current source will subsequently pass through the second superconducting wire and may not be substantially shared amongst the third, fourth, fifth, etc. wires due to their relatively higher impedances. The sequential transitioning to the non-superconducting state of each wire from shortest length (lowest inductance) to longest length (largest inductance) is advantageous because the majority of the additional current is routed through one (or only a few) lowest impedance wire(s) at a time. Thus, the amount of additional current needed to trigger the sequential transitions of all the wires across the device (also referred to as the sequential cascade) does not strongly depend on the number of parallel wires used in the device. However, the addition of more parallel wires allows for a larger bias current to be provided by the second current source, while still keeping this bias source far enough below the superconducting threshold current to avoid noise induced issues that could lead to inadvertent transitions of one or more wires to the non-superconducting state. Higher bias current from the second current source is preferred because it is this current that is diverted to the output load of the additionally downstream circuitry, e.g., circuitry 114 described above. Thus, if the additional current provided by the first current source is $I_{in}$ and the bias current provided by the second circuit is $I_{bias}$ the overall gain g of the circuit is approximately equal to $I_{bias}/I_{in}$.

In contrast, in a device having a plurality of parallel wires of the same length, the impedance of each wire is equal and thus, after transitioning the first wire, the additional current is spread in equal proportion among the remaining superconducting wires. Thus, to ensure that the additional shared current is sufficient to exceed the threshold current in each remaining wire, the amount of additional current must scale with the number of wires, e.g., a five-wire circuit will require five times as much additional current than a single wire circuit. Alternatively, the bias current supplied by the second current source can be increased to bring the current in each wire closer to the threshold current to insure triggering by a modest additional current, but as already noted above, the system becomes unstable and susceptible to noise in such a case. Accordingly, in most practically sized systems that employ equal length parallel wires, there is an upper limit to the number of wires that can be employed, e.g., on the order of 10 wires. Furthermore, because the gain of the system scales with the number of wires, the practical limit to the number of wires in the equal-length design also leads to a practical upper limit to the gain of such a device. Accordingly, a circuit that employs a parallel arrangement of superconducting wires having sequentially increasing lengths can operate more stably and with higher gain than one with equal length wires.

In some embodiments, the plurality of superconducting wires includes superconducting wires having substantially the same thickness. In some embodiments, all superconducting wires of the plurality of superconducting wires have substantially the same thickness. In some embodiments, the thickness is between 2 nm and 10 nm. In some embodiments, the plurality of superconducting wires includes wires with two or more different thicknesses. For example, a first wire has a thickness of 2 nm and a second wire has a thickness of 10 nm.

In some embodiments, the plurality of superconducting wires includes superconducting wires having substantially the same width. In some embodiments, all superconducting wires of the plurality of superconducting wires have substantially the same width. In some embodiments, the width is between 20 nm and 200 nm. In some embodiments, the plurality of superconducting wires includes wires with two or more different widths. For example, a first wire has a width of 20 nm and a second wire has a width of 100 nm. In some embodiments and instances, having wires of differing widths facilitates a cascade effect across the wires (e.g., as illustrated in FIGS. 3A-3G) as the superconducting threshold current for each wire is based in part on the width.

In some embodiments, a first end of each superconducting wire of the plurality of superconducting wires is aligned with a first end of each of the other superconducting wires of the plurality of superconducting wires. For example, in FIG. 1A the top of each wire 106 is aligned with each other wire 106. In some embodiments, the first end of each superconducting wire comprises an end positioned toward to the second current source. In some embodiments, the first end of each superconducting wire comprises an end positioned away from the second current source. In some embodiments, the end located away from the second current source is positioned toward a ground (e.g., a ground plane).

In some embodiments, a midpoint of each superconducting wire of the plurality of superconducting wires is aligned with a midpoint of another superconducting wire of the plurality of superconducting wires. In some embodiments, a midpoint of each superconducting wire of the plurality of superconducting wires is aligned with a midpoint of each of the other superconducting wires of the plurality of superconducting wires. For example, in FIG. 1B the midpoint of each wire 126 is aligned with a midpoint of each other wire 126.

In some embodiments, the second circuit is a readout circuit configured to measure current received from at least the second current source. In some embodiments, the readout circuit is a voltage readout circuit. In some embodiments, the second circuit is configured to have a resistance less than a representative resistance of the plurality of superconducting wires when the plurality of superconducting wires is not operating in the superconducting state. In some embodiments, the readout circuit has a resistance of 50 ohms.

In accordance with some embodiments, a method includes: (1) providing an amplification current to a first circuit that includes a plurality of superconducting wires connected in parallel with one another, the amplification current causing the plurality of superconducting wires to operate in a superconducting state; (2) while the plurality of superconducting wires are operating in the superconducting state, supplying an additional current to a first superconducting wire of the plurality of superconducting wires so that current supplied to the first superconducting wire exceeds a first threshold superconducting current of the first superconducting wire; (3) in response to supplying the additional current to the first superconducting wire, transitioning the first superconducting wire from the superconducting state to a non-superconducting state; and (4) subsequent the transition of the first superconducting wire from the superconducting state to the non-superconducting state: (a) sequentially transitioning the remainder of the superconducting wires of the plurality of superconducting wires from the superconducting state to the non-superconducting state; and (b) directing the amplification current to a second circuit that is connected in parallel to the first circuit.

In some embodiments, the method includes maintaining the plurality of superconducting wires in a superconducting state at a temperature above 3 Kelvin. In some embodiments, the plurality of superconducting wires is maintained at a temperature above 3.5 Kelvin. In some embodiments, the plurality of superconducting wires is maintained at a target temperature between 3.5 and 5 Kelvin.

In accordance with some embodiments, an electronic device includes a plurality of superconducting wires (e.g., the wires 136, FIG. 1C) connected in parallel with one another, the plurality of superconducting wires including: (1) a first superconducting wire having a first threshold superconducting current; and (2) a second superconducting wire having a second threshold superconducting current that is greater than the first threshold superconducting current.

In some embodiments: (1) the first superconducting wire (e.g., the wire 106-1, FIG. 2B) has a first length; and (2) a constriction (e.g., the constriction 204, FIG. 2B) is defined on the first superconducting wire so that the constriction narrows a width of the first superconducting wire for a portion of the first length.

In some embodiments, the first superconducting wire is connected to a supply wire (e.g., wire 116, FIG. 3B) for providing an input current.

In accordance with some embodiments, a method includes: (1) depositing a thin film of a superconducting material (e.g., the superconducting layer 118, FIG. 1A) over a substrate; and (2) removing (e.g., etching) one or more (e.g., two or more) portions of the thin film (e.g., the gaps 108, FIG. 1A) to define a plurality of superconducting wires, the plurality of superconducting wires including: (a) a first superconducting wire (e.g., the wire 106-1, FIG. 1A) with a corresponding first threshold superconducting current; and (b) a second superconducting wire with a corresponding second threshold superconducting current that is greater than the first threshold superconducting current.

In some embodiments, removing the one or more portions of the thin film defines a constriction (e.g., the constriction 204, FIG. 2B) on the first superconducting wire. In some embodiments, removing the one or more portions of the thin film defines a supply wire (e.g., the wire 116, FIG. 2B) connected to the first superconducting wire.

In accordance with some embodiments, an electronic system includes: (1) a first circuit that includes a plurality of superconducting wires (e.g., the wires 106 in FIG. 1E) connected in parallel with one another, the plurality of superconducting wires including: (a) a first superconducting wire (e.g., the wire 106-1) with a corresponding first threshold superconducting current; and (b) a second superconducting wire (e.g., the wire 106-2); (2) a second circuit connected in parallel to the first circuit (e.g., the circuitry 114); (3) a first current source (e.g., the current source 102) coupled to the first superconducting wire and configured to selectively supply a first current; and (4) a second current source (e.g., the current source 104) coupled to a combination of the first circuit and the second circuit and configured to supply a second current such that the plurality of superconducting wires operate in a superconducting state, where a combination of the first current and the second current exceeds the first threshold superconducting current.

In some embodiments, the system further includes a thermally-conductive material coupling the first superconducting wire and the second superconducting wire (e.g., the thermally-conductive layer 602 in FIG. 6A and/or the thermally-conductive material 606 in FIG. 6B). In some embodiments, the thermally-conductive material comprises an electrical insulator. In some embodiments, the thermally-conductive material comprises Aluminum Nitride (AlN) and/or diamond. In some embodiments, the thermally-conductive material thermally couples the first superconducting wire and the second superconducting wire. In some embodiments, the thermally-conductive material has a thermal conductivity above a predefined thermal conductivity threshold. In some embodiments, heat generated by the first superconducting wire is transferred to the second superconducting wire at least partially through the thermally-conductive material, thereby causing the second superconducting wire to cease to operate in the superconducting state as described above with respect to FIGS. 5A-5G.

In some embodiments, the first superconducting wire and the second superconducting wire comprise a first layer, and the thermally-conductive material comprises a second layer adjacent to the first layer (e.g., the thermally-conductive layer 602 in FIG. 6A).

In some embodiments, the thermally-conductive material is located between the first superconducting wire and the second superconducting wire (e.g., the thermally-conductive material 604 in FIG. 6B).

In some embodiments, the first superconducting wire is capacitively coupled to the second superconducting wire. In some embodiments, a distance between the first superconducting wire and the second superconducting wire is selected to cause a current in the first superconducting wire to induce a current in the second superconducting wire by capacitive coupling.

In some embodiments, supplying the first current to the first superconducting wire with the first current source causes at least the first superconducting wire to cease to operate in the superconducting state and subsequently cause the second superconducting wire to cease to operate in the superconducting state. For example, the current 304 supplied in FIG. 5B causes the first wire 106-1 to transition to a non-superconducting state (FIG. 5C) and subsequently causes the second wire 106-2 to transition to the non-superconducting state (FIG. 5D).

In some embodiments, supplying the first current to the first superconducting wire causes two or more superconducting wires of the plurality of superconducting wires, other than the first superconducting wire, to sequentially cease to operate in a superconducting state subsequent to the first superconducting wire ceasing to operate in the superconducting state, thereby redirecting at least a portion of the second current to the second circuit. For example, the current 304 supplied in FIG. 5B causes each of the wires 106 to transition to a non-superconducting state as shown in FIGS. 5D-5G.

In some embodiments, the two or more superconducting wires of the plurality of superconducting wires sequentially cease to operate in the superconducting state due, at least in part, to being capacitively and/or thermally coupled to the first superconducting wire.

In some embodiments: (1) the first superconducting wire has a first length; (2) a constriction (e.g., constriction 502 in FIG. 5A) is defined on the first superconducting wire so that the constriction narrows a width of the first superconducting wire for a portion of the first length; and (3) the first threshold superconducting current for the first superconducting wire is determined based at least in part on a representative size of the constriction.

In some embodiments, each superconducting wire of the plurality of superconducting wires comprises a respective portion of a thin film sheet, the thin film sheet defining a respective gap separating each superconducting wire of the plurality of superconducting wires. For example, the superconducting layer 151 in FIG. 1E includes gaps 152 that define wires 106.

In accordance with some embodiments, a method includes: (1) providing an amplification current (e.g., via the current source 104) to a first circuit that includes a plurality of superconducting wires (e.g., the wires 106) connected in parallel with one another; (2) while the plurality of superconducting wires are operating in a superconducting state, supplying an additional current (e.g., via the current source 102) to a first superconducting wire of the plurality of superconducting wires so that current supplied to the first superconducting wire exceeds a first threshold superconducting current of the first superconducting wire; (3) in response to supplying the additional current to the first superconducting wire, transitioning the first superconducting wire from the superconducting state to a non-superconducting state; (4) subsequent the transition of the first superconducting wire from the superconducting state to the non-superconducting state: (a) transitioning (e.g., sequentially) the remainder of the superconducting wires of the plurality of superconducting wires from the superconducting state to the non-superconducting state; and (b) directing the amplification current to a second circuit that is connected in parallel to the first circuit (e.g., as illustrated in FIGS. 5A-5G). In some embodiments, the plurality of superconducting wires are thermally and/or capacitively coupled to one another (e.g., as described above with respect to FIGS. 5A-5G).

In some embodiments, the method further includes: (1) in conjunction with transitioning the first superconducting wire from the superconducting state to the non-superconducting state, generating heat with the first superconducting wire; and (2) transferring at least a portion of the heat generated with the first superconducting wire to a second superconducting wire of the plurality of superconducting wires (e.g., as shown by heat and/or energy transfer 508-1 in FIG. 5C). In some embodiments, the transferred portion of the heat lowers a threshold superconducting current of the second superconducting wire. In some embodiments, the transferred portion of the heat causes the second superconducting wire to transition from the superconducting state to the non-superconducting state (e.g., as illustrated in FIG. 5D).

In some embodiments, the method further includes, in conjunction with transitioning the first superconducting wire from the superconducting state to the non-superconducting state, inducing a displacement current in a second superconducting wire of the plurality of superconducting wires. In some embodiments, the displacement current in the second superconducting wire lowers a threshold superconducting current of the second superconducting wire. In some embodiments, the displacement current in the second superconducting wire causes the second superconducting wire to transition from the superconducting state to the non-superconducting state.

In some embodiments, transitioning the remainder of the superconducting wires of the plurality of superconducting wires from the superconducting state to the non-superconducting state comprises triggering a cascade effect in the plurality of superconducting wires due, at least in part, to thermal and/or capacitive coupling between adjacent ones of the plurality of superconducting wires.

In accordance with some embodiments, an electronic device includes: (1) a plurality of superconducting wires connected in parallel with one another, the plurality of superconducting wires including: (a) a first superconducting wire (e.g., the wire 106-1) having a first threshold superconducting current; and (b) a second superconducting wire (e.g., the wire 106-2) having a second threshold superconducting current that is greater than the first threshold superconducting current.

In some embodiments: (1) the first superconducting wire has a first length; and (2) a constriction (e.g., the constriction 502) is defined on the first superconducting wire so that the constriction narrows a width of the first superconducting wire for a portion of the first length.

In some embodiments, the first superconducting wire is connected to a supply wire (e.g., the wire 116) for providing an input current (e.g., from the current source 102). In some embodiments, the first superconducting wire is positioned so as to be capacitively-coupled to the second superconducting wire. In some embodiments, the first superconducting wire is thermally-coupled to the second superconducting wire.

In accordance with some embodiments, a method includes: (1) depositing a thin film of a superconducting material over a substrate; and (2) removing one or more portions of the thin film to define a plurality of superconducting wires (e.g., the wires 106), the plurality of superconducting wires including: (a) a first superconducting wire (e.g., the wire 106-1) with a corresponding first threshold superconducting current; and (b) a second superconducting wire (e.g., the wire 106-2) with a corresponding second threshold superconducting current that is greater than the first threshold superconducting current.

In some embodiments, removing the one or more portions of the thin film defines a constriction (e.g., the constriction 502) on the first superconducting wire. In some embodiments, removing the one or more portions of the thin film defines a supply wire (e.g., the wire 116) connected to the first superconducting wire.

In some embodiments, the method further includes depositing a thermally-conductive layer on the thin film (e.g., the thermally-conductive layer 602). In some embodiments, the thermally-conductive layer is electrically-insulating. In some embodiments, the first superconducting wire and the second superconducting wire are positioned for thermal coupling and/or a capacitive coupling of the first superconducting wire and the second superconducting wire.

In accordance with some embodiments, an electronic system includes: (1) a first circuit that includes a plurality of superconducting wires connected in parallel with one another (e.g., the wires 106 in FIG. 1A), where (a) each superconducting wire of the plurality of superconducting wires comprises a respective portion of a thin film (e.g., the thin film 118), the thin film defining a respective gap separating each superconducting wire of the plurality of superconducting wires (e.g., the gaps 108) from a neighboring superconducting wire, and where (b) the plurality of superconducting wires includes a first superconducting wire (e.g., the wire 106-1) with a corresponding first threshold superconducting current and a second superconducting wire (e.g., the wire 106-2); (2) a first current source (e.g., the current source 102) coupled to the first superconducting wire and configured to supply a first current; (3) a second current source (e.g., the current source 104) coupled to a first end of the first superconducting wire and a first end of the second superconducting wire, the second current source configured to supply a second current such that the plurality of superconducting wires operate in a superconducting state; and (4) a second circuit (e.g., the circuit 114) connected in parallel to the first circuit and coupled to the second current source, where a combination of the first current and the second current exceeds the first threshold superconducting current.

In some embodiments: (1) the plurality of superconducting wires includes a third superconducting wire (e.g., the wire 106-3); (2) the first superconducting wire and the second superconducting wire are separated by a first gap (e.g., the gap 108-1) having a first end closest to the second current source and a second end furthest from the second current source; (3) the second superconducting wire and the third superconducting wire are separated by a second gap (e.g., the gap 108-2) having a first end closest to the second current source and a second end furthest from the second current source; (4) a second end of the second gap extends further than a second end of the first gap (e.g., as shown in FIG. 1A with gaps 108-1 and 108-2); and (5) the second superconducting wire is configured such that, when the first superconducting wire is in a non-superconducting state, a current density in a portion of the second superconducting wire adjacent to the second end of the first gap exceeds a threshold superconducting current density for the second superconducting wire, thereby transitioning the second superconducting wire to the non-superconducting state.

In accordance with some embodiments, a method includes: (1) providing an amplification current (e.g., via the current source 104, FIG. 1A) to a first circuit that includes a plurality of superconducting wires connected in parallel with one another; (2) while the plurality of superconducting wires are operating in a superconducting state, supplying an additional current (e.g., via the current source 102, FIG. 1A) to a first superconducting wire of the plurality of superconducting wires so that current supplied to the first superconducting wire exceeds a first threshold superconducting current of the first superconducting wire; (3) in response to supplying the additional current to the first superconducting wire, transitioning the first superconducting wire from the superconducting state to a non-superconducting state; and (4) subsequent to the transition of the first superconducting wire from the superconducting state to the non-superconducting state: (a) sequentially transitioning the remainder of the superconducting wires of the plurality of superconducting wires from the superconducting state to the non-superconducting state; and (b) directing the amplification current to a second circuit that is connected in parallel to the first circuit.

In some embodiments: (1) each superconducting wire of the plurality of superconducting wires comprises a respective portion of a thin film, the thin film defining a respective gap separating each superconducting wire of the plurality of superconducting wires; (2) the first superconducting wire and the second superconducting wire are separated by a first gap having a first end closest to the second current source and a second end furthest from the second current source; (3) the second superconducting wire and the third superconducting wire are separated by a second gap having a first end closest to the second current source and a second end furthest from the second current source; and (4) transitioning the remainder of the superconducting wires from the superconducting state to the non-superconducting state comprises redirecting current in a portion of the second superconducting wire adjacent to the second end of the first gap such that a current density in the portion exceeds a threshold superconducting current density for the second superconducting wire, thereby transitioning the second superconducting wire to the non-superconducting state.

In accordance with some embodiments, a method for fabricating a superconducting wire includes: (1) depositing a layer of niobium-germanium (e.g., superconducting material 204); (2) removing one or more portions of the layer of niobium-germanium to define one or more nanowires (e.g., as shown in FIGS. 7B-7C); and (3) depositing a protective layer over the one or more nanowires (e.g., protective layer 804 in FIG. 8). In some instances, the protective layer reduces or prevents oxidation of niobium-germanium in the one or more nanowires. In some embodiments, the protective layer is deposited after the one or more portions of the layer of niobium-germanium are removed to define the one or more nanowires. In some embodiments, the nanowires are defined by a patterned resist layer deposited on top of the layer of niobium-germanium. In some embodiments, a reactive ion etch process (e.g., a $CF_4$ reactive ion etch process) transfers the pattern of the resist layer to the niobium-germanium layer.

In some embodiments, the layer of niobium-germanium is deposited by physical vapor deposition. In some embodiments, the layer of niobium-germanium is deposited at a temperature between 400 and 800° Celsius. In some embodiments, the layer of niobium-germanium is deposited by sputtering.

In some embodiments, the method further includes depositing a second protective layer over the layer of niobium-germanium (e.g., protective layer 706). In some embodiments, the second protective layer is deposited before the one or more portions of the layer of niobium-germanium are removed to define the one or more nanowires. In some embodiments, removing the one or more portions of the layer of niobium-germanium to define the one or more nanowires includes removing one or more corresponding portions of the second protective layer.

In some embodiments, the method further includes annealing the layer of niobium-germanium and the second protective layer. In some embodiments, the layer of niobium-germanium and the second protective layer are annealed at a temperature between 800° and 1500° Celsius. In some embodiments, the layer of niobium-germanium and the second protective layer are annealed in a nitrogen gas or vacuum environment. In some embodiments, the layer of niobium-germanium is annealed independently of the second protective layer (e.g., without annealing second protective layer).

Although some of various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages could be implemented in hardware, firmware, software or any combination thereof.

It will also be understood that, although the terms first, second, etc. are, in some instances, used herein to describe various elements, these elements should not be limited by these terms. These terms are only used to distinguish one element from another. For example, a first current could be termed a second current, and, similarly, a second current could be termed a first current, without departing from the scope of the various described embodiments. The first current and the second current are both currents, but they are not the same condition unless explicitly stated as such.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A system, comprising:
   a superconducting subcircuit that includes a plurality of superconducting wires connected in parallel with one another, the superconducting subcircuit including:
   a first superconducting wire having a first impedance while the first superconducting wire is in a non-superconducting state; and
   a second superconducting wire having a second impedance while the second superconducting wire is in a non-superconducting state, the second impedance being greater than the first impedance; and
   a third superconducting wire having a third impedance while the third superconducting wire is in a non-superconducting state, the third impedance being greater than each of the first impedance and the second impedance; and
   one or more current sources coupled to the superconducting subcircuit and configured to supply a first current in response to one or more trigger events;
   wherein the plurality of superconducting wires are configured to operate in a superconducting state in the absence of the first current;
   the first superconducting wire is configured to transition to a non-superconducting state in response to the first current;
   the second superconducting wire is configured to transition to a non-superconducting state in response to the first superconducting wire transitioning to the non-superconducting state; and
   the third superconducting wire is configured to transition to the non-superconducting state in response to the second superconducting wire transitioning to the non-superconducting state.

2. The system of claim 1, further comprising a thermally-conductive material coupling the first superconducting wire and the second superconducting wire.

3. The system of claim 2, wherein the first superconducting wire and the second superconducting wire comprise a first layer, and wherein the thermally-conductive material comprises a second layer adjacent to the first layer.

4. The system of claim 2, wherein the thermally-conductive material is located between the first superconducting wire and the second superconducting wire.

5. The system of claim 1, wherein the first superconducting wire is capacitively coupled to the second superconducting wire.

6. The system of claim 1, wherein:
   supplying the first current to the superconducting subcircuit causes at least the first superconducting wire to cease to operate in the superconducting state and subsequently causes each of the second superconducting wire and the third superconducting wire to cease to operate in the superconducting state.

7. The system of claim 1, wherein:

the one or more current sources provide a bias current to the superconducting subcircuit;

the first superconducting wire, the second superconducting wire and the third superconducting wire are configured to remain in the superconducting state while the one or more current sources provide the bias current, in the absence of the first current; and supplying the first current to the superconducting subcircuit causes two or more superconducting wires of the plurality of superconducting wires, other than the first superconducting wire, to sequentially cease to operate in a superconducting state subsequent to the first superconducting wire ceasing to operate in the superconducting state, thereby redirecting at least a portion of the bias current to a second circuit.

8. The system of claim 7, wherein the two or more superconducting wires of the plurality of superconducting wires sequentially cease to operate in the superconducting state due, at least in part, to being capacitively and/or thermally coupled to the first superconducting wire.

9. The system of claim 1, wherein:

the first superconducting wire has a first length; and a constriction is defined on the first superconducting wire so that the constriction narrows a width of the first superconducting wire for a portion of the first length.

10. The system of claim 1, wherein each superconducting wire of the plurality of superconducting wires comprises a respective portion of a thin film sheet, the thin film sheet defining a respective gap separating each superconducting wire of the plurality of superconducting wires.

* * * * *